United States Patent
Yan et al.

(10) Patent No.: US 9,236,122 B2
(45) Date of Patent: Jan. 12, 2016

(54) SHARED-GATE VERTICAL-TFT FOR VERTICAL BIT LINE ARRAY

(71) Applicant: SANDISK 3D, LLC, Milpitas, CA (US)

(72) Inventors: Tianhong Yan, Saratoga, CA (US); George Samachisa, San Jose, CA (US); Tz-yi Liu, Palo Alto, CA (US); Tim Chen, Milpitas, CA (US); Perumal Ratnam, Fremont, CA (US)

(73) Assignee: SANDISK 3D LLC, Milpitas, CA (US)

( * ) Notice: Subject to any disclaimer, the term of this patent is extended or adjusted under 35 U.S.C. 154(b) by 0 days.

(21) Appl. No.: 14/340,454

(22) Filed: Jul. 24, 2014

(65) Prior Publication Data
US 2015/0036414 A1 Feb. 5, 2015

Related U.S. Application Data

(60) Provisional application No. 61/860,861, filed on Jul. 31, 2013.

(51) Int. Cl.
*G11C 11/16* (2006.01)
*G11C 13/00* (2006.01)
(Continued)

(52) U.S. Cl.
CPC ........ *G11C 13/0069* (2013.01); *G11C 13/0002* (2013.01); *G11C 13/003* (2013.01); *G11C 13/0023* (2013.01); *H01L 27/0688* (2013.01); *H01L 27/249* (2013.01); *H01L 27/2454* (2013.01); *H01L 27/2481* (2013.01);
(Continued)

(58) Field of Classification Search
CPC ............................. G11C 11/16; G11C 13/0069
USPC .................................................. 365/148, 158
See application file for complete search history.

(56) References Cited

U.S. PATENT DOCUMENTS

| 4,189,342 A | 2/1980 | Koek |
| 5,308,778 A | 5/1994 | Fitch |

(Continued)

FOREIGN PATENT DOCUMENTS

| CN | 100481441 | 4/2009 |
| JP | 2008135413 | 6/2008 |

(Continued)

OTHER PUBLICATIONS

PCT International Search Report dated Oct. 17, 2014, PCT International Patent Application No. PCT/CN2014/048259.

(Continued)

*Primary Examiner* — Michael Tran
(74) *Attorney, Agent, or Firm* — Vierra Magen Marcus LLP

(57) ABSTRACT

A non-volatile storage device comprises: a substrate; a monolithic three dimensional array of memory cells; word lines connected to the memory cells; global bit lines; vertical bit lines connected to the memory cells; and a plurality of double gated vertically oriented select devices. The double gated vertically oriented select devices are connected to the vertical bit lines and the global bit lines so that when the double gated vertically oriented select devices are activated the vertical bit lines are in communication with the global bit lines. Each double gated vertically oriented select device has two gates that are offset from each other with respect to distance to the substrate. Both gates for the double gated vertically oriented select device need be in an "on" condition for the double gated vertically oriented select devices to be activated.

28 Claims, 29 Drawing Sheets

(51) Int. Cl.
*H01L 27/24* (2006.01)
*H01L 27/06* (2006.01)
*H01L 45/00* (2006.01)
*G11C 7/18* (2006.01)
*H01L 27/10* (2006.01)

(52) U.S. Cl.
CPC ............ *H01L45/06* (2013.01); *H01L 45/08* (2013.01); *H01L 45/085* (2013.01); *H01L 45/1233* (2013.01); *H01L 45/1266* (2013.01); *H01L 45/142* (2013.01); *H01L 45/143* (2013.01); *H01L 45/144* (2013.01); *H01L 45/146* (2013.01); *H01L 45/16* (2013.01); *H01L 45/1608* (2013.01); *G11C 7/18* (2013.01); *G11C 2013/0073* (2013.01); *G11C 2013/0083* (2013.01); *G11C 2207/005* (2013.01); *G11C 2213/15* (2013.01); *G11C 2213/71* (2013.01); *G11C 2213/77* (2013.01); *G11C 2213/79* (2013.01); *H01L 27/101* (2013.01)

(56) References Cited

U.S. PATENT DOCUMENTS

| | | | |
|---|---|---|---|
| 8,581,349 B1 * | 11/2013 | Sekar et al. | 257/402 |
| 8,618,614 B2 * | 12/2013 | Scheuerlein | 257/390 |
| 8,754,533 B2 * | 6/2014 | Or-Bach et al. | 257/777 |
| 8,883,569 B2 * | 11/2014 | Scheuerlein | 438/128 |
| 2009/0189222 A1 | 7/2009 | Shino | |
| 2014/0183727 A1 | 7/2014 | Lu | |

FOREIGN PATENT DOCUMENTS

| | | |
|---|---|---|
| WO | WO2008103198 | 8/2008 |
| WO | WO2012082654 | 6/2012 |
| WO | WO2013/101499 | 7/2013 |

OTHER PUBLICATIONS

PCT Written Opinion of the International Searching Authority dated Oct. 17, 2014, PCT International Patent Application No. PCT/CN2014/048259.

English Translation of Abstract of CN1933148 published Apr. 22, 2009.

International Search Report and Written Opinion dated Feb. 16, 2012 in International Patent Application No. PCT/CN2011/074234.

Qin et al., "Ultrasonic Wire Bonding Technology in High-power IGBT Module Assembly", High Power Converter Technology, 2011 No. 02, pp. 22-25, Apr. 5, 2011.

\* cited by examiner

Programming

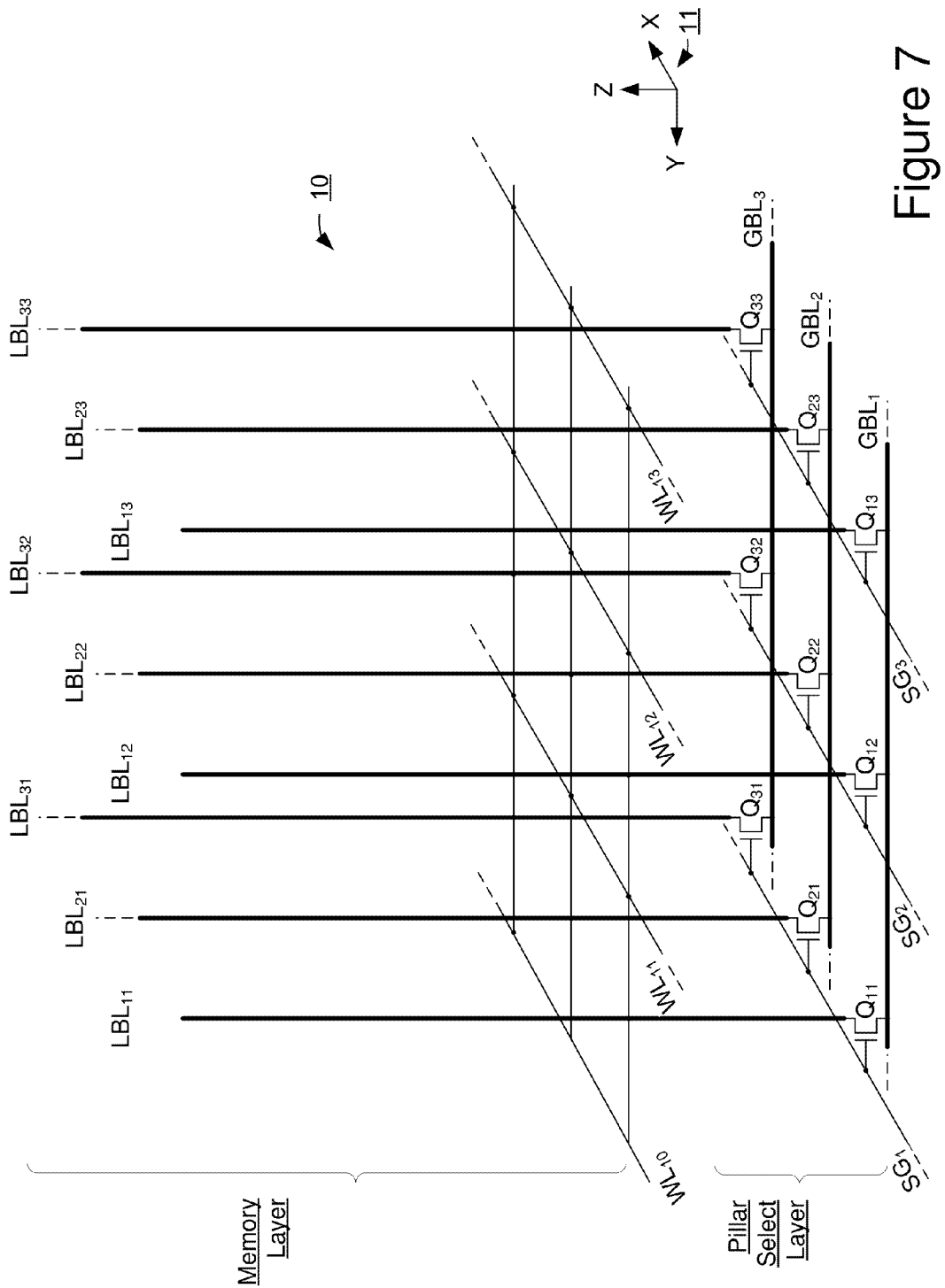

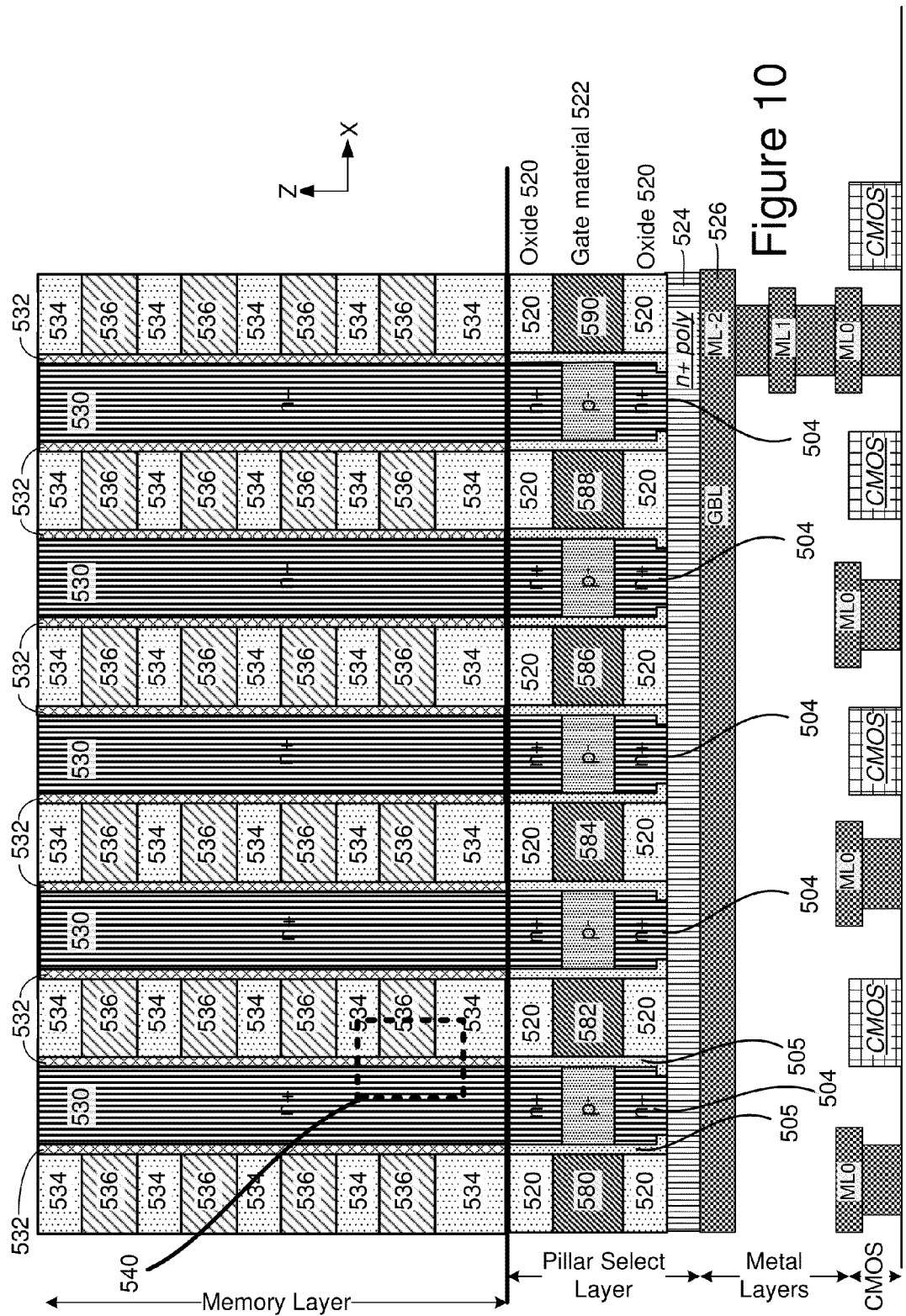

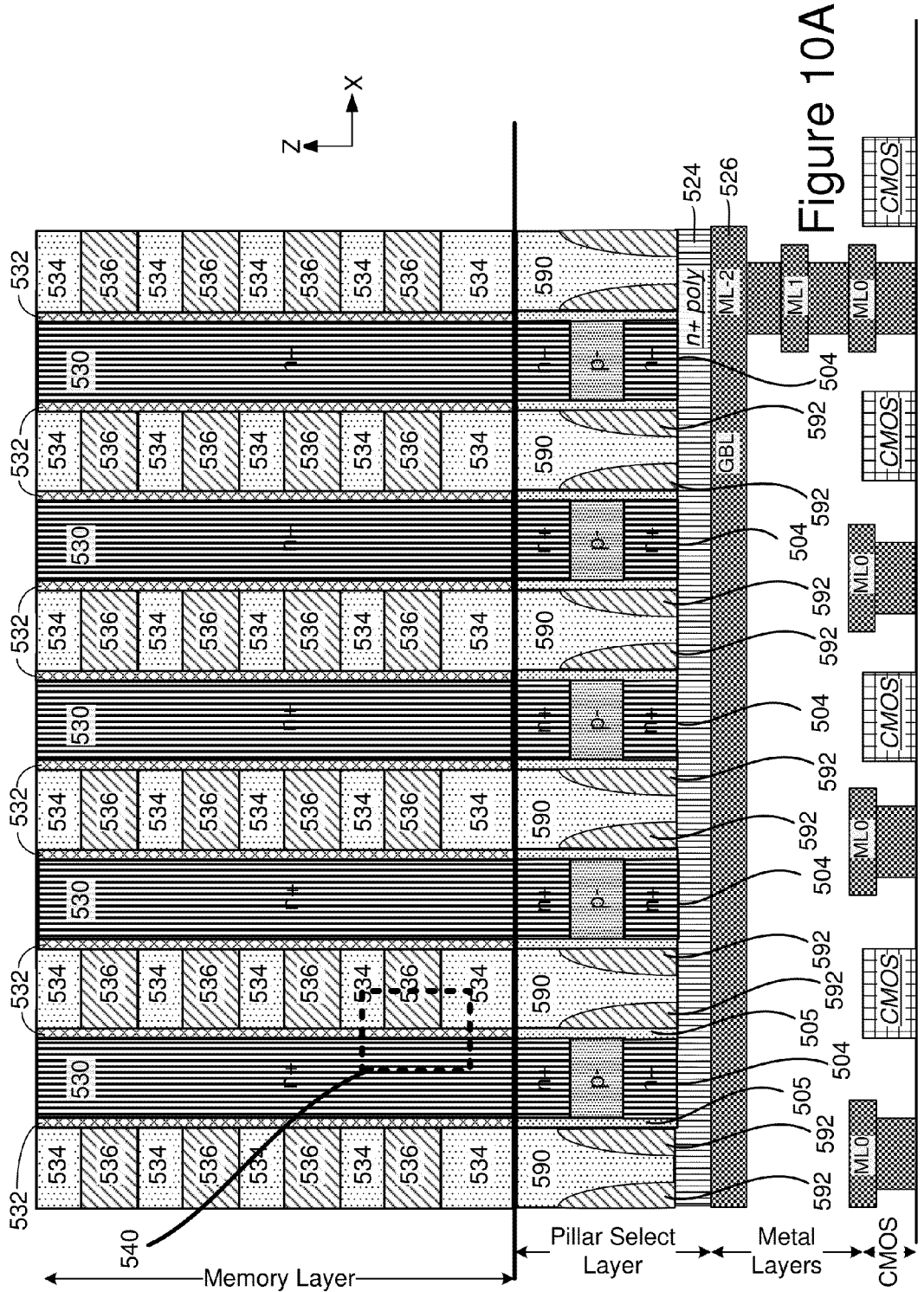

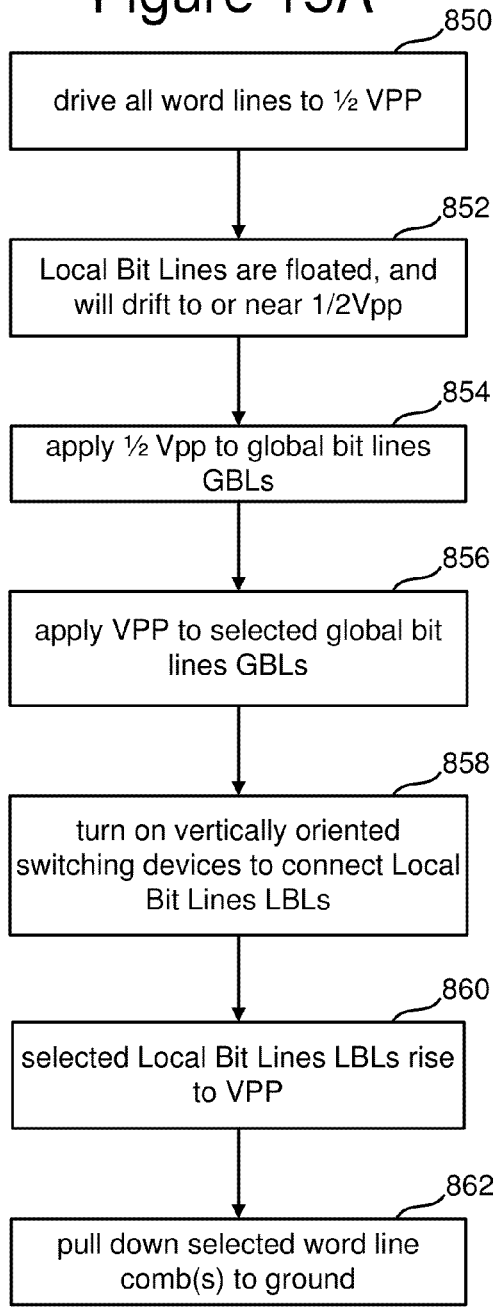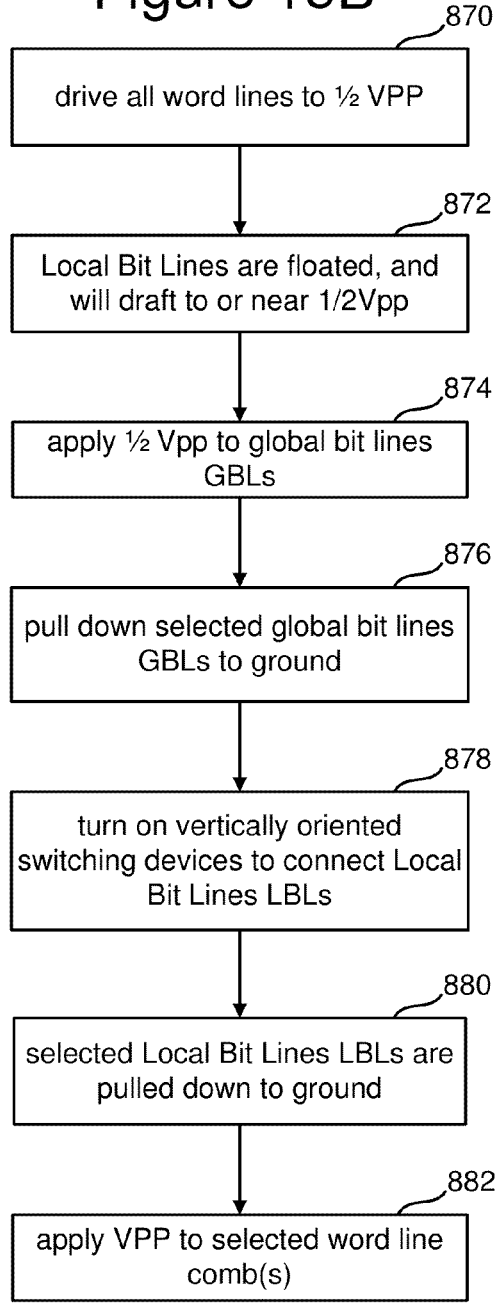

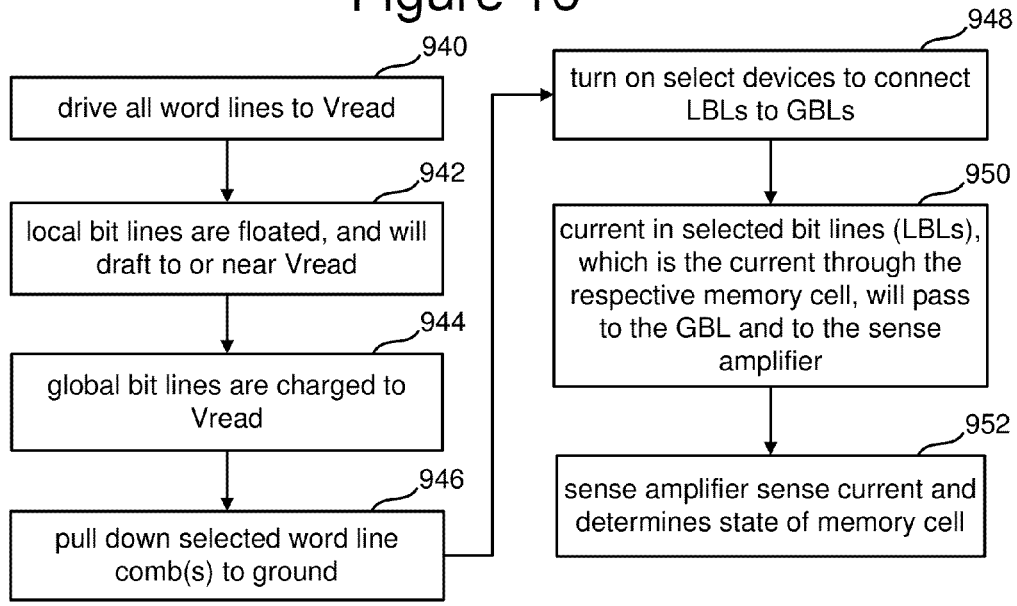
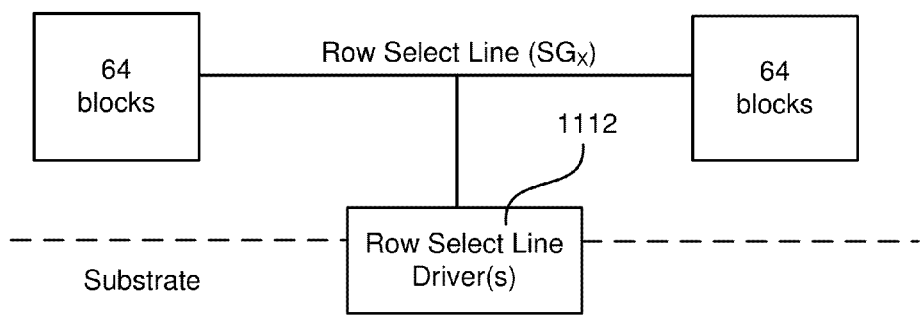

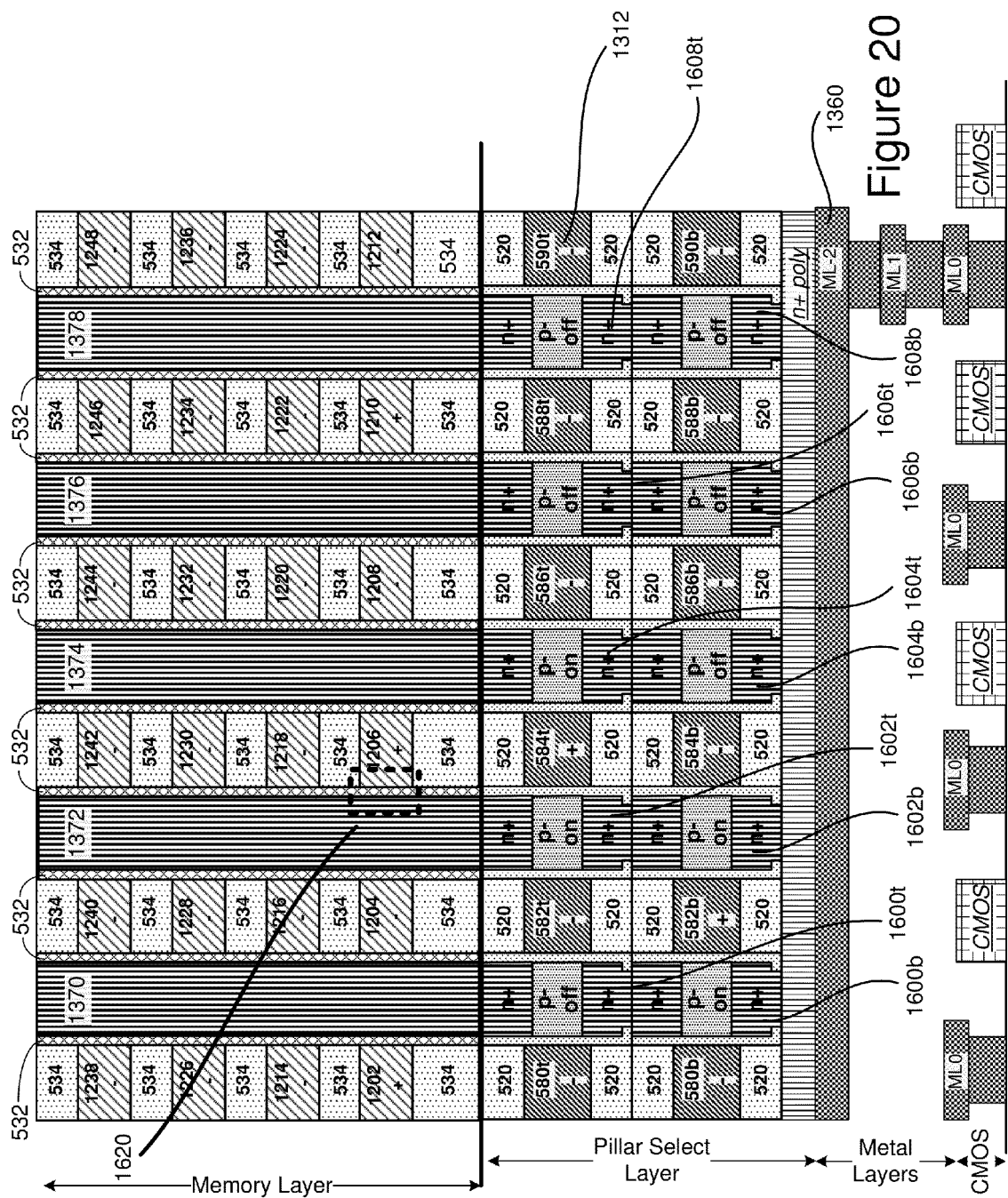

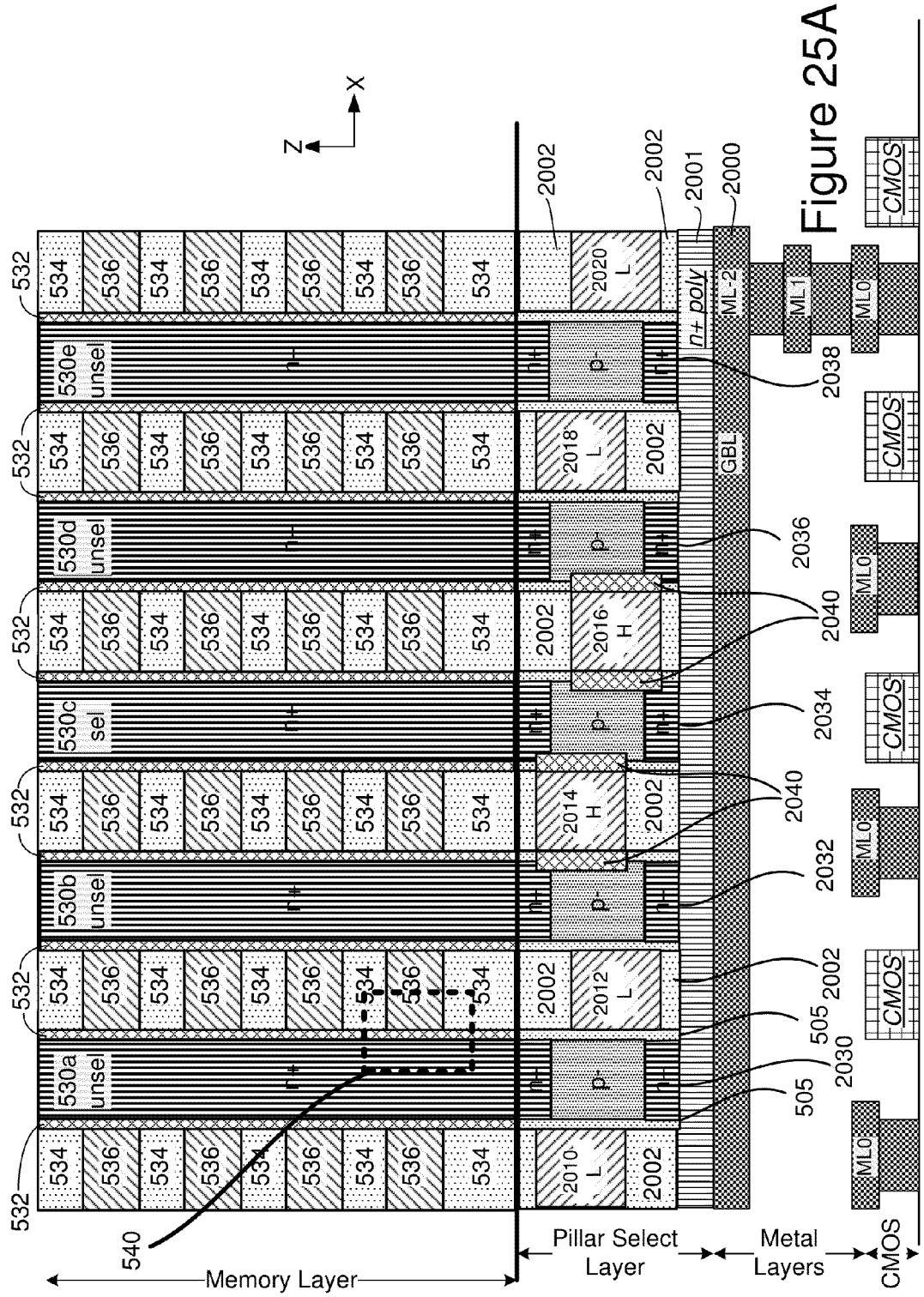

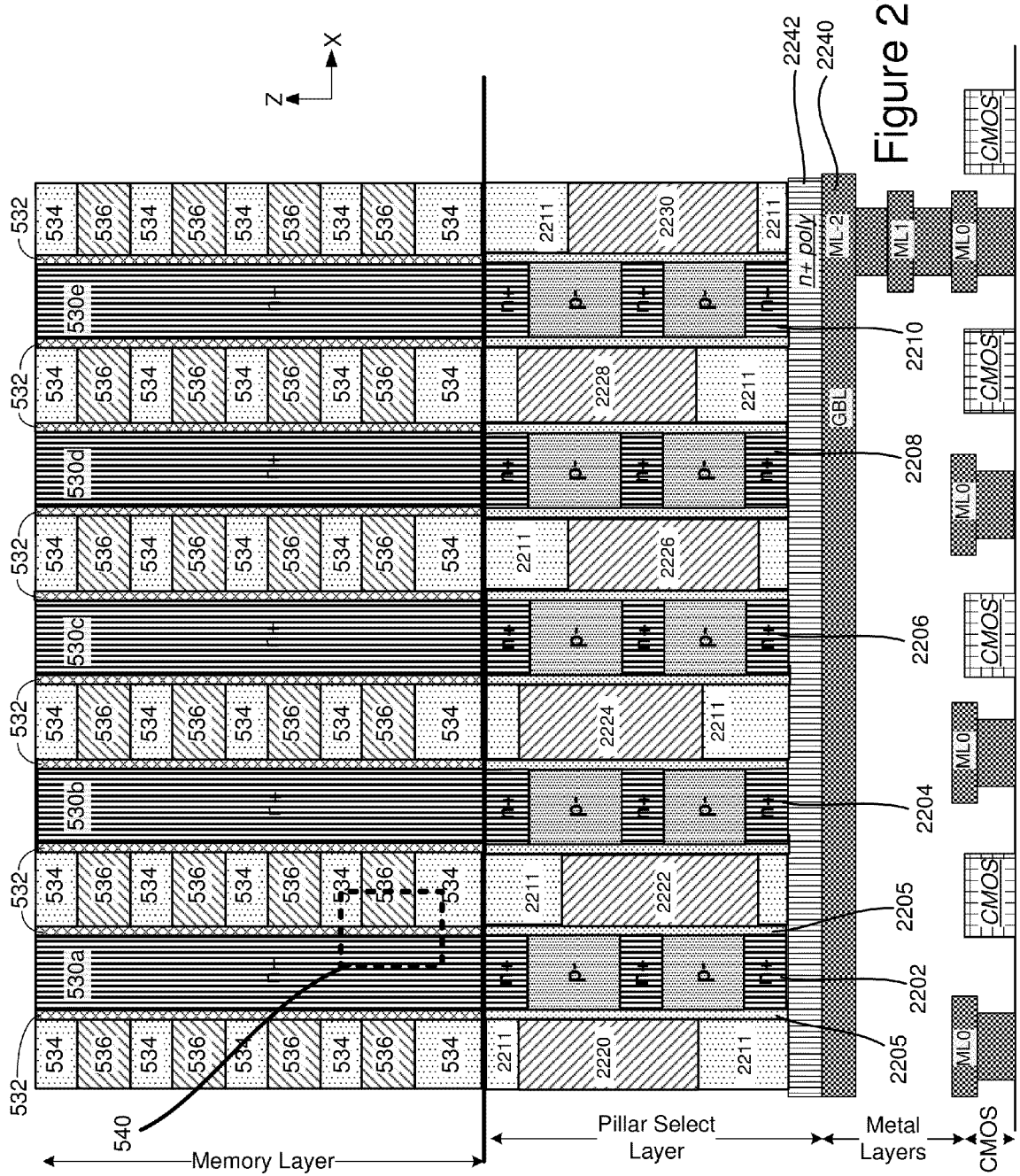

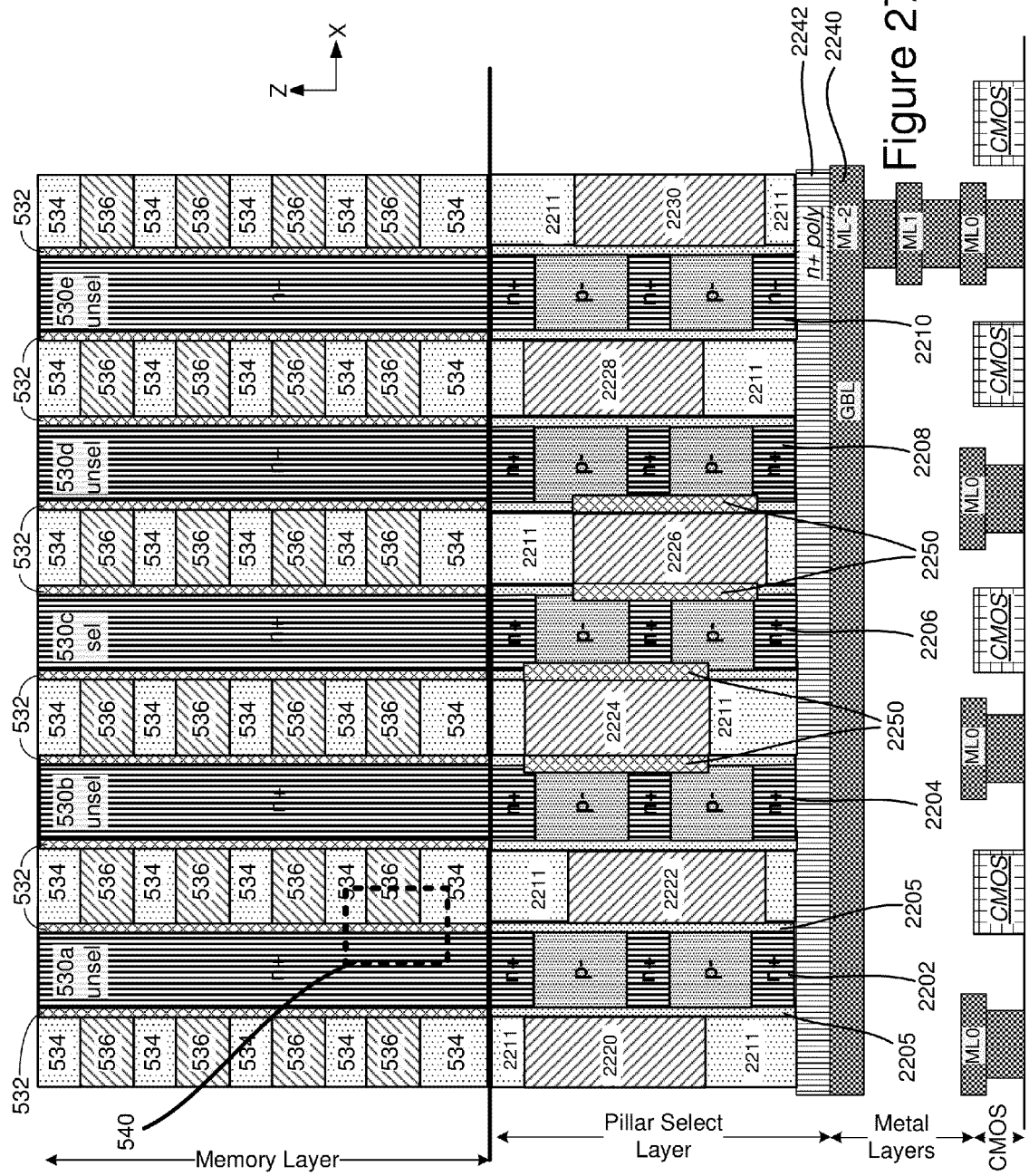

SHARED-GATE VERTICAL-TFT FOR VERTICAL BIT LINE ARRAY

This application claims the benefit of U.S. Provisional Application 61/860,861, "Shared-Gate Vertical-TFT For VBL Array," filed on Jul. 31, 2013, incorporated herein by reference in its entirety.

BACKGROUND OF THE INVENTION

1. Field of the Invention

The present invention relates to technology for non-volatile storage.

2. Description of the Related Art

One example of non-volatile memory uses variable resistance memory elements that may be set to either low or high resistance states, and can remain in that state until subsequently re-set to the initial condition. The variable resistance memory elements are individually connected between two orthogonally extending conductors (typically bit and word lines) where they cross each other in a two-dimensional array. The state of such a memory element is typically changed by proper voltages being placed on the intersecting conductors. Since these voltages are necessarily also applied to a large number of other unselected memory elements because they are connected along the same conductors as the selected memory elements being programmed or read, diodes are commonly connected in series with the variable resistive elements in order to reduce leakage currents that can flow through them. The desire to perform data reading and programming operations with a large number of memory elements in parallel results in reading or programming voltages being applied to a very large number of other memory elements. An example of an array of variable resistive elements and associated diodes is given in U.S. Patent Application Publication No. US 2009/0001344.

BRIEF DESCRIPTION OF THE DRAWINGS

FIG. 7 is an equivalent circuit of a portion of an example three-dimensional array of variable resistance memory elements, wherein the array has vertical bit lines and a pillar select layer, both of which are above (and not in) the substrate.

FIG. 10 illustrates one embodiment of a memory structure with vertical local bit lines above the substrate and vertically oriented select devices above the substrate that connect the bit lines to global bit lines.

FIG. 10A illustrates one embodiment of a memory structure with vertical local bit lines above the substrate and vertically oriented select devices above the substrate that connect the bit lines to global bit lines.

FIGS. 15A and 15B are flow charts describing embodiments for the memory system.

FIG. 16 is a flow chart describing one embodiment for reading the memory system.

FIG. 17 is a block diagram showing a row select line driver and the associated row select line.

FIG. 20 depicts a cross section of a structure to implement another embodiment of a memory that includes two levels of row select lines and vertically oriented select devices.

FIG. 25A illustrates one embodiment of a memory structure with vertical local bit lines above the substrate and vertically oriented select devices above the substrate that connect the bit lines to global bit lines.

FIG. 27 illustrates one embodiment of a memory structure with vertical local bit lines above the substrate and vertically oriented select devices above the substrate that connect the bit lines to global bit lines.

FIG. 27A illustrates one embodiment of a memory structure with vertical local bit lines above the substrate and vertically oriented select devices above the substrate that connect the bit lines to global bit lines.

DETAILED DESCRIPTION

Figure 1:
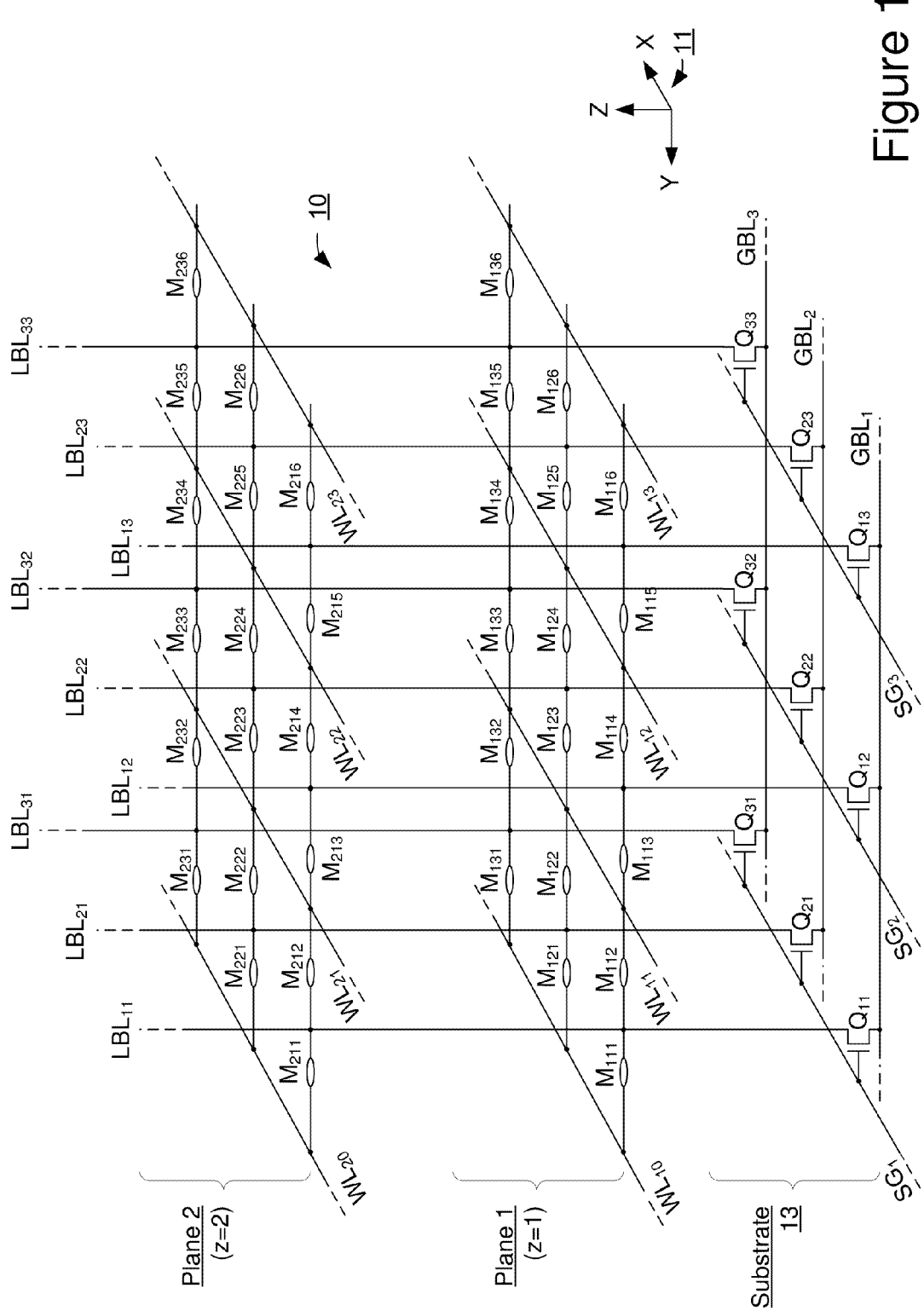
FIG. 1 is an equivalent circuit of a portion of an example three-dimensional array of variable resistance memory elements, wherein the array has vertical bit lines.

One example non-volatile storage device comprises: a substrate; a monolithic three dimensional array of memory cells positioned above and not in the substrate; a plurality of word lines connected to the memory cells; a plurality of global bit lines; a plurality of vertically oriented bit lines connected to the memory cells; and vertically oriented select devices that are above and not in the substrate. New structures for the vertically oriented select devices are proposed that reduce the risk of a disturb and maintain good current. The proposed vertically oriented select devices comprise double gated vertically oriented select devices that are connected to the vertically oriented bit lines and the global bit lines so that when the double gated vertically oriented select devices are activated the vertically oriented bit lines are in communication with the global bit lines. Each double gated vertically oriented select device has two gates that are offset from each other with respect to distance to the substrate with only one gate on each of two sides of the double gated vertically oriented select device so that both gates for the double gated vertically oriented select device need be in an "on" condition for the double gated vertically oriented select devices to be activated.

The memory elements used in the three-dimensional array are preferably variable resistance memory elements. That is, the resistance (and thus inversely the conductance) of the individual memory elements is typically changed as a result of a voltage placed across the orthogonally intersecting conductors to which the memory element is connected. Depending on the type of variable resistive element, the state may change in response to a voltage across it, a level of current though it, an amount of electric field across it, a level of heat applied to it, and the like. With some variable resistive element material, it is the amount of time that the voltage, current, electric field, heat and the like is applied to the element that determines when its conductive state changes and the direction in which the change takes place. In between such state changing operations, the resistance of the memory element remains unchanged, so is non-volatile. The three-dimensional array architecture summarized above may be implemented with a memory element material selected from a wide variety of such materials having different properties and operating characteristics.

The resistance of the memory element, and thus its detectable storage state, can be repetitively set from an initial level to another level and then re-set back to the initial level. For some materials, the amount or duration of the voltage, current, electric field, heat and the like applied to change its state in one direction is different (asymmetrical) with that applied to change in another direction. With two detectable states, each memory element stores one-bit of data. With the use of some materials, more than one bit of data may be stored in each memory element by designating more than two stable levels of resistance as detectable states of the memory element. The three-dimensional array architecture herein is quite versatile in the way it may be operated.

This three-dimensional architecture also allows limiting the extent and number of unaddressed (non-selected) resistive memory elements across which an undesired level of voltage is applied during reading and programming operations conducted on other addressed (selected) memory elements. The risk of disturbing the states of unaddressed memory elements and the levels of leakage current passing through unaddressed elements may be significantly reduced from those experienced in other arrays using the same memory element material. Leakage currents are undesirable because they can alter the apparent currents being read from addressed memory elements, thereby making it difficult to accurately read the states of addressed (selected) memory elements. Leakage currents are also undesirable because they add to the overall power draw by an array and therefore undesirably causes the power supply to have to be made larger than is desirable. Because of the relatively small extent of unaddressed memory elements that have voltages applied during programming and reading of addressed memory elements, the array with the three-dimensional architecture herein may be made to include a much larger number of addressed memory elements without introducing errors in reading and exceeding reasonable power supply capabilities.

In addition, the three-dimensional architecture herein allows variable resistance memory elements to be connected at orthogonal crossings of bit and word line conductors without the need for diodes or other non-linear elements being connected in series with the variable resistive elements. In existing arrays of variable resistance memory elements, a diode is commonly connected in series with each memory element in order to reduce the leakage current though the element when it is unselected but nevertheless has a voltage difference placed across it, such as can occur when the unselected memory element is connected to a bit or word line carrying voltages to selected memory elements connected to those same lines. The absence of the need for diodes significantly reduces the complexity of the array and thus the number of processing steps required to manufacture it. The terms connected and coupled refers to direct and indirect connections/couplings.

Indeed, the manufacture of the three-dimensional array of memory elements herein is much simpler than other three-dimensional arrays using the same type of memory elements. In particular, a fewer number of masks is required to form the elements of each plane of the array. The total number of processing steps needed to form integrated circuits with the three-dimensional array are thus reduced, as is the cost of the resulting integrated circuit.

Referring initially to FIG. 1, an architecture of one example embodiment of a three-dimensional memory 10 is schematically and generally illustrated in the form of an equivalent circuit of a portion of such a memory. A standard three-dimensional rectangular coordinate system 11 is used for reference, the directions of each of vectors x, y and z being orthogonal with the other two. In another embodiment direction x and x are substantially 60 degrees from each other.

A circuit for selectively connecting internal memory elements with external data circuits is preferably formed using select devices $Q_{xy}$, where x gives a relative position of the device in the x-direction and y its relative position in the y-direction. The individual select devices $Q_{xy}$ may be a select gate or select transistor, as examples. Global bit lines ($GBL_x$) are elongated in the y-direction and have relative positions in the x-direction that are indicated by the subscript. The global bit lines ($GBL_x$) are individually connectable with the source or drain of the select devices $Q_{xy}$ having the same position in the x-direction, although during reading and also typically programming only one select device connected with a specific global bit line is turned on at time. The other of the source or drain of the individual select devices $Q_{xy}$ is connected with one of the local bit lines ($LBL_{xy}$). The local bit lines are elongated vertically, in the z-direction, and form a regular two-dimensional array in the x (row) and y (column) directions.

In order to connect one set (in this example, designated as one row) of local bit lines with corresponding global bit lines, row select lines $SG_y$ are elongated in the x-direction and connect with control terminals (gates) of a single row of select devices $Q_{xy}$ having a common position in the y-direction. The select devices $Q_{xy}$ therefore connect one row of local bit lines ($LBL_{xy}$) across the x-direction (having the same position in the y-direction) at a time to corresponding ones of the global bit-lines ($GBL_x$), depending upon which of the row select lines $SG_y$ receives a voltage that turns on the select devices to which it is connected. The remaining row select lines receive voltages that keep their connected select devices $Q_{xy}$ off. It may be noted that since only one select device ($Q_{xy}$) is used with each of the local bit lines ($LBL_{xy}$), the pitch of the array across the semiconductor substrate in both x and y-directions may be made very small, and thus the density of the memory storage elements large.

Memory elements $M_{zxy}$ are formed in a plurality of planes positioned at different distances in the z-direction above the substrate 13. Two planes 1 and 2 are illustrated in FIG. 1 but there will typically be more, such as 4, 6, 8, 16, 32, or even more. In each plane at distance z, word lines $WL_{xy}$ are elongated in the x-direction and spaced apart in the y-direction between the local bit-lines ($LBL_{xy}$). The word lines $WL_{xy}$ of each plane individually cross adjacent two of the local bit-lines $LBL_{xy}$ on either side of the word lines. The individual memory storage elements $M_{zxy}$ are connected between one local bit line $LBL_{xy}$ and one word line $WL_{xy}$ adjacent these individual crossings. An individual memory element $M_{zxy}$ is therefore addressable by placing proper voltages on the local bit line $LBL_{xy}$ and word line $WL_{xy}$ between which the memory element is connected. The voltages are chosen to provide the electrical stimulus necessary to cause the state of the memory element to change from an existing state to the desired new state. The levels, duration and other characteristics of these voltages depend upon the material that is used for the memory elements.

Each "plane" of the three-dimensional memory structure is typically formed of at least two layers, one in which the conductive word lines $WL_{xy}$ are positioned and another of a dielectric material that electrically isolates the planes from each other. Additional layers may also be present in each plane, depending for example on the structure of the memory elements $M_{zxy}$. The planes are stacked on top of each other above a semiconductor substrate with the local bit lines $LBL_{xy}$ being connected with storage elements $M_{zxy}$ of each plane through which the local bit lines extend.

The memory arrays described herein, including memory 10, are examples of monolithic three dimensional memory structures. A monolithic three dimensional memory structure is one in which multiple memory levels are formed above (and not in) a single substrate, such as a wafer, with no intervening substrates and active areas of the memory are disposed above the substrate. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three Dimensional Structure Memory." The substrates may be thinned or removed from the memory levels before bonding, but as the memory levels are initially formed over separate substrates, such memories are not true monolithic three dimensional memory structures or monolithic three dimensional memory arrays.

Figure 2:
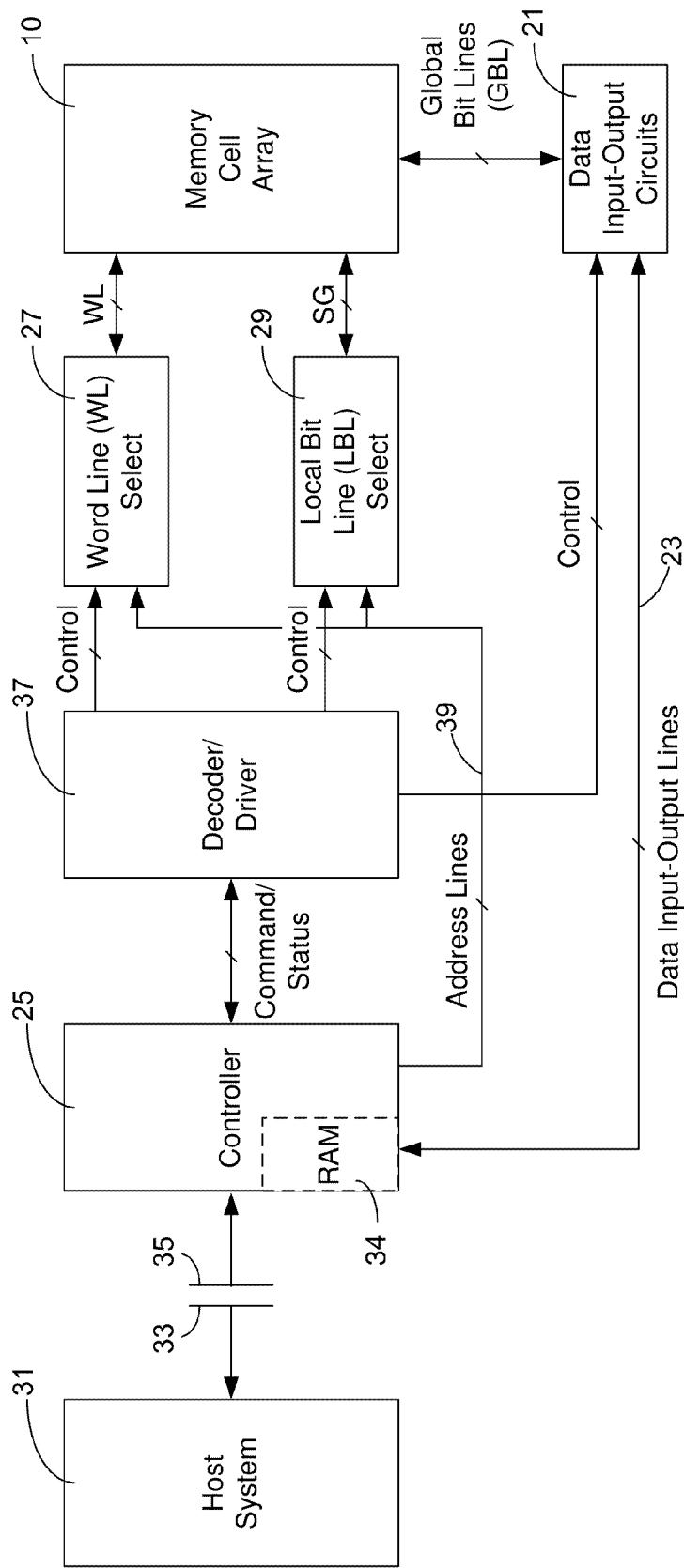
FIG. 2 is a schematic block diagram of a re-programmable non-volatile memory system which utilizes the memory array of FIG. 1, and which indicates connection of the memory system with a host system.

FIG. 2 is a block diagram of an illustrative memory system that can use the three-dimensional memory 10 of FIG. 1. Data input-output circuits 21 are connected to provide (during programming) and receive (during reading) analog electrical quantities in parallel over the global bit-lines $GBL_x$ of FIG. 1 that are representative of data stored in addressed memory elements $M_{zxy}$. Data input-output circuits 21 typically contain sense amplifiers for converting these electrical quantities into digital data values during reading, which digital values are then conveyed over lines 23 to a memory system controller 25. Conversely, data to be programmed into the array 10 are sent by the controller 25 to the input-output circuits 21, which then programs that data into addressed memory element by placing proper voltages on the global bit lines $GBL_x$. For binary operation, one voltage level is typically placed on a global bit line to represent a binary "1" and another voltage level to represent a binary "0". The memory elements are addressed for reading or programming by voltages placed on the word lines $WL_{zy}$ and row select lines $SG_y$ by respective word line select circuits 27 and local bit line circuits 29. In the specific three-dimensional array of FIG. 1, the memory elements lying between a selected word line and any of the local bit lines $LBL_{xy}$ connected at one instance through the select devices $Q_{xy}$ to the global bit lines $GBL_x$ may be addressed for programming or reading by appropriate voltages being applied through the select circuits 27 and 29.

Controller 25 typically receives data from and sends data to a host system 31. Controller 25 usually contains an amount of random-access-memory (RAM) 34 for temporarily storing such data and operating information. Commands, status signals and addresses of data being read or programmed are also exchanged between the controller 25 and host 31. The memory system operates with a wide variety of host systems. They include personal computers (PCs), laptop and other portable computers, cellular telephones, personal digital assistants (PDAs), digital still cameras, digital movie cameras and portable audio players. The host typically includes a built-in receptacle 33 for one or more types of memory cards or flash drives that accepts a mating memory system plug 35 of the memory system but some hosts require the use of adapters into which a memory card is plugged, and others require the use of cables therebetween. Alternatively, the memory system may be built into the host system as an integral part thereof.

Controller 25 conveys to decoder/driver circuits 37 commands received from the host 31. Similarly, status signals generated by the memory system are communicated to the controller 25 from decoder/driver circuits 37. The circuits 37 can be simple logic circuits in the case where the controller controls nearly all of the memory operations, or can include a state machine to control at least some of the repetitive memory operations necessary to carry out given commands. Control signals resulting from decoding commands are applied from the circuits 37 to the word line select circuits 27, local bit line select circuits 29 and data input-output circuits 21. Also connected to the circuits 27 and 29 are address lines 39 from the controller that carry physical addresses of memory elements to be accessed within the array 10 in order to carry out a command from the host. The physical addresses correspond to logical addresses received from the host system 31, the conversion being made by the controller 25 and/or the decoder/driver 37. As a result, the local bit line select circuits 29 partially address the designated storage elements within the array 10 by placing proper voltages on the control elements of the select devices $Q_{xy}$ to connect selected local bit lines ($LBL_{xy}$) with the global bit lines ($GBL_x$). The addressing is completed by the circuits 27 applying proper voltages to the word lines $WL_{zy}$ of the array. In one embodiment, any one or combination of Controller 25, decoder/driver circuits 37, circuits 21, 27 and 29, or other control logic can be referred to as one or more control circuits.

Although the memory system of FIG. 2 utilizes the three-dimensional memory array 10 of FIG. 1, the system is not limited to use of only that array architecture. A given memory system may alternatively combine this type of memory with other another type including flash memory, such as flash memory having a NAND memory cell array architecture, a magnetic disk drive or some other type of memory. The other type of memory may have its own controller or may in some cases share the controller 25 with the three-dimensional memory cell array 10, particularly if there is some compatibility between the two types of memory at an operational level.

Although each of the memory elements $M_{zxy}$ in the array of FIG. 1 may be individually addressed for changing its state according to incoming data or for reading its existing storage state, it is certainly preferable to program and read the array in units of multiple memory elements in parallel. In the three-dimensional array of FIG. 1, one row of memory elements on one plane may be programmed and read in parallel. The number of memory elements operated in parallel depends on the number of memory elements connected to the selected word line. In some arrays, the word lines may be segmented (not shown in FIG. 1) so that only a portion of the total number of memory elements connected along their length may be addressed for parallel operation, namely the memory elements connected to a selected one of the segments. In some arrays the number of memory elements programmed in one operation may be less than the total number of memory elements connected to the selected word line to minimize IR drops, to minimize power, or for other reasons.

Previously programmed memory elements whose data have become obsolete may be addressed and re-programmed from the states in which they were previously programmed. The states of the memory elements being re-programmed in parallel will therefore most often have different starting states among them. This is acceptable for many memory element materials but it is usually preferred to re-set a group of memory elements to a common state before they are re-programmed. For this purpose, the memory elements may be grouped into blocks, where the memory elements of each block are simultaneously reset to a common state, preferably one of the programmed states, in preparation for subsequently programming them. If the memory element material being used is characterized by changing from a first to a second state in significantly less time than it takes to be changed from the second state back to the first state, then the reset operation is preferably chosen to cause the transition taking the longer time to be made. The programming is then done faster than resetting. The longer reset time is usually not a problem since resetting blocks of memory elements containing nothing but obsolete data is typically accomplished in a high percentage of the cases in the background, therefore not adversely impacting the programming performance of the memory system.

With the use of block re-setting of memory elements, a three-dimensional array of variable resistive memory elements may be operated in a manner similar to current flash memory arrays. Resetting a block of memory elements to a common state corresponds to erasing a block of flash memory elements to an erased state. The individual blocks of memory elements herein may be further divided into a plurality of pages of storage elements, wherein the memory elements of a page are programmed and read together. This is like the use of pages in flash memories. The memory elements of an individual page are programmed and read together. Of course, when programming, those memory elements that are to store data that are represented by the reset state are not changed from the reset state. Those of the memory elements of a page that need to be changed to another state in order to represent the data being stored in them have their states changed by the programming operation.

Figure 3:
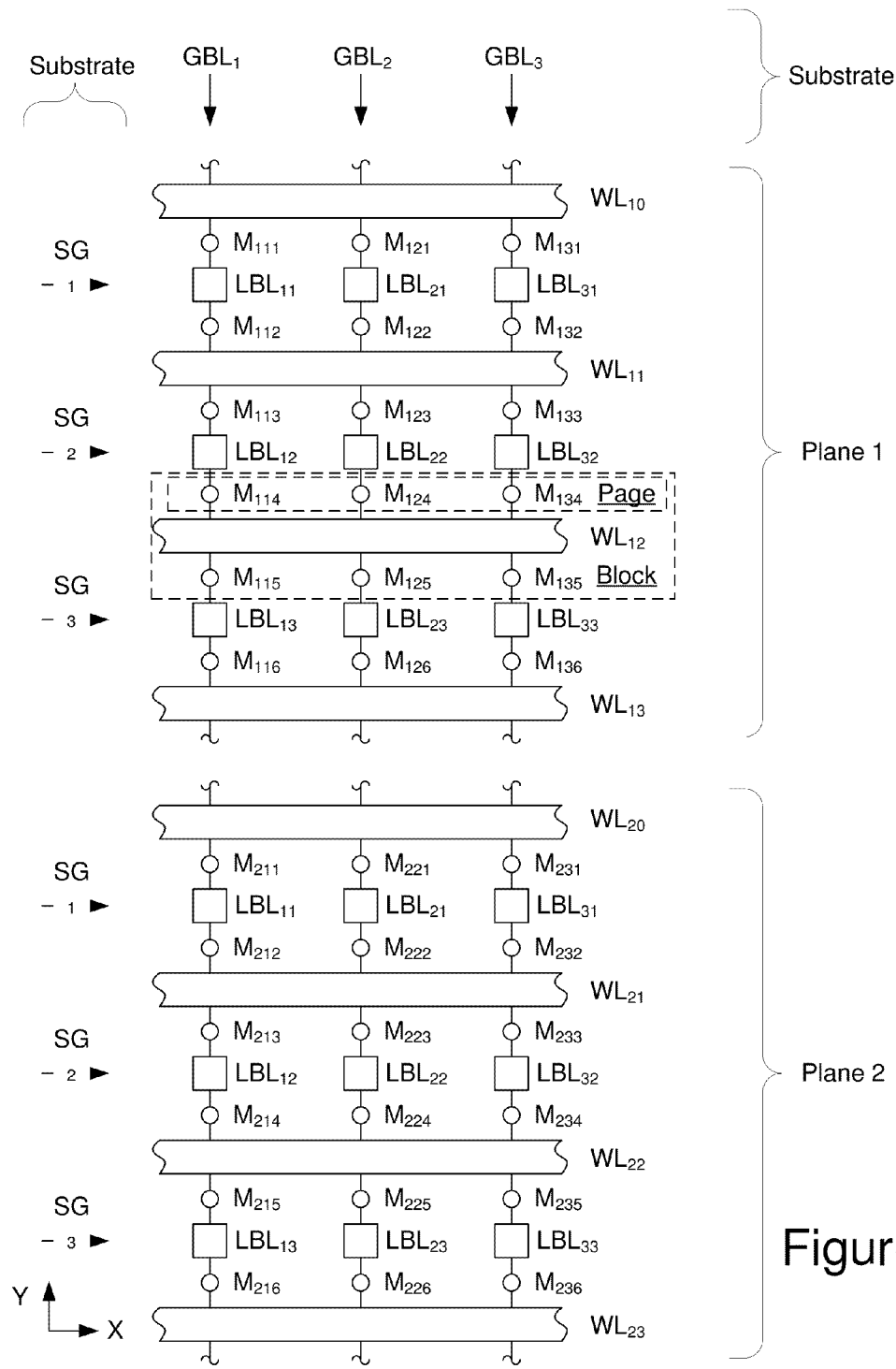
FIG. 3 provides plan views of the two planes and substrate of the three-dimensional array of FIG. 1, with some structure added.

An example of use of such blocks and pages is illustrated in FIG. 3, which provides plan schematic views of planes 1 and 2 of the array of FIG. 1. The different word lines $WL_{zy}$ that extend across each of the planes and the local bit lines $LBL_{xy}$ that extend through the planes are shown in two-dimensions. Individual blocks are made up of memory elements connected to both sides of one word line, or one segment of a word line if the word lines are segmented, in a single one of the planes. There are therefore a very large number of such blocks in each plane of the array. In the block illustrated in FIG. 3, each of the memory elements $M_{114}$, $M_{124}$, $M_{134}$, $M_{115}$, $M_{125}$ and $M_{135}$ connected to both sides of one word line $WL_{12}$ form the block. Of course, there will be many more memory elements connected along the length of a word line but only a few of them are illustrated, for simplicity. The memory elements of each block are connected between the single word line and different ones of the local bit lines, namely, for the block illustrated in FIG. 3, between the word line $WL_{12}$ and respective local bit lines $LBL_{12}$, $LBL_{22}$, $LBL_{32}$, $LBL_{13}$, $LBL_{23}$ and $LBL_{33}$.

A page is also illustrated in FIG. 3. In the specific embodiment being described, there are two pages per block. One page is formed by the memory elements along one side of the word line of the block and the other page by the memory elements along the opposite side of the word line. The example page marked in FIG. 3 is formed by memory elements $M_{114}$, $M_{124}$ and $M_{134}$. Of course, a page will typically have a very large number of memory elements in order to be able to program and read a large amount of data at one time. Only a few of the storage elements of the page of FIG. 3 are included, for simplicity in explanation.

Example resetting, programming and reading operations of the memory array of FIGS. 1 and 3, when operated as array 10 in the memory system of FIG. 2, will now be described. For these examples, each of the memory elements $M_{zxy}$ is taken to include a non-volatile memory material that can be switched between two stable states of different resistance levels by impressing voltages (or currents) of different polarity across the memory element, or voltages of the same polarity but different magnitudes and/or duration. For example, one class of material may be placed into a high resistance state by passing current in one direction through the element, and into a low resistance state by passing current in the other direction through the element. Or, in the case of switching using the same voltage polarity, one element may need a higher voltage and a shorter time to switch to a high resistance state and a lower voltage and a longer time to switch to a lower resistance state. These are the two memory states of the individual memory elements that indicate storage of one bit of data, which is either a "0" or a "1," depending upon the memory element state.

To reset (e.g., erase) a block of memory elements, the memory elements in that block are placed into their high resistance state. This state will be designated as the logical data state "1," following the convention used in current flash memory arrays but it could alternatively be designated to be a "0." As shown by the example in FIG. 3, a block includes all the memory elements that are electrically connected to one word line WL or segment thereof. A block is the smallest unit of memory elements in the array that are reset together. It can include thousands of memory elements. If a row of memory elements on one side of a word line includes 1000 of them, for example, a block will have 2000 memory elements from the two rows on either side of the word line.

The following steps may be taken to reset all the memory elements of a block, using the block illustrated in FIG. 3 as an example:

1. Set all of the global bit lines ($GBL_1$, $GBL_2$ and $GBL_3$ in the array of FIGS. 1 and 3) to zero volts, by the circuits 21 of FIG. 2.
2. Set at least the two row select lines on either side of the one word line of the block to H' volts, so that the local bit lines on each side of the word line in the y-direction are connected to their respective global bit lines through their select devices and therefore brought to zero volts. The voltage H' is made high enough to turn on the select devices $Q_{xy}$, for example, something in a range of 1-6 volts, typically 3 volts. The block shown in FIG. 3 includes the word line $WL_{12}$, so the row select lines $SG_2$ and $SG_3$ (FIG. 1) on either side of that word line are set to H' volts, by the circuits 29 of FIG. 2, in order to turn on the select devices $Q_{12}$, $Q_{22}$, $Q_{32}$, $Q_{13}$, $Q_{23}$ and $Q_{33}$. This causes each of the local bit lines $LBL_{12}$, $LBL_{22}$, $LBL_{32}$, $LBL_{13}$, $LBL_{23}$ and $LBL_{33}$ in two adjacent rows extending in the x-direction to be connected to respective ones of the global bit lines GBL1, GBL2 and GBL3. Two of the local bit lines adjacent to each other in the y-direction are connected to a single global bit line. Those local bit lines are then set to the zero volts of the global bit lines. The remaining local bit lines preferably remain unconnected and with their voltages floating.
3. Set the word line of the block being reset to H volts. This reset voltage value is dependent on the switching material in the memory element and can be between a fraction of a volt to a few volts. All other word lines of the array, including the other word lines of selected plane 1 and all the word lines on the other unselected planes, are set to zero volts. In the array of FIGS. 1 and 3, word line $WL_{12}$ is placed at H volts, while all other word lines in the array are placed at zero volts, all by the circuits 27 of FIG. 2.

The result is that H volts are placed across each of the memory elements of the block. In the example block of FIG. 3, this includes the memory elements $M_{114}$, $M_{124}$, $M_{134}$, $M_{115}$, $M_{125}$ and $M_{135}$. For the type of memory material being used as an example, the resulting currents through these memory elements places any of them not already in a high resistance state, into that re-set state.

It may be noted that no stray currents will flow because only one word line has a non-zero voltage. The voltage on the one word line of the block can cause current to flow to ground only through the memory elements of the block. There is also nothing that can drive any of the unselected and electrically floating local bit lines to H volts, so no voltage difference will exist across any other memory elements of the array outside of the block. Therefore no voltages are applied across unselected memory elements in other blocks that can cause them to be inadvertently disturbed or reset.

It may also be noted that multiple blocks may be concurrently reset by setting any combination of word lines and the adjacent select gates to H or H' respectively. In this case, the only penalty for doing so is an increase in the amount of current that is required to simultaneously reset an increased number of memory elements. This affects the size of the power supply that is required. In some embodiments, less than all memory elements of a block will be simultaneously reset.

The memory elements of a page are preferably programmed concurrently, in order to increase the parallelism of the memory system operation. An expanded version of the page indicated in FIG. 3 is provided in FIG. 4, with annotations added to illustrate a programming operation. The individual memory elements of the page are initially in their reset state because all the memory elements of its block have previously been reset. The reset state is taken herein to represent a logical data "1." For any of these memory elements to store a logical data "0" in accordance with incoming data being programmed into the page, those memory elements are switched into their low resistance state, their set state, while the remaining memory elements of the page remain in the reset state.

For programming a page, only one row of select devices is turned on, resulting in only one row of local bit lines being connected to the global bit lines. This connection alternatively allows the memory elements of both pages of the block to be programmed in two sequential programming cycles, which then makes the number of memory elements in the reset and programming units equal.

Figure 4:
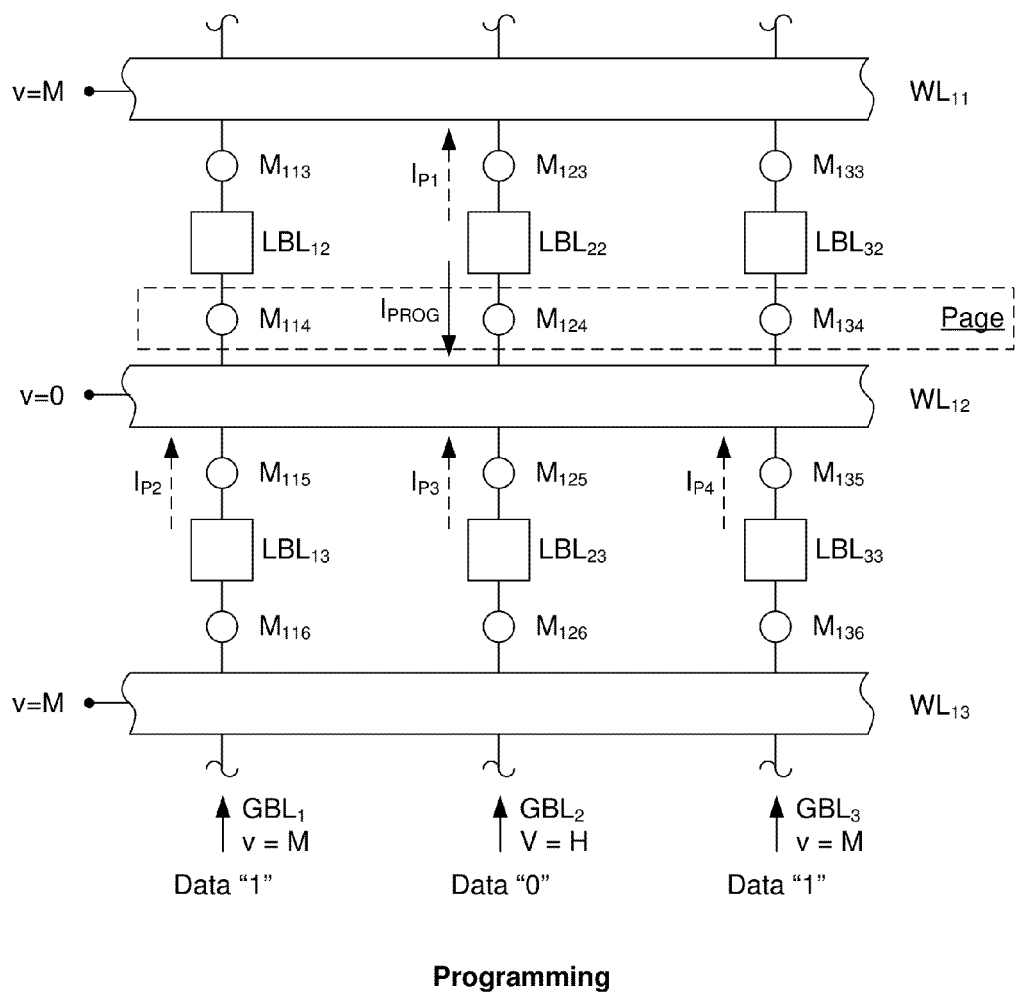
FIG. 4 is an expanded view of a portion of one of the planes of FIG. 3, annotated to show effects of programming data therein.

Referring to FIGS. 3 and 4, an example programming operation within the indicated one page of memory elements $M_{114}$, $M_{124}$ and $M_{134}$ is described, as follows:

1. The voltages placed on the global bit lines are in accordance with the pattern of data received by the memory system for programming. In the example of FIG. 4, $GBL_1$ carries logical data bit "1", $GBL_2$ the logical bit "0" and $GBL_3$ the logical bit "1." The bit lines are set respectively to corresponding voltages M, H and M, as shown, where the M level voltage is high but not sufficient to program a memory element and the H level is high enough to force a memory element into the programmed state. The M level voltage may be about one-half of the H level voltage, between zero volts and H. For example, a M level can be 0.7 volt, and a H level can be 1.5 volt. The H level used for programming is not necessary the same as the H level used for resetting or reading. In this case, according to the received data, memory elements $M_{114}$ and $M_{134}$ are to remain in their reset state, while memory element $M_{124}$ is being programmed. Therefore, the programming voltages are applied only to memory element $M_{124}$ of this page by the following steps.
2. Set the word line of the page being programmed to 0 volts, in this case selected word line $WL_{12}$. This is the only word line to which the memory elements of the page are connected. Each of the other word lines on all planes is set to the M level. These word line voltages are applied by the circuits 27 of FIG. 2.
3. Set one of the row select lines below and on either side of the selected word line to the H' voltage level, in order to select a page for programming. For the page indicated in FIGS. 3 and 4, the H' voltage is placed on row select line $SG_2$ in order to turn on select devices $Q_{12}$, $Q_{22}$ and $Q_{32}$ (FIG. 1). All other row select lines, namely lines $SG_1$ and $SG_3$ in this example, are set to 0 volts in order to keep their select devices off. The row select line voltages are applied by the circuits 29 of FIG. 2. This connects one row of local bit lines to the global bit lines and leaves all other local bit lines floating. In this example, the row of local bit lines $LBL_{12}$, $LBL_{22}$ and $LBL_{32}$ are connected to the respective global bit lines $GBL_1$, $GBL_2$ and $GBL_3$ through the select devices that are turned on, while all other local bit lines (LBLs) of the array are left floating.

The result of this operation, for the example memory element material mentioned above, is that a programming current $I_{PROG}$ is sent through the memory element $M_{124}$, thereby causing that memory element to change from a reset state to a set (programmed) state. The same will occur with other memory elements (not shown) that are connected between the selected word line $WL_{12}$ and a local bit line (LBL) that has the programming voltage level H applied.

An example of the relative timing of applying the above-listed programming voltages is to initially set all the global bit lines (GBLs), the selected row select line (SG), the selected word line and two adjacent word lines on either side of the selected word line on the one page all to the voltage level M. After this, selected ones of the GBLs are raised to the voltage level H according to the data being programmed while simultaneously dropping the voltage of the selected word line to 0 volts for the duration of the programming cycle. The word lines in plane 1 other than the selected word line $WL_{12}$ and all word lines in the unselected other planes can be weakly driven to M, some lower voltage or allowed to float in order to reduce power that must be delivered by word line drivers that are part of the circuits 27 of FIG. 2.

By floating all the local bit lines other than the selected row (in this example, all but $LBL_{12}$, $LBL_{22}$ and $LBL_{32}$) voltages can be loosely coupled to outer word lines of the selected plane 1 and word lines of other planes that are allowed to float through memory elements in their low resistance state (programmed) that are connected between the floating local bit lines and adjacent word lines. These outer word lines of the selected plane and word lines in unselected planes, although allowed to float, may eventually be driven up to voltage level M through a combination of programmed memory elements.

There are typically parasitic currents present during the programming operation that can increase the currents that must be supplied through the selected word line and global bit lines. During programming there are two sources of parasitic currents, one to the adjacent page in a different block and another to the adjacent page in the same block. An example of the first is the parasitic current $I_{P1}$ shown on FIG. 4 from the local bit line $LBL_{22}$ that has been raised to the voltage level H during programming. The memory element $M_{123}$ is connected between that voltage and the voltage level M on its word line $WL_{11}$. This voltage difference can cause the parasitic current $-I_{P1}$ to flow. Since there is no such voltage difference between the local bit lines $LBL_{12}$ or $LBL_{32}$ and the word line $WL_{11}$, no such parasitic current flows through either of the memory elements $M_{113}$ or $M_{133}$, a result of these memory elements remaining in the reset state according to the data being programmed.

Other parasitic currents can similarly flow from the same local bit line $LBL_{22}$ to an adjacent word line in other planes. The presence of these currents may limit the number of planes that can be included in the memory system since the total current may increase with the number of planes. The limitation for programming is in the current capacity of the memory power supply, so the maximum number of planes is a tradeoff between the size of the power supply and the number of planes. A number of 4-16 planes may generally be used in most cases, but a different amount can also be used.

The other source of parasitic currents during programming is to an adjacent page in the same block. The local bit lines that are left floating (all but those connected to the row of memory elements being programmed) will tend to be driven to the voltage level M of unselected word lines through any programmed memory element on any plane. This in turn can cause parasitic currents to flow in the selected plane from these local bit lines at the M voltage level to the selected word line that is at zero volts. An example of this is given by the currents $I_{P2}$, $I_{P3}$ and $I_{P4}$ shown in FIG. 4. In general, these currents will be much less than the other parasitic current $I_{P1}$ discussed above, since these currents flow only through those memory elements in their conductive state that are adjacent to the selected word line in the selected plane.

The above-described programming techniques ensure that the selected page is programmed (local bit lines at H, selected word line at 0) and that adjacent unselected word lines are at M. As mentioned earlier, other unselected word lines can be weakly driven to M or initially driven to M and then left floating. Alternately, word lines in any plane distant from the selected word line (for example, more than 5 word lines away) can also be left uncharged (at ground) or floating because the parasitic currents flowing to them are so low as to be negligible compared to the identified parasitic currents since they must flow through a series combination of five or more ON devices (devices in their low resistance state). This can reduce the power dissipation caused by charging a large number of word lines.

While the above description assumes that each memory element of the page being programmed will reach its desired ON value with one application of a programming pulse, a program-verify technique commonly used in NOR or NAND flash memory technology may alternately be used. In this process, a complete programming operation for a given page includes of a series of individual programming operations in which a smaller change in ON resistance occurs within each program operation. Interspersed between each program operation is a verify (read) operation that determines whether an individual memory element has reached its desired programmed level of resistance or conductance consistent with the data being programmed in the memory element. The sequence of program/verify is terminated for each memory element as it is verified to reach the desired value of resistance or conductance. After all of memory elements being programmed are verified to have reached their desired programmed value, programming of the page of memory elements is then completed. An example of this technique is described in U.S. Pat. No. 5,172,338.

Figure 5:
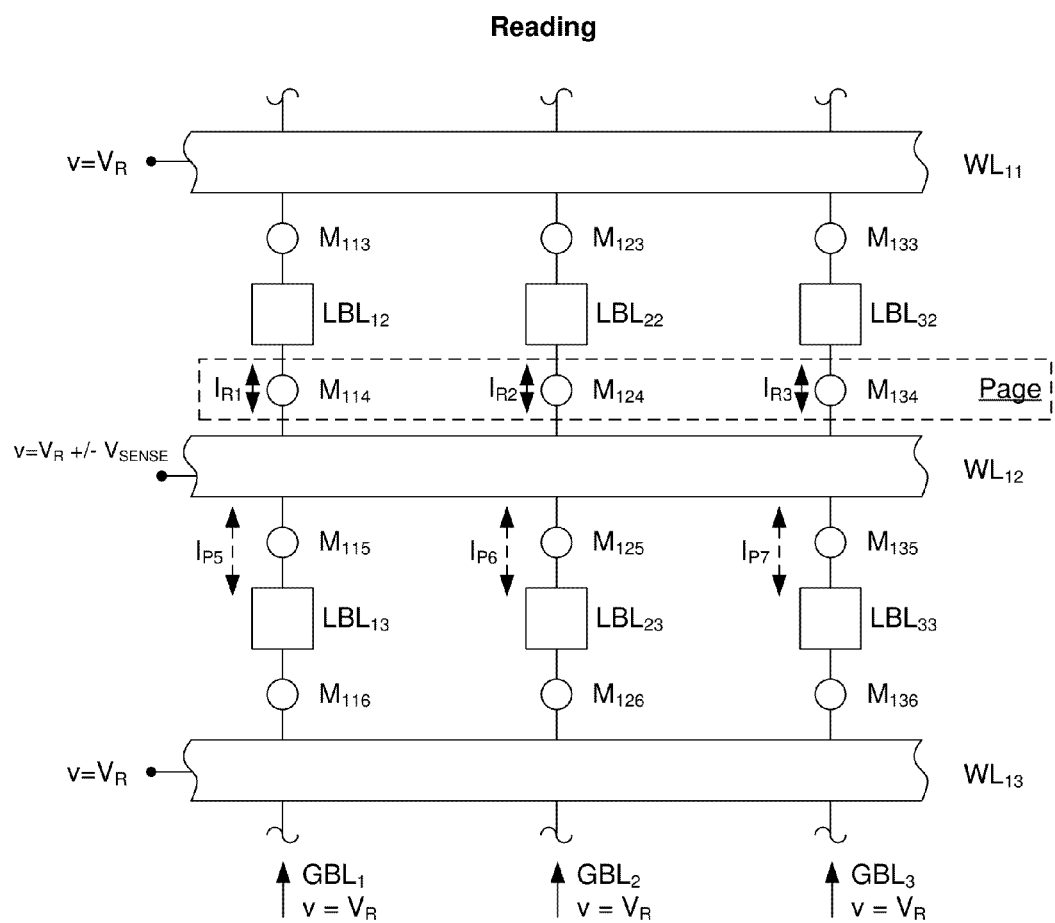
FIG. 5 is an expanded view of a portion of one of the planes of FIG. 3, annotated to show effects of reading data therefrom.

With reference primarily to FIG. 5, the parallel reading of the states of a page of memory elements, such as the memory elements $M_{114}$, $M_{124}$ and $M_{134}$, is described. The steps of an example reading process are as follows:

1. Set all the global bit lines GBLs and all the word lines WL to a voltage $V_R$. The voltage $V_R$ is simply a convenient reference voltage and can be any number of values but will typically be between 0 and 1 volt. In general, for operating modes where repeated reads occur, it is convenient to set all word lines in the array to $V_R$ in order to reduce parasitic read currents, even though this requires charging all the word lines. However, as an alternative, it is only necessary to raise the selected word line ($WL_{12}$ in FIG. 5), the word line in each of the other planes that is in the same position as the selected word line and the immediately adjacent word lines in all planes to $V_R$.

2. Turn on one row of select devices by placing a voltage on the control line adjacent to the selected word line in order to define the page to be read. In the example of FIGS. 1 and 5, a voltage is applied to the row select line $SG_2$ in order to turn on the select devices $Q_{12}$, $Q_{22}$ and $Q_{32}$. This connects one row of local bit lines $LBL_{12}$, $LBL_{22}$ and $LBL_{32}$ to their respective global bit lines $GBL_1$, $GBL_2$ and $GBL_3$. These local bit lines are then connected to individual sense amplifiers (SA) that are present in the circuits 21 of FIG.

2. and assume the potential $V_R$ of the global bit lines to which they are connected. All other local bit lines LBLs are allowed to float.

3. Set the selected word line ($WL_{12}$) to a voltage of $V_R \pm V$sense. The sign of Vsense is chosen based on the sense amplifier and has a magnitude of about 0.5 volt. The voltages on all other word lines remain the same.

4. Sense current flowing into ($V_R$+Vsense) or out of ($V_R$−Vsense) each sense amplifier for time T. These are the currents $IR_1$, $IR_2$ and $IR_3$ shown to be flowing through the addressed memory elements of the example of FIG. 5, which are proportional to the programmed states of the respective memory elements $M_{114}$, $M_{124}$ and $M_{134}$. The states of the memory elements $M_{114}$, $M_{124}$ and $M_{134}$ are then given by binary outputs of the sense amplifiers within the circuits 21 that are connected to the respective global bit lines $GBL_1$, $GBL_2$ and $GBL_3$. These sense amplifier outputs are then sent over the lines 23 (FIG. 2) to the controller 25, which then provides the read data to the host 31.

5. Turn off the select devices ($Q_{12}$, $Q_{22}$ and $Q_{32}$) by removing the voltage from the row select line ($SG_2$), in order to disconnect the local bit lines from the global bit lines, and return the selected word line ($WL_{12}$) to the voltage $V_R$.

Parasitic currents during such a read operation have two undesirable effects. As with programming, parasitic currents place increased demands on the memory system power supply. In addition, it is possible for parasitic currents to exist that are erroneously included in the currents though the addressed memory elements that are being read. This can therefore lead to erroneous read results if such parasitic currents are large enough.

As in the programming case, all of the local bit lines except the selected row ($LBL_{12}$, $LBL_{22}$ and $LBL_{32}$ in the example of FIG. 5) are floating. But the potential of the floating local bit lines may be driven to $V_R$ by any memory element that is in its programmed (low resistance) state and connected between a floating local bit line and a word line at $V_R$, in any plane. A parasitic current comparable to $I_{P1}$ in the programming case (FIG. 4) is not present during data read because both the selected local bit lines and the adjacent non-selected word lines are both at $V_R$. Parasitic currents may flow, however, through low resistance memory elements connected between floating local bit lines and the selected word line. These are comparable to the currents $I_{P2}$, $I_{P3}$, and $I_{P4}$ during programming (FIG. 4), indicated as $I_{P5}$, $I_{P6}$ and $I_{P7}$ in FIG. 5. Each of these currents can be equal in magnitude to the maximum read current through an addressed memory element. However, these parasitic currents are flowing from the word lines at the voltage $V_R$ to the selected word line at a voltage $V_R \pm V$sense without flowing through the sense amplifiers. These parasitic currents will not flow through the selected local bit lines ($LBL_{12}$, $LBL_{22}$ and $LBL_{32}$ in FIG. 5) to which the sense amplifiers are connected. Although they contribute to power dissipation, these parasitic currents do not therefore introduce a sensing error.

Although the neighboring word lines should be at $V_R$ to minimize parasitic currents, as in the programming case it may be desirable to weakly drive these word lines or even allow them to float. In one variation, the selected word line and the neighboring word lines can be pre-charged to $V_R$ and then allowed to float. When the sense amplifier is energized, it may charge them to $V_R$ so that the potential on these lines is accurately set by the reference voltage from the sense amplifier (as opposed to the reference voltage from the word line driver). This can occur before the selected word line is changed to $V_R \pm V$sense but the sense amplifier current is not measured until this charging transient is completed.

Reference cells may also be included within the memory array 10 to facilitate any or all of the common data operations (erase, program, or read). A reference cell is a cell that is structurally as nearly identical to a data cell as possible in which the resistance is set to a particular value. They are useful to cancel or track resistance drift of data cells associated with temperature, process non-uniformities, repeated programming, time or other cell properties that may vary during operation of the memory. Typically they are set to have a resistance above the highest acceptable low resistance value of a memory element in one data state (such as the ON resistance) and below the lowest acceptable high resistance value of a memory element in another data state (such as the OFF resistance). Reference cells may be "global" to a plane or the entire array, or may be contained within each block or page.

In one embodiment, multiple reference cells may be contained within each page. The number of such cells may be only a few (less than 10), or may be up to a several percent of the total number of cells within each page. In this case, the reference cells are typically reset and written in a separate operation independent of the data within the page. For example, they may be set one time in the factory, or they may be set once or multiple times during operation of the memory array. During a reset operation described above, all of the global bit lines are set low, but this can be modified to only set the global bit lines associated with the memory elements being reset to a low value while the global bit lines associated with the reference cells are set to an intermediate value, thus inhibiting them from being reset. Alternately, to reset reference cells within a given block, the global bit lines associated with the reference cells are set to a low value while the global bit lines associated with the data cells are set to an intermediate value. During programming, this process is reversed and the global bit lines associated with the reference cells are raised to a high value to set the reference cells to a desired ON resistance while the memory elements remain in the reset state. Typically the programming voltages or times will be changed to program reference cells to a higher ON resistance than when programming memory elements.

If, for example, the number of reference cells in each page is chosen to be 1% of the number of data storage memory elements, then they may be physically arranged along each word line such that each reference cell is separated from its neighbor by 100 data cells, and the sense amplifier associated with reading the reference cell can share its reference information with the intervening sense amplifiers reading data. Reference cells can be used during programming to ensure the data is programmed with sufficient margin. Further information regarding the use of reference cells within a page can be found in U.S. Pat. Nos. 6,222,762, 6,538,922, 6,678,192 and 7,237,074.

In a particular embodiment, reference cells may be used to approximately cancel parasitic currents in the array. In this case the value of the resistance of the reference cell(s) is set to that of the reset state rather than a value between the reset state and a data state as described earlier. The current in each reference cell can be measured by its associated sense amplifier and this current subtracted from neighboring data cells. In this case, the reference cell is approximating the parasitic currents flowing in a region of the memory array that tracks and is similar to the parasitic currents flowing in that region of the array during a data operation. This correction can be applied in a two step operation (measure the parasitic current in the reference cells and subsequently subtract its value from that obtained during a data operation) or simultaneously with the data operation. One way in which simultaneous operation is possible is to use the reference cell to adjust the timing or reference levels of the adjacent data sense amplifiers. An example of this is shown in U.S. Pat. No. 7,324,393.

In conventional two-dimensional arrays of variable resistance memory elements, a diode is usually included in series with the memory element between the crossing bit and word lines. The primary purpose of the diodes is to reduce the number and magnitudes of parasitic currents during resetting (erasing), programming and reading the memory elements. A significant advantage of the three-dimensional array herein is that resulting parasitic currents are fewer and therefore have a reduced negative effect on operation of the array than in other types of arrays.

Diodes may also be connected in series with the individual memory elements of the three-dimensional array, as currently done in other arrays of variable resistive memory elements, in order to reduce further the number of parasitic currents but there are disadvantages in doing so. Primarily, the manufacturing process becomes more complicated. Added masks and added manufacturing steps are then necessary. Also, since formation of the silicon p–n diodes often requires at least one high temperature step, the word lines and local bit lines cannot then be made of metal having a low melting point, such as aluminum that is commonly used in integrated circuit manufacturing, because it may melt during the subsequent high temperature step. Use of a metal, or composite material including a metal, is preferred because of its higher conductivity than the conductively doped polysilicon material that is typically used for bit and word lines because of being exposed to such high temperatures. An example of an array of resistive switching memory elements having a diode formed as part of the individual memory elements is given in patent application publication no. US 2009/0001344 A1.

Because of the reduced number of parasitic currents in the three-dimensional array herein, the total magnitude of parasitic currents can be managed without the use of such diodes. In addition to the simpler manufacturing processes, the absence of the diodes allows bi-polar operation; that is, an operation in which the voltage polarity to switch the memory element from its first state to its second memory state is opposite of the voltage polarity to switch the memory element from its second to its first memory state. The advantage of the bi-polar operation over a unipolar operation (same polarity voltage is used to switch the memory element from its first to second memory state as from its second to first memory state) is the reduction of power to switch the memory element and an improvement in the reliability of the memory element. These advantages of the bi-polar operation are seen in memory elements in which formation and destruction of a conductive filament is the physical mechanism for switching, as in the memory elements made from metal oxides and solid electrolyte materials. For these reasons, the embodiments discussed below utilize memory elements that include resistance switching material and do not include a diode or other separate steering device. The use of memory elements that have a non-linear current vs voltage relationship are also envisioned. For example as the voltage across a HfOx memory element is reduced from the programming voltage to one half the programming voltage the current is reduced by a factor of 5 or even more. In such an embodiment the total magnitude of parasitic currents can be managed without the use of diodes in the array.

The level of parasitic currents increases with the number of planes and with the number of memory elements connected along the individual word lines within each plane. The increase in parasitic currents increases only slightly with additional planes because the selected word line is on only one plane such as WL12 in FIG. 4. Parasitic currents Ip1, Ip2, Ip3, and Ip4 are all on the plane that contains WL12. Leakage currents on other planes are less significant because the floating lines tend to minimize currents on elements not directly connected to the selected word line. Also since the number of unselected word lines on each plane does not significantly affect the amount of parasitic current, the planes may individually include a large number of word lines. The parasitic currents resulting from a large number of memory elements connected along the length of individual word lines can further be managed by segmenting the word lines into sections of fewer numbers of memory elements. Erasing, programming and reading operations are then performed on the memory elements connected along one segment of each word line instead of the total number of memory elements connected along the entire length of the word line.

The re-programmable non-volatile memory array being described herein has many advantages. The quantity of digital data that may be stored per unit of semiconductor substrate area is high. It may be manufactured with a lower cost per stored bit of data. Only a few masks are necessary for the entire stack of planes, rather than requiring a separate set of masks for each plane. The number of local bit line connections with the substrate is significantly reduced over other multi-plane structures that do not use the vertical local bit lines. The architecture eliminates the need for each memory element to have a diode in series with the resistive memory element, thereby further simplifying the manufacturing process and enabling the use of metal conductive lines. Also, the voltages necessary to operate the array are much lower than those used in current commercial flash memories.

Since at least one-half of each current path is vertical, the voltage drops present in large cross-point arrays are significantly reduced. The reduced length of the current path due to the shorter vertical component means that there are approximately one-half the number memory elements on each current path and thus the leakage currents are reduced as is the number of unselected memory elements disturbed during a data programming or read operation. For example, if there are N cells associated with a word line and N cells associated with a bit line of equal length in a conventional array, there are 2N cells associated or "touched" with every data operation. In the vertical local bit line architecture described herein, there are n cells associated with the bit line (n is the number of planes and is typically a small number such as 4 to 16), or N+n cells are associated with a data operation. For a large N this means that the number of cells affected by a data operation is approximately one-half as many as in a conventional three-dimensional array.

The material used for the non-volatile memory elements $M_{zxy}$ in the array of FIG. 1 can be a chalcogenide, a metal oxide (MeOx), CMO, or any one of a number of materials that exhibit a stable, reversible shift in resistance in response to an external voltage applied to or current passed through the material.

Metal oxides (MeOx) are characterized by being insulating when initially deposited. One suitable metal oxide is a titanium oxide ($TiO_x$) in which near-stoichiometric $TiO_2$ bulk material is altered in an annealing process to create an oxygen deficient layer (or a layer with oxygen vacancies) in proximity of the bottom electrode. The top platinum electrode for memory storage element comprising $TiO_x$, with its high work function, creates a high potential $Pt/TiO_2$ barrier for electrons. As a result, at moderate voltages (below one volt), a very low current will flow through the structure. The bottom $Pt/TiO_{2-x}$ barrier is lowered by the presence of the oxygen vacancies ($O^+_2$) and behaves as a low resistance contact (ohmic contact). (The oxygen vacancies in $TiO_2$ are known to act as n-type dopant, transforming the insulating oxide in an electrically conductive doped semiconductor.) The resulting composite structure is in a non-conductive (high resistance) state.

But when a large negative voltage (such as 1.5 volt) is applied across the structure, the oxygen vacancies drift toward the top electrode and, as a result, the potential barrier $Pt/TiO_2$ is reduced and a relatively high current can flow through the structure. The device is then in its low resistance (conductive) state. Experiments reported by others have shown that conduction is occurring in filament-like regions of the $TiO_2$, perhaps along grain boundaries.

The conductive path is broken by applying a large positive voltage across the structure. Under this positive bias, the oxygen vacancies move away from the proximity of the top $Pt/TiO_2$ barrier, and "break" the filament. The device returns to its high resistance state. Both of the conductive and non-conductive states are non-volatile. Sensing the conduction of the memory storage element by applying a voltage around 0.5 volts can easily determine the state of the memory element.

While this specific conduction mechanism may not apply to all metal oxides, as a group, they have a similar behavior: transition from a low conductive state to a high conductive occurs state when appropriate voltages are applied, and the two states are non-volatile. Examples of other materials that can be used for the non-volatile memory elements $M_{zxy}$ in the array of FIG. 1 include HfOx, ZrOx, WOx, NiOx, CoOx, CoalOx, MnOx, $ZnMn_2O_4$, ZnOx, TaOx, NbOx, HfSiOx, HfAlOx. Suitable top electrodes include metals with a high work function (typically >4.5 eV) capable to getter oxygen in contact with the metal oxide to create oxygen vacancies at the contact. Some examples are TaCN, TiCN, Ru, RuO, Pt, Ti rich TiOx, TiAlN, TaAlN, TiSiN, TaSiN, $IrO_2$ and doped polysilicon. Suitable materials for the bottom electrode are any conducting oxygen rich material such as Ti(O)N, Ta(O)N, TiN and TaN. The thicknesses of the electrodes are typically 1 nm or greater. Thicknesses of the metal oxide are generally in the range of 2 nm to 20 nm.

One example non-volatile memory element uses Hafnium Oxide (e.g., $HfO_2$) as a reversible resistance-switching material, and positions the reversible resistance-switching material between two electrodes. A first electrode is positioned between reversible resistance-switching material and a first conductor (e.g. bit line or word line). In one embodiment, the first electrode is made of platinum. The second electrode is positioned between reversible resistance-switching material a second conductor (e.g, bit line or word line). In one embodiment, the second electrode is made of Titanium Nitride, and serves as a barrier layer. In another embodiment, the second electrode is n+ doped polysilicon and the first electrode is Titanium Nitride. Other materials can also be used. The technologies described below are not restricted to any one set of materials for forming the non-volatile memory elements.

In another embodiment, the memory storage element will include Hafnium Oxide (or different metal oxide or different material) as the reversible resistance-switching material, without any electrodes being positioned between the reversible resistance-switching material and the conductors (e.g., bit lines and/or word lines).

Another class of materials suitable for the memory storage elements is solid electrolytes but since they are electrically conductive when deposited, individual memory elements need to be formed and isolated from one another. Solid electrolytes are somewhat similar to the metal oxides, and the conduction mechanism is assumed to be the formation of a metallic filament between the top and bottom electrode. In this structure the filament is formed by dissolving ions from one electrode (the oxidizable electrode) into the body of the cell (the solid electrolyte). In one example, the solid electrolyte contains silver ions or copper ions, and the oxidizable electrode is preferably a metal intercalated in a transition metal sulfide or selenide material such as $A_x(MB2)_{1-x}$, where A is Ag or Cu, B is S or Se, and M is a transition metal such as Ta, V, or Ti, and x ranges from about 0.1 to about 0.7. Such a composition minimizes oxidizing unwanted material into the solid electrolyte. One example of such a composition is $Ag_x(TaS2)_{1-x}$. Alternate composition materials include α-AgI. The other electrode (the indifferent or neutral electrode) should be a good electrical conductor while remaining insoluble in the solid electrolyte material. Examples include metals and compounds such as W, Ni, Mo, Pt, metal silicides, and the like.

Examples of solid electrolytes materials are: TaO, GeSe or GeS. Other systems suitable for use as solid electrolyte cells are: Cu/TaO/W, Ag/GeSe/W, Cu/GeSe/W, Cu/GeS/W, and Ag/GeS/W, where the first material is the oxidizable electrode, the middle material is the solid electrolyte, and the third material is the indifferent (neutral) electrode. Typical thicknesses of the solid electrolyte are between 30 nm and 100 nm.

In recent years, carbon has been extensively studied as a non-volatile memory material. As a non-volatile memory element, carbon is usually used in two forms, conductive (or grapheme like-carbon) and insulating (or amorphous carbon). The difference in the two types of carbon material is the content of the carbon chemical bonds, so called $sp^2$ and $sp^3$ hybridizations. In the $sp^3$ configuration, the carbon valence electrons are kept in strong covalent bonds and as a result the $sp^3$ hybridization is non-conductive. Carbon films in which the $sp^3$ configuration dominates, are commonly referred to as tetrahedral-amorphous carbon, or diamond like. In the $sp^2$ configuration, not all the carbon valence electrons are kept in covalent bonds. The weak tight electrons (phi bonds) contribute to the electrical conduction making the mostly $sp^2$ configuration a conductive carbon material. The operation of the carbon resistive switching nonvolatile memories is based on the fact that it is possible to transform the $sp^3$ configuration to the $sp^2$ configuration by applying appropriate current (or voltage) pulses to the carbon structure. For example, when a very short (1-5 ns) high amplitude voltage pulse is applied across the material, the conductance is greatly reduced as the material $sp^2$ changes into an $sp^3$ form ("reset" state). It has been theorized that the high local temperatures generated by this pulse causes disorder in the material and if the pulse is very short, the carbon "quenches" in an amorphous state ($sp^3$ hybridization). On the other hand, when in the reset state, applying a lower voltage for a longer time (~300 nsec) causes part of the material to change into the $sp^2$ form ("set" state). The carbon resistance switching non-volatile memory elements have a capacitor like configuration where the top and bottom electrodes are made of high temperature melting point metals like W, Pd, Pt and TaN.

There has been significant attention recently to the application of carbon nanotubes (CNTs) as a non-volatile memory material. A (single walled) carbon nanotube is a hollow cylinder of carbon, typically a rolled and self-closing sheet one carbon atom thick, with a typical diameter of about 1-2 nm and a length hundreds of times greater. Such nanotubes can demonstrate very high conductivity, and various proposals have been made regarding compatibility with integrated circuit fabrication. It has been proposed to encapsulate "short" CNT's within an inert binder matrix to form a fabric of CNT's. These can be deposited on a silicon wafer using a spin-on or spray coating, and as applied the CNT's have a random orientation with respect to each other. When an electric field is applied across this fabric, the CNT's tend to flex or align themselves such that the conductivity of the fabric is changed. As in the other carbon based resistive switching non-volatile memories, the CNT based memories have capacitor-like configurations with top and bottom electrodes made of high melting point metals such as those mentioned above.

Yet another class of materials suitable for the memory storage elements is phase-change materials. A preferred group of phase-change materials includes chalcogenide glasses, often of a composition $Ge_xSb_yTe_z$, where preferably x=2, y=2 and z=5. GeSb has also been found to be useful. Other materials include AgInSbTe, GeTe, GaSb, BaSbTe, InSbTe and various other combinations of these basic elements. Thicknesses are generally in the range of 1 nm to 500 nm. The generally accepted explanation for the switching mechanism is that when a high energy pulse is applied for a very short time to cause a region of the material to melt, the material "quenches" in an amorphous state, which is a low conductive state. When a lower energy pulse is applied for a longer time such that the temperature remains above the crystallization temperature but below the melting temperature, the material crystallizes to form poly-crystal phases of high conductivity. These devices are often fabricated using sub-lithographic pillars, integrated with heater electrodes. Often the localized region undergoing the phase change may be designed to correspond to a transition over a step edge, or a region where the material crosses over a slot etched in a low thermal conductivity material. The contacting electrodes may be any high melting metal such as TiN, W, WN and TaN in thicknesses from 1 nm to 500 nm.

It will be noted that the memory materials in most of the foregoing examples utilize electrodes on either side thereof whose compositions are specifically selected. In embodiments of the three-dimensional memory array herein where the word lines (WL) and/or local bit lines (LBL) also form these electrodes by direct contact with the memory material, those lines are preferably made of the conductive materials described above. In embodiments using additional conductive segments for at least one of the two memory element electrodes, those segments are therefore made of the materials described above for the memory element electrodes.

Steering elements are commonly incorporated into controllable resistance types of memory storage elements. Steering elements can be a transistor or a diode. Although an advantage of the three-dimensional architecture described herein is that such steering elements are not necessary, there may be specific configurations where it is desirable to include steering elements. The diode can be a p–n junction (not necessarily of silicon), a metal/insulator/insulator/metal (MIIM), or a Schottky type metal/semiconductor contact but can alternately be a solid electrolyte element. A characteristic of this type of diode is that for correct operation in a memory array, it is necessary to be switched "on" and "off" during each address operation. Until the memory element is addressed, the diode is in the high resistance state ("off" state) and "shields" the resistive memory element from disturb voltages. To access a resistive memory element, three different operations are needed: a) convert the diode from high resistance to low resistance, b) program, read, or reset (erase) the memory element by application of appropriate voltages across or currents through the diode, and c) reset (erase) the diode. In some embodiments one or more of these operations can be combined into the same step. Resetting the diode may be accomplished by applying a reverse voltage to the memory element including a diode, which causes the diode filament to collapse and the diode to return to the high resistance state.

For simplicity the above description has consider the simplest case of storing one data value within each cell: each cell is either reset or set and holds one bit of data. However, the techniques of the present application are not limited to this simple case. By using various values of ON resistance and designing the sense amplifiers to be able to discriminate between several of such values, each memory element can hold multiple-bits of data in a multiple-level cell (MLC). The principles of such operation are described in U.S. Pat. No. 5,172,338 referenced earlier. Examples of MLC technology applied to three dimensional arrays of memory elements include an article entitled "Multi-bit Memory Using Programmable Metallization Cell Technology" by Kozicki et al., Proceedings of the International Conference on Electronic Devices and Memory, Grenoble, France, Jun. 12-17, 2005, pp. 48-53 and "Time Discrete Voltage Sensing and Iterative Programming Control for a 4F2 Multilevel CBRAM" by Schrogmeier et al. (2007 Symposium on VLSI Circuits).

Figure 6:
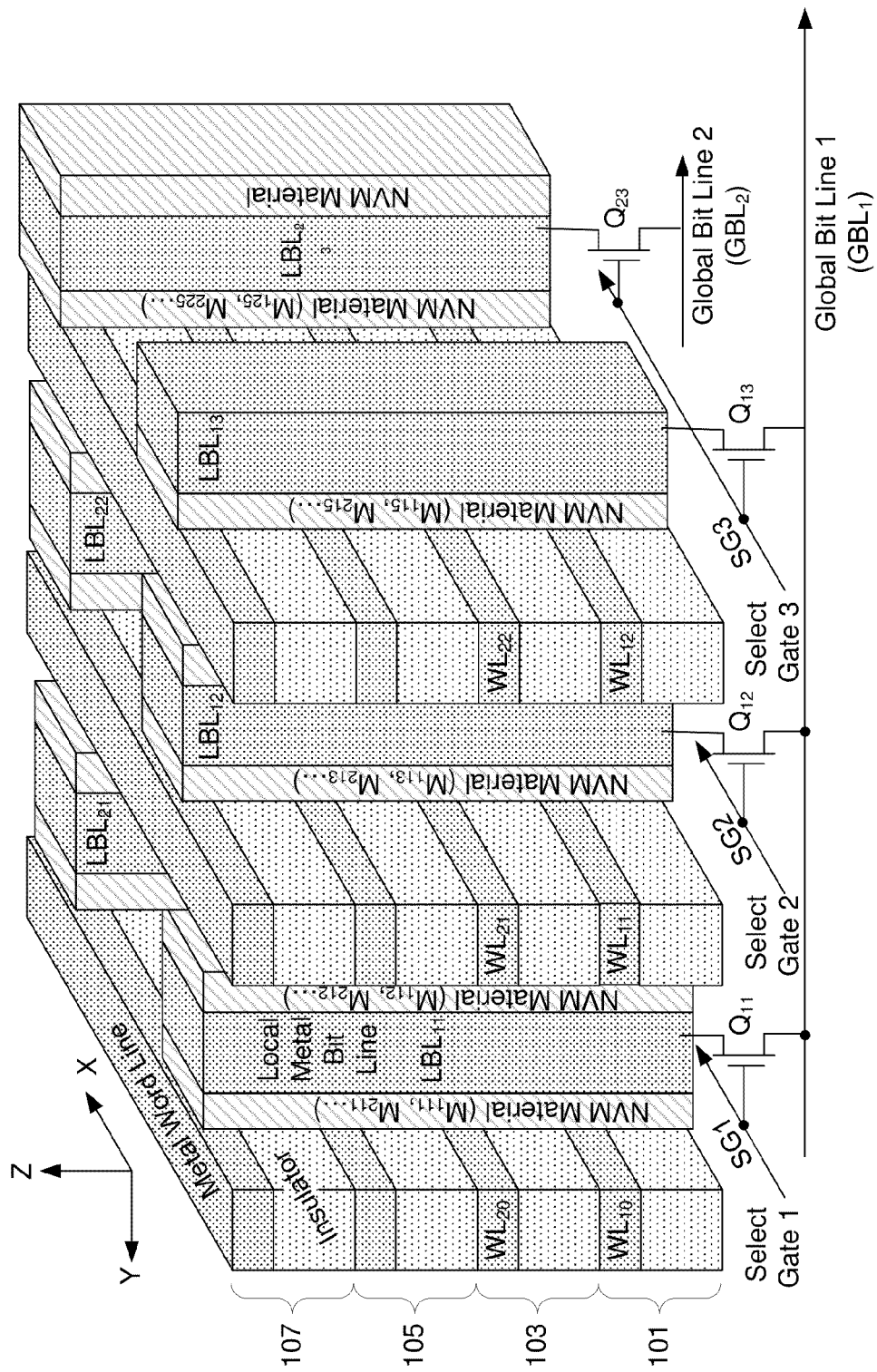
FIG. 6 is an isometric view of a portion of the three-dimensional array shown in FIG. 1 according to a first specific example of an implementation thereof.

One example semiconductor structure for implementing the three-dimensional memory element array of FIG. 1 is illustrated in FIG. 6, which is configured for use of non-volatile memory element (NVM) material that is non-conductive when first deposited. A metal oxide of the type discussed above has this characteristic. Since the material is initially non-conductive, there is no necessity to isolate the memory elements at the cross-points of the word and bit lines from each other. Several memory elements may be implemented by a single continuous layer of material, which in the case of FIG. 6 are strips of NVM material oriented vertically along opposite sides of the vertical bit lines in the y-direction and extending upwards through all the planes. A significant advantage of the structure of FIG. 6 is that all word lines and strips of insulation under them in a group of planes may be defined simultaneously by use of a single mask, thus greatly simplifying the manufacturing process.

Referring to FIG. 6, a small part of four planes 101, 103, 105 and 107 of the three-dimensional array are shown. Elements of the FIG. 6 array that correspond to those of the equivalent circuit of FIG. 1 are identified by the same reference numbers. It will be noted that FIG. 6 shows the two planes 1 and 2 of FIG. 1 plus two additional planes on top of them. All of the planes have the same horizontal pattern of conductor, dielectric and NVM material. In each plane, metal word lines (WL) are elongated in the x-direction and spaced apart in the y-direction. Each plane includes a layer of insulating dielectric that isolates its word lines from the word lines of the plane below it or, in the case of plane 101, of the substrate circuit components below it. Extending through each plane is a collection of metal local bit line (LBL) "pillars" elongated in the vertical z-direction and forming a regular array in the x-y direction.

Each bit line pillar is connected to one of a set of global bit lines (GBL) in the silicon substrate running in the y-direction at the same pitch as the pillar spacing through the select devices ($Q_{xy}$) formed in the substrate whose gates are driven by the row select lines (SG) elongated in the x-direction, which are also formed in the substrate. The select devices $Q_{xy}$ may be conventional CMOS transistors (or vertical MOSFET thin film transistors, or Junction FET, or npn transistors) and fabricated using the same process as used to form the other conventional circuitry. In the case of using npn transistors instead of MOS transistors, the row select line (SG) lines are replaced with the base contact electrode lines elongated in the x-direction. Also fabricated in the substrate but not shown in FIG. 6 are sense amplifiers, input-output (I/O) circuitry, control circuitry, and any other necessary peripheral circuitry. There is one row select line (SG) for each row of local bit line pillars in the x-direction and one select device (Q) for each individual local bit line (LBL).

Each vertical strip of NVM material is sandwiched between the vertical local bit lines (LBL) and a plurality of word lines (WL) vertically stacked in all the planes. Preferably the NVM material is present between the local bit lines (LBL) in the x-direction. A memory storage element (M) is located at each intersection of a word line (WL) and a local bit line (LBL). In the case of a metal oxide described above for the memory storage element material, a small region of the NVM material between an intersecting local bit line (LBL) and word line (WL) is controllably alternated between conductive (set) and non-conductive (reset) states by appropriate voltages applied to the intersecting lines.

In one embodiment, the NVM material includes Hafnium Oxide, the word lines comprise TiN, and the bit lines comprise N+ silicon.

There may also be a parasitic NVM element formed between the LBL and the dielectric between planes. By choosing the thickness of the dielectric strips to be large compared to the thickness of the NVM material layer (that is, the spacing between the local bit lines and the word lines), a field caused by differing voltages between word lines in the same vertical word line stack can be made small enough so that the parasitic element never conducts a significant amount of current. Similarly, in other embodiments, the non-conducting NVM material may be left in place between adjacent local bit lines if the operating voltages between the adjacent LBLs remain below the programming threshold.

An outline of a process for fabricating the structure of FIG. 6 is as follows:

1. The support circuitry, including the select devices Q, global bit lines GBL, row select lines SG and other circuits peripheral to the array, is formed in the silicon substrate in a conventional fashion and the top surface of this circuitry is planarized, such as by etching with use of a layer of etch stop material placed over the circuitry.
2. Alternating layers of dielectric (insulator) and metal are formed as sheets on top of each other and over at least the area of the substrate in which the select devices Q are formed. In the example of FIG. 6, four such sheets are formed.
3. These sheets are then etched (isolated) by using a mask formed over the top of them that has slits elongated in the x-direction and spaced apart in the y-direction. All of the material is removed down to the etch stop in order to form the trenches shown in FIG. 6 in which the local bit line (LBL) pillars and NVM material is later formed. Contact holes are also etched through the etch stop material layer at the bottom of the trenches to allow access to the drains of the select devices Q at the positions of the subsequently formed pillars. The formation of the trenches also defines the width in the y-direction of the word lines (WL).
4. NVM material is deposited in thin layers along the sidewalls of these trenches and across the structure above the trenches. This leaves the NVM material along the opposing sidewalls of each of the trenches and in contact with the word line (WL) surfaces that are exposed into the trenches.
5. Doped poly silicon (or suitable metallic electrode material) is then deposited in these trenches in order to make contact with the NVM material. The deposited material is patterned using a mask with slits in the y-direction. Removal of the deposited material by etching through this mask leaves the local bit line (LBL) pillars. The NVM material in the x-direction may also be removed between pillars. The space between pillars in the x-direction is then filled with a dielectric material and planarized back to the top of the structure.

A significant advantage of the configuration of FIG. 6 is that only one etching operation through a single mask is required to form the trenches through all the layers of material of the planes at one time. However, process limitations may limit the number of planes that can be etched together in this manner. If the total thickness of all the layers is too great, the trench may need to be formed in sequential steps. A first number of layers are etched and, after a second number of layers have been formed on top of the first number of trenched layers, the top layers are subjected to a second etching step to form trenches in them that are aligned with the trenches in the bottom layers. This sequence may be repeated even more times for an implementation having a very large number of layers.

To enable the memory to be denser (e.g., more memory elements per area), the size of the memory elements can be made smaller and the memory elements can be arranged closer to each other than in the past. To enable the memory elements to be closer to each other, one embodiment uses a vertically oriented select device (e.g., three terminal switch and/or select transistor) for connecting the individual local bit line pillars to the respective global bit lines. For example, the select devices $Q_{11}$, $Q_{12}$, ..., $Q_{21}$, $Q_{22}$, ... of FIG. 1 can be implemented as vertically oriented select devices. In one embodiment, each vertically oriented select device is a pillar select device that is formed as a vertical structure, switching between a local bit line pillar and a global bit line. The pillar select devices, unlike previous embodiments where they are formed within a CMOS layer, are in the present embodiments formed in a separate layer (pillar select layer) above the CMOS layer/substrate, along the z-direction between the array of global bit lines and the array of local bit lines. The CMOS layer is the substrate where the support circuitry is implemented, including the row select circuit and word line drivers. The use of vertically oriented select devices above, but not in, the substrate allows the memory elements to be arranged in a more compact fashion, thereby increasing density. Additionally, positioning the vertically oriented select devices above the substrate allows for other devices (e.g., the word line drivers) to be positioned in the substrate under the memory array rather than outside of the array, which allows the integrated circuit to be smaller.

For example, a pillar shaped Thin Film Transistor (TFT) FET or JFET can be can be used as the select device. In one example implementation, a control node of the select transistor has a collar shaped hole, and the gate and channel region are formed in the hole with the source/drain regions formed above/below the channel region. Another alternative is to define the gates as a rail etch and have the channel deposited in a trench between the gates and singulated by an etch with crossing lines mask (rather than holes).

FIG. 7 illustrates schematically the three dimensional memory ("3D memory") comprising of a memory layer on top of a pillar select layer. The 3D memory 10 is formed on top of a CMOS substrate (not shown explicitly) where structures in the CMOS are referred to as being in the FEOL ("Front End of Lines"). The vertically oriented select devices switching individual vertical bit lines (that are above and not in the substrate) to individual global bit lines are now formed on top of the FEOL layer in the BEOL ("Back End of Lines"). Thus, the BEOL comprises of the pillar select layer with the memory layer on top of it. The vertically oriented select devices (such as $Q_{11}, Q_{12}, \ldots, Q_{21}, Q_{22}, \ldots$, etc) are formed in the pillar select layer as vertically oriented select devices. The pillar select layer is formed above (and not in) the substrate. The memory layer is similar to that described above, comprising of multiple layers of word lines and memory elements. For simplicity, FIG. 7 shows only one layer of word lines, such as $WL_{10}, W_{11}, \ldots$, etc. without showing the memory elements that exist between each crossing of a word line and a bit line.

Figure 8B:
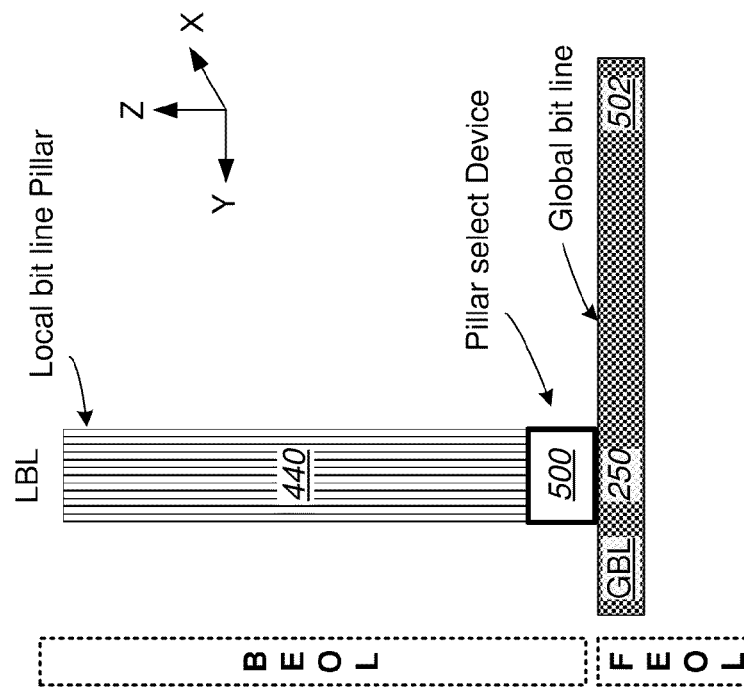
FIG. 8B is a plan view that depicts a vertical bit line, a vertically oriented select device and a global bit line.
Figure 8A:
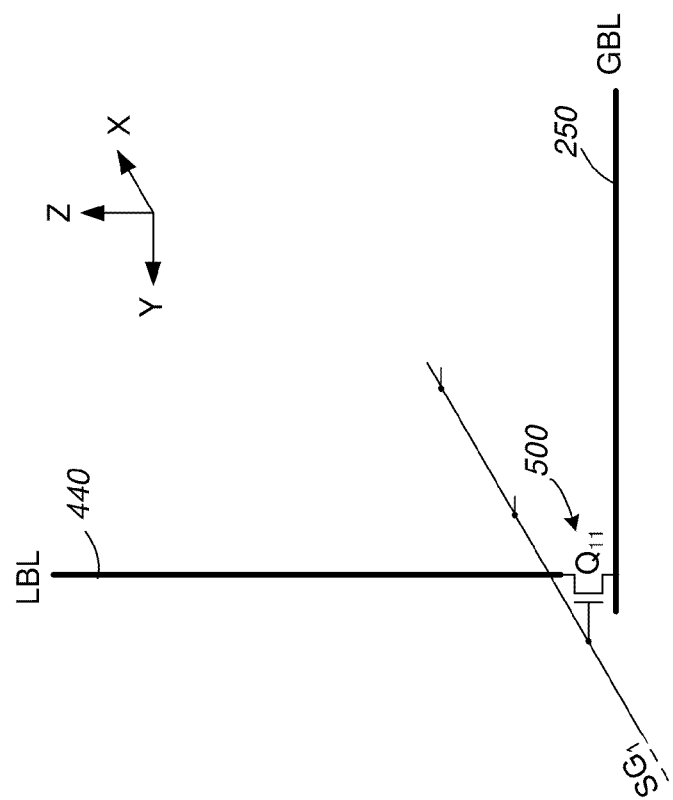
FIG. 8A is a schematic that depicts a vertical bit line, a vertically oriented select device and a global bit line.

FIG. 8A illustrates a schematic circuit diagram of a given vertically oriented select device switching a local bit line to a global bit line. In the example, the local bit line LBL 440 is switchable to the global bit line GBL 250 by a vertically oriented select transistor 500 such as $Q_{11}$. The gate of the select transistor $Q_{11}$ is controllable by a signal exerted on a row select line $SG_1$.

FIG. 8B illustrates the structure of the vertically oriented select device in relation to the local bit line and the global bit line. The global bit line such as GBL 250 is formed below the vertically oriented select device, in the FEOL as part of the metal layer-1 or metal layer-2 502. The vertically oriented select device in the form of the vertical active TFT transistor 500 (e.g., vertically oriented channel MOS TFT or vertically oriented channel JFET) is formed in the BEOL layer on top of the GBL 250 (and above, but not in, the substrate). The local bit line LBL 440, in the form of a pillar, is formed on top of the vertically oriented select device 500. In this way, the vertically oriented select device 500 can switch the local bit line pillar LBL to the global bit line GBL.

Figure 9:
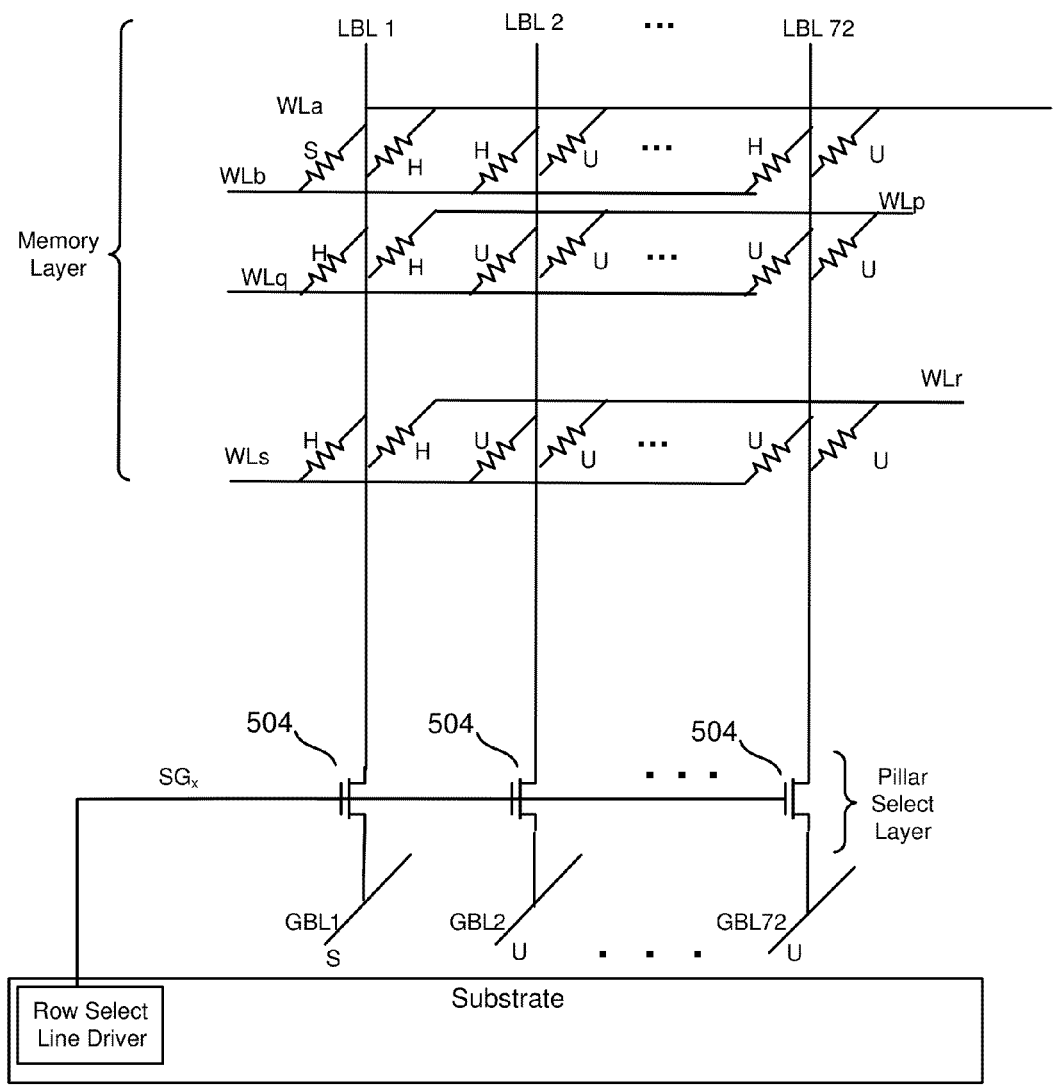
FIG. 9 is a schematic of a portion of the memory system, depicting vertical bit lines above the substrate, vertically oriented select devices above the substrate and row select line drivers in the substrate.

FIG. 9 shows a portion of the memory system, with the memory elements being depicted as resistors (due to their reversible resistance switching properties). FIG. 9 shows the Pillar Select Layer below the Memory Layer and above (and not in) the Substrate. Only a portion of the Memory Layer is illustrated. For example, FIG. 9 shows bit lines LBL1, LBL2, ... LBL72. In this embodiment each of the word lines are connected to 72 memory elements. Each of the memory elements is connected between a word line and a bit line. Therefore, there will be 72 memory elements connected to the same word line and different bit lines (of the 72 bit lines in a row). Each of the bit lines are connected to a respective global bit line by one of the vertically oriented select devices 504 of the Pillar Select Layer. The signal $SG_x$ driving the set of vertically oriented select devices 504 depicted in FIG. 9 is controlled by the Row Select Line Driver. Note that the Row Select Line Driver is implemented in the substrate. The global bit lines (GBL1, GBL2, ... GBL72) are implemented in the metal lines above the substrate. FIG. 9 shows one slice taken along the word line direction such that each of the bit lines depicted in FIG. 9 are connected to different global bit lines via the vertically oriented select devices 504.

In one embodiment, pairs of neighboring word lines (e.g., WLa and WLb, WLp and WLq, WLr and WLs) will be connected to memory elements that are in turn connected to common bit lines. FIG. 9 shows three pairs of word lines (WLa and WLb, WLp and WLq, WLr and WLs), with each of the pair being on a different layer of the memory structure. In one illustrative embodiment, the word lines receive address dependent signals such a that word line WLb is selected for memory operation while word lines WLa, WLp, WLq, WLr and WLs are not selected. Although the enabling signal applied on row select line $SG_x$ causes all of the vertically oriented select devices 504 to connect the respective global bit lines to the respective local bit lines of FIG. 9, only the global bit line GLBL1 includes a data value for programming (as noted by the S). Global bit lines GLBL2 and GLBL72 do not include data for programming (as noted by the U). This can be due to the data pattern being stored as the global bit lines receive data dependent signals. Note that while SGx receive an enable signal, other select lines receive a disable signal to turn off the connected select devices.

Because local bit line LBL 1 and word line WLb are both selected for programming, the memory element between local bit line LBL1 and word line WLb is selected for the memory operation (as noted by the S). Since local bit line LBL1 is the only bit line with program data, the other memory elements connected to WLb will be half selected (as noted by H). By half selected, it is meant that one of the control lines (either the bit line or the word line) is selected but the other control line is not selected. A half selected memory element will not undergo the memory operation. The word line WLa is not selected; therefore, the memory cell between WLa and local bit line LBL1 is half selected, and the other memory elements on WLa are unselected. Since word lines WLp, WLq, WLr and WLs are not selected, their memory elements connected to LBL1 are half selected and the other memory elements connected to those word lines are unselected.

FIG. 10 is a cross-sectional view of a memory structure using the vertically oriented select device discussed above and the memory structure of FIG. 6. As described below, the memory structure of FIG. 10 is a continuous mesh array of memory elements because there are memory elements connected to both sides of the bit lines and memory elements connected to both sides of the word lines. At the bottom of FIG. 10, the CMOS substrate is depicted. Implemented on the top surface of the CMOS structure are various metal lines including ML-0, ML-1, and ML-2. Line 526 of ML-2 serves as a respective global bit line (GBL). The Pillar Select Layer includes two oxide layers 520 with a gate material layer 522 sandwiched there between. The oxide layers 520 can be $SiO_2$. The metal line ML-2 526 serving as a global bit line can be implemented of any suitable material, including Tungsten, or Tungsten on a Titanium Nitride adhesion layer or a sandwich of n+ polysilicon on Tungsten on Titanium Nitride adhesion layer. Gate material 522 can be polysilicon, Titanium Nitride, Tantalum Nitride, Nickel Silicide or any other suitable material. Gate material 522 implements the row select lines $SG_x$ (e.g. $SG_1, SG_2, \ldots$ of FIG. 1), which are labeled in FIG. 10 as row select lines 580, 582, 584, 586, 588 and 590.

The memory layer includes a set of vertical bit lines 530 (comprising N+ polysilicon). Interspersed between the vertical bit lines 530 are alternating oxide layers 534 and word line layers 536. In one embodiment, the word lines are made from TiN. Between the vertical bit lines 530 and the stacks of alternating oxide layers 536 and word line layers 536 are vertically oriented layers of reversible resistance switching material 532. In one embodiment the reversible resistance switching material is made of Hafnium Oxide $HfO_2$. However, other materials (as described above) can also be used. Box 540 depicts one example memory element which includes the reversible resistance switching material 532 sandwiched between a word line 536 and vertical bit line 530. The memory elements are positioned above, and not in, the substrate. Directly below each vertical bit line 530 are the vertically oriented select devices 504, each of which comprises (in one example embodiment) a n+/p−/n+TFT. Each of the vertically oriented select devices 504 have oxide layers 505 on each side. FIG. 10 also shows an n+ polysilicon layer 524. As can be seen, the npn TFT of vertically oriented select devices 504 can be used to connect the global bit line GBL (layer 526) with any of the vertical bit lines 530.

FIG. 10 shows six row select lines ($SG_x$) 580, 582, 584, 586, 588 and 590 in the gate material layer 522, each underneath a stack of multiple word lines. As can be seen, each of the row select lines 580, 582, 584, 586, 588 and 590 is positioned between two vertically oriented select devices 504, above and not in the substrate. Therefore each row select line can serve as the gate signal to either of the two neighboring vertically oriented select devices 504; therefore, the vertically oriented select devices 504 are said to be double gated. Each vertically oriented select device 504 can be controlled by two different row select lines, in this embodiment. One aspect of the vertically oriented select devices incorporated to the base portion of each bit line pillar is that two adjacent vertically oriented select devices share the same gate region. This allows the vertically oriented select devices to be closer together.

Figure 11:
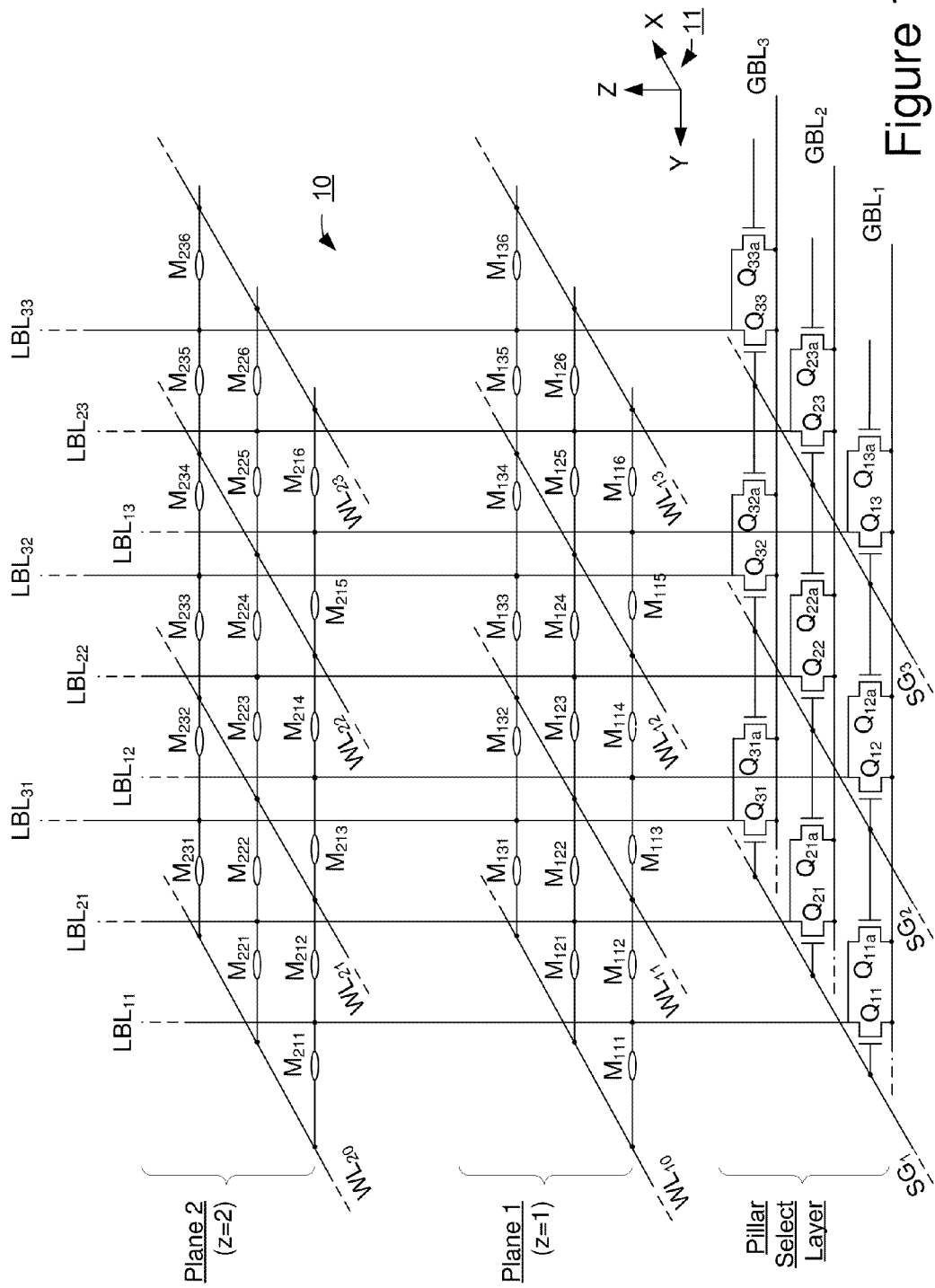
FIG. 11 is a schematic of a portion of the memory system, depicting vertical bit lines and vertically oriented select devices above the substrate.

FIG. 11 is a partial schematic of the memory system of FIG. 10 depicting the above-described double-gated structure for the vertically oriented select devices 504. Planes 1 and 2 of FIG. 11 are the same as in FIG. 1. As can be seen, each local bit line LBL is connectable to a respective global bit line GBL by two row select signals. FIG. 11 shows two transistors connecting to each local bit line. For example, transistor $Q_{11}$ can connect local bit line $LBL_{11}$ to global bit line $GBL_1$ in response to row select line $SG_1$ and transistor $Q_{11a}$ can connect local bit line $LBL_{11}$ to global bit line GBL1 in response to row select line $SG_2$. The same structure is used for the other local bit lines depicted in FIG. 11.

Figure 12:
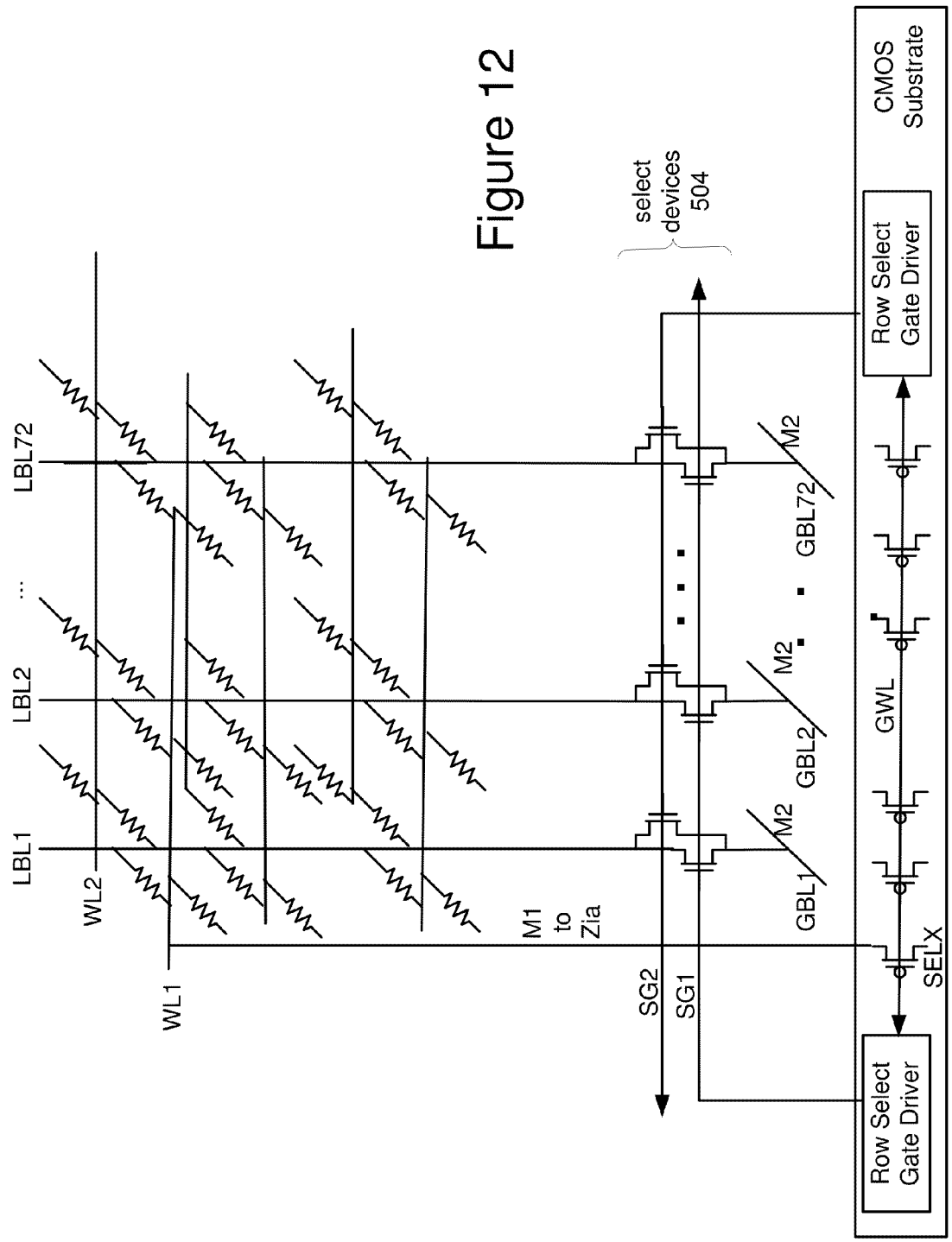
FIG. 12 is a schematic of a portion of the memory system, depicting vertical bit lines, vertically oriented select devices above the substrate and row select line drivers in the substrate.

FIG. 12 shows another partial schematic also depicting the double-gated structure such that each local bit line (LBL1, LBL2, ... LBL72) are connected to their respective global bit lines (GBL1, GBL2, ... GBL72) by any of two respective vertically oriented select devices that are positioned above the CMOS substrate. As can be seen, while the double-gated structure of FIG. 10 includes positioning the various select devices 504 above the substrate, the Row Select Line Drivers providing the row select lines $SG_1$, $SG_2$, ... are positioned in the substrate. Similarly, the global word lines (e.g., GWL) are position in a metal layer on the substrate and below the vertically oriented select devices. Furthermore, as will be explained below, in one embodiment the Row Select Line Driver uses the appropriate global word line GWL as an input.

FIG. 10A is a cross-sectional view of a memory structure that is the same as depicted in FIG. 10, except that oxide layers 520 have been replaced by oxide regions 590 and gate material 522 has been replaced by gate regions (row select lines) 592. The embodiment of FIG. 10A is referred to as the split gate structure. Each vertically oriented select device 504 is turned on by applying a high voltage on both neighboring row select lines 592.

In prior designs, word line drivers were implemented in the substrate but outside the memory array (rather than underneath the memory array). To make the integrated circuit smaller, it is preferable to implement the word line drivers underneath the memory array. In some cases, a word line driver is as big in size as 16 word lines aggregated. Thus, the word line drivers have been too big to fit underneath the memory array. One proposed solution is to connect one word line driver to a group of multiple word lines connected together, where a memory system will have many of such groups. In one example implementation, 16 (or another number of) word lines will be connected together, and the connected group of word lines will be connected to a single word line driver. In one example, the 16 word lines are connected together to form a comb shape. However, other shapes can also be used. Using one word line driver to drive 16 (or a different number of) word lines in a single comb (or other shaped structure) reduces the number of word line drivers need. Therefore, the word line drivers can fit underneath the memory array. The use of the vertically oriented select devices described above also provides more room underneath the memory array (e.g., in the substrate) in order to implement the word line drivers. Additionally, using one or more word line drivers to drive multiple word lines reduces the number of wires needed from the word line drivers to the word lines, thereby saving room, simplifying routing, reducing power and reducing the chance of a fault. Additionally, because the word lines and bit lines are now shorter, there is a smaller time constant than in previous designs. Because there is a smaller time constant, the lines will settle quicker and there is no significant transient effect that will cause a disturb for unselected memory elements.

Figure 13:
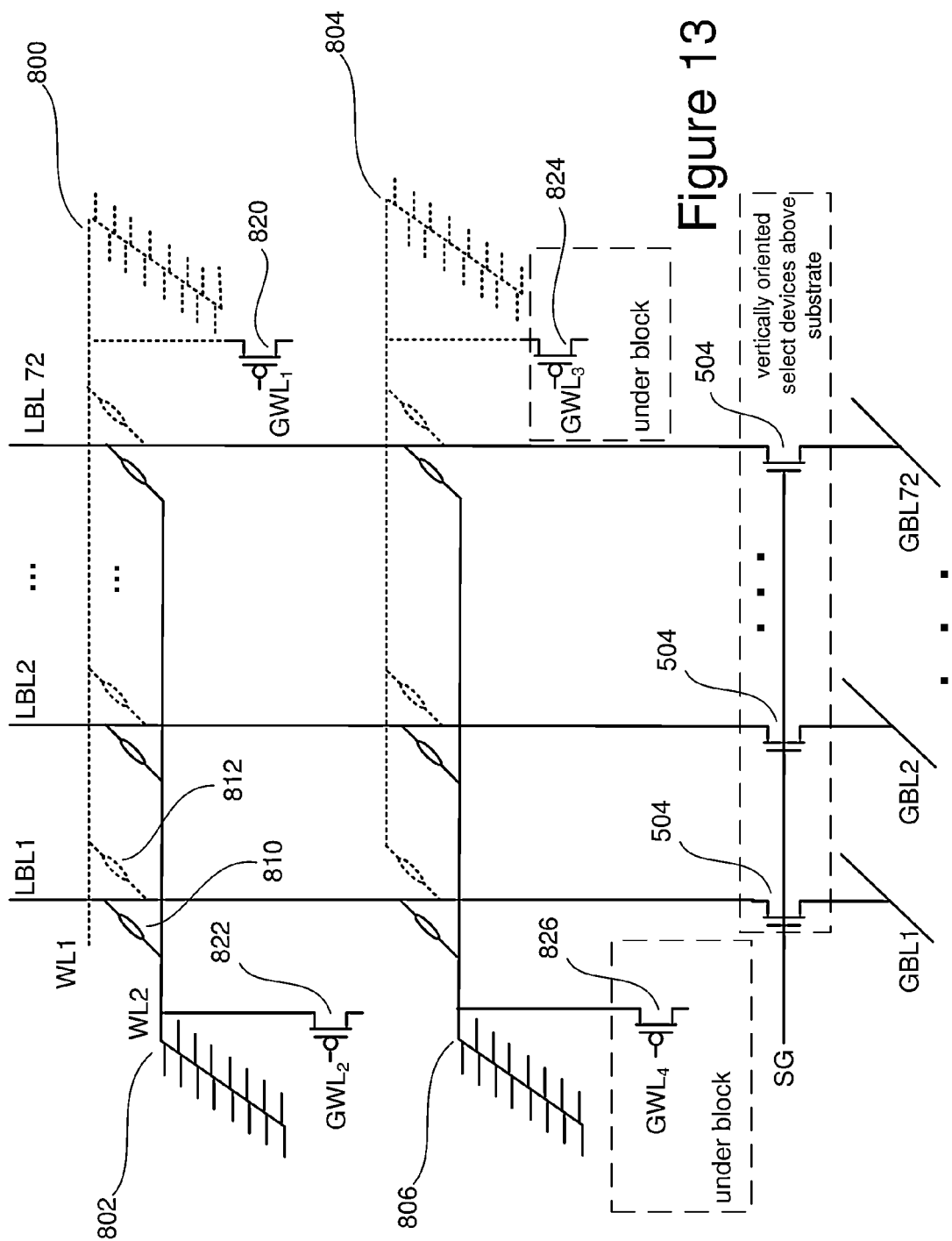
FIG. 13 is a schematic of a portion of the memory system, depicting vertical bit lines, vertically oriented select devices above the substrate and word line combs (connected word lines).

FIG. 13 is a partial schematic depicting a portion of a memory system which uses the comb structure described above. For example, FIG. 13 shows combs 800, 802, 804 and 806. A memory system is likely to have many more combs than depicted in FIG. 13; however, FIG. 13 will only show four combs to make it easier to read. Each comb includes 16 word lines, also referred to as word line fingers. For each comb, a first set such as eight (e.g., half) of the word line fingers are on a first side of the comb and are in a first block while another set such as eight (e.g., half) of the word line fingers are on the second side of the comb and are in a second block that is next to the first block. FIG. 13 shows that combs 800 and 802 (and all of the attached word line fingers) are in a first plane or level of the memory array, and combs 804 and 806 (and all of the attached word line fingers) are on a second plane or level of the memory array. Each of the combs has a signal line to one word line driver. For example, word line comb 800 is connected to word line driver 820. When word line comb 800 is selected, all of the word line fingers connected to word line comb 800 are selected (e.g., receive the selected word line signal). Word line comb 802 is connected to word line driver 822. Word line comb 804 is connected to word line driver 824. Word line comb 806 is connected to word line driver 826. Word line drivers 820, 822, 824 and 826 are implemented underneath the memory array in the substrate. In one embodiment, a word line driver is located underneath the block (or one of the blocks) for which it is connected to.

FIG. 13 shows that word line comb 800 includes word line WL1 which is connected to memory elements that are in turn connected to local bit lines LB1, LB2, ... LB72 (72 local bit lines). Word line comb 802 includes word line WL2 that is also connected to memory elements for the same 72 local bit lines LBL1, LBL2, ... LBL72. In this arrangement, word line comb 800 is on one side of the memory array and word line comb 802 is on the opposite side of the memory array such that the word line fingers from comb 800 are interleaved with the word line fingers of word line comb 802. To make it easier to read, FIG. 13 is created such that word line combs 800, 804, and their word line fingers appear as dotted lines to show that they are from the right side of the memory array while combs 802, 806 are solid lines to show that they are from the left side of the memory array. In this arrangement, each memory element connected to a word line of word line comb 802 for the block being depicted will have a corresponding memory element connected to a word line for word comb 800 that connects to the same local bit line. For example, memory element 810 (connected to WL2) and memory element 812 (connected to WL1) are both connected to LBL1. Therefore, the system has to be operated such that if LBL1 is selected, only appropriate memory element 810 or 812 should be selected. Note that the local bit lines are connected to the appropriate global bit lines by the vertically oriented select devices 504 (described above) that are above the substrate. In other embodiments, the word line comb structure can be used without using the vertically oriented select devices. For example, the word line comb structures can be used with select devices that are implemented in the substrate.

Figure 14:
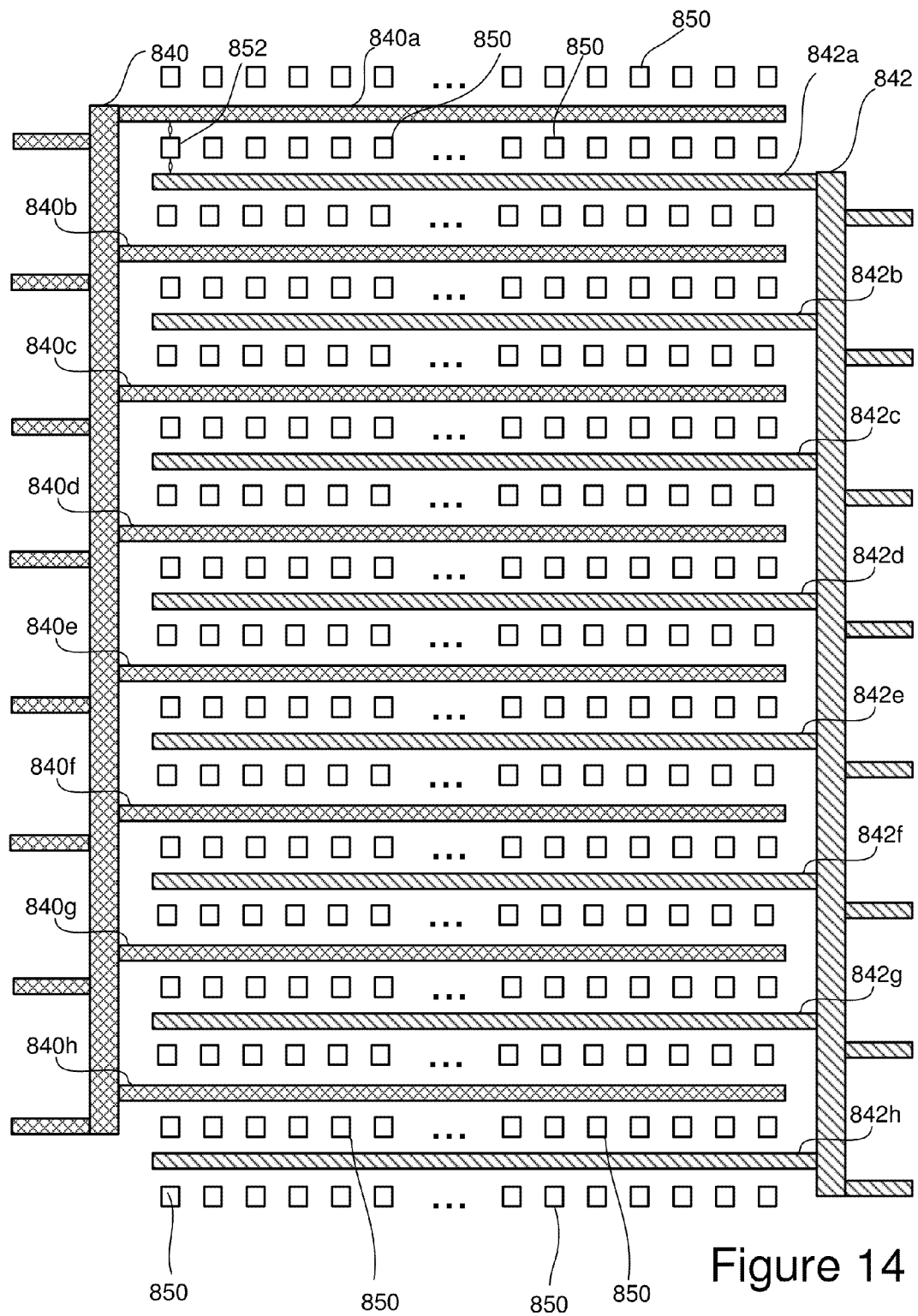
FIG. 14 is a top view of two word line combs and multiple vertical bit lines.

FIG. 14 is a top view of one layer of the memory array depicting part of two word line combs 840 and 842. As described above, each word line comb has word line fingers on two sides of its spine. FIG. 14 only shows the word line fingers on one side of each spine (with stubs being depicted for the word line fingers on the other side of the spine). For example, word line comb 840 includes word line fingers 840*a*, 840*b*, 840*c*, 840*d*, 840*e*, 840*f*, 840*g* and 840*h*. Word line comb 842 includes word line fingers 842*a*, 842*b*, 842*c*, 842*d*, 842*e*, 842*f*, 842*g* and 842*h*. Between adjacent word line fingers from word line combs 840 and 842 (which are interleaved as describe above), are vertical bit lines 850 (note that only a subset of vertical bit lines are labeled with reference number 850 to make the drawing easy to read). At the edge of the word line comb, the row of vertical bit lines is shared with an adjacent word line comb. Between each vertical bit line and each word line finger is a memory element. To make the drawing easy to read, memory elements are only depicted for local bit line 852.

Because two word line comb structures are interleaved and share local bit lines, biasing memory elements connected to one of the word line combs (and not the other) will have an effect on the other word line comb. Biasing the vertical bit lines will have an effect on all memory element (for any word line comb) connected to those bit lines, even though the respective word line combs are not biased. Biasing a word line comb will bias all 16 (or other number of) word line fingers that are part of that word line comb. However, it is typically desired to only program or read from memory elements connected to one word line finger of the comb.

FIG. 15A is a flow chart describing one embodiment for programming memory elements. The process of FIG. 15A can be performed as part of a SET process or as part of a RESET process. In Step 850, all word lines are driven to a common signal of ½ VPP. In general ½ Vpp represents the intermediate unselected word line voltage and is not necessarily exactly half the programming voltage Vpp. Due to IR drops and other particulars of each embodiment the intermediate unselected biases can be adjusted higher or lower than half the programming voltage and may range from ¼ to ¾ of the Vpp. In one embodiment, Vpp is the largest voltage used on the integrated circuit for the memory array. One example of VPP is 4 volts; however, other values can also be used. In step 852, the local bit lines are all floated; therefore, they will drift to or near ½VPP. In step 854, ½VPP (e.g., an unselected voltage) is applied to all global bit lines. In step 856, one or more data dependent signals are applied to the global bit lines; for example, VPP is applied to only the selected global bit lines. In step 858, the vertically oriented select devices discussed above are turned on in order to connect the selected local bit lines to the selected global bit lines. In step 860, selected local bit lines will rise to or toward VPP. In step 862, the selected word line comb is pulled down to ground. In some embodiments more than one word line comb can be pulled down to ground. In other embodiments, only one word line comb can be selected at a time.

FIG. 15B is a flow chart describing other embodiments for programming memory elements. The process of FIG. 15B is similar to the process of FIG. 15A, except that the voltage differential experienced by the programmed memory elements has a reverse polarity. Therefore, if the process of FIG. 15A is used to SET the memory element, then the process of 15B can be used to RESET the memory element. Similarly, if the process of FIG. 15A is used to RESET the memory element then the process of FIG. 15B can be used to SET the memory element. In step 870 of FIG. 15B, all word lines are driven to a common signal of ½VPP. In step 872, all local bit lines are floated and they will therefore drift to at or near ½VPP. In step 874, ½VPP is applied to the all global bit lines. In step 876, one or more data dependent signals are applied to the global bit lines; for example, the selected global bit lines are pulled down to ground. In step 878, the vertically oriented select devices are turned on to connect the selected local bit lines to the selected global bit lines. In step 880, the selected local bit lines are pulled down to or toward ground in response to being connected to the global bit lines. At step 882, VPP is then applied to the selected word line comb (or multiple word line combs in some embodiments) in order to create the appropriate differential to cause the programming operation to be performed.

FIG. 16 is a flow chart describing one embodiment of a process for reading memory elements. In step 940, all word lines are driven to a common signal of Vread. In one embodiment Vread is equal to 2 volts; however, other values can also be used. In step 942, the local bit lines are floated; therefore, they will drift to or near Vread. Some floating local bit lines will drift to a voltage just under Vread if they are connected to a memory element in the low resistance state. In step 944, the global bit lines are charged to one or more signals; for example, the global bit lines are charged to Vread. In step 946, the selected word line comb (or in some embodiments multiple word line combs) are pulled down to ground. In step 948 the appropriate vertically oriented select devices are turned on in order to connect the appropriate selected local bit lines to the selected global bit lines. In step 950, current through the selected memory element flows from the selected bit line, from the vertical select device, from the associated global bit line, through a current conveyor clamp device, and ultimately from a sense node in the associated sense amplifier. In step 952, the sense amplifier will sense the current and determine the state of the memory element.

The above discussion describes how use of the vertically oriented select devices and word line combs (or other shapes of connected word lines) allows for a more compact memory system. Another means for reducing the size of the memory system is to reduce the area needed for row select line drivers. Looking back at FIG. 1, row select lines are depicted as $SG_1$, $SG_2$, $SG_3$, . . . The drivers for these row select lines are implemented in the substrate. It is desirable to reduce the area of the substrate needed to implement these drivers.

In one embodiment, one row select line driver will drive a row select line that connects to vertically oriented select devices in 128 blocks. In one embodiment, a set of 128 blocks will have 16 row select line drivers with one driver for each of the sixteen row select lines for the comb groups arranged along a horizontal direction in the 128 blocks. In some example implementations, half of the row select line drivers will be on one side of the set of the blocks and half of the row select line drivers will be on the other side of the set of blocks such that the left and right side drivers will have their respective row select lines interleaved.

FIG. 17 illustrates one example of a row select line driver 112 driving a row select line $SG_x$ for 128 blocks. One or more row select line drivers 1112 are shown driving two sets of 64 blocks. On one side of the row select line drivers 112 are a first set of 64 blocks and on the other side of row select line driver 1112 are another set of 64 blocks. The row select line driver is implemented in the substrate while the 64 blocks of memory are located above the substrate.

In another embodiment, between groups of 32 blocks, half of the necessary row select line drivers are positioned. That is, there will be eight drivers between each group of 32 blocks. In yet another embodiment, between each group of eight blocks are two of the sixteen necessary row select line drivers. Other arrangements can also be used.

Figure 18:
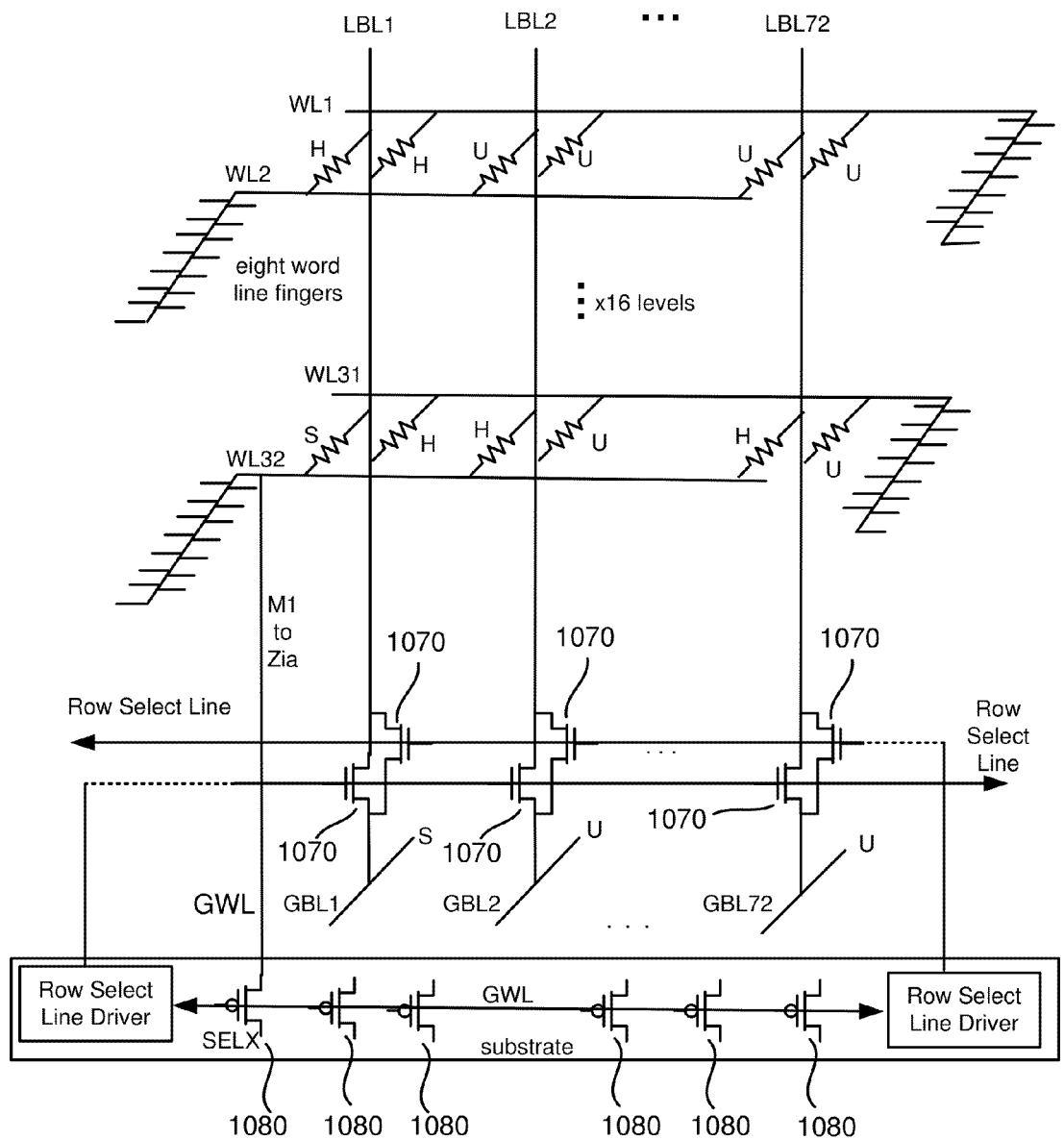
FIG. 18 is a schematic of a portion of the memory system, depicting vertical bit lines, vertically oriented select devices above the substrate, word line combs, and row select lines that run across multiple blocks of memory elements.

FIG. 18 is a partial schematic depicting a portion of one comb group in a block and some of the support circuitry. FIG. 18 shows bit lines LBL1, LBL2, . . . , LBL72, all of which are vertically oriented bit lines as discussed above. FIG. 18 also shows four word lines WL1, WL2, WL31 and WL32. In one embodiment, WL1 and WL2 are part of different word line combs on the same level. Word line WL31 and word line WL32 are also on the same level and connected to different word line combs. In the embodiment of FIG. 29, there are 16 levels, with two word line combs per level, eight word line fingers extending into a block from each word line comb, and 72 bit lines on each side of a word line. Therefore, in one embodiment, a comb group in a block includes 72×17=1224 bit lines including the shared bit lines at the comb edges, 8×2=16 word line fingers per level and a total of 16×16=256 word lines fingers. Each of the global word lines GWL are driven by a MOSFET select device 1080 in the substrate, which is PMOS in some embodiments and NMOS in other embodiments. Each of the vertically oriented select devices 1070 are connected to a global bit line (GBL1, GBL2, . . . , GBL72) and an appropriate row select signal. The vertically oriented select devices 1070 and the row select lines are implemented above the substrate, as described above. The row select lines span across 128 (or another number of) blocks and eventually connect to row select line drivers in (and/or on the substrate). In one embodiment, the global word line connects to the gate of word line drivers 1080, which connect the word line to SELX source inputs to drive the various word line combs to either a selected or unselected voltage. The word line driver 1080 and SELX signal lines carry significant current when the word line is selected and are non-minimum devices and metal lines respectively.

In the embodiment of FIG. 18, it is assumed that one word line comb is selected and none of the other three word line combs are selected. Additionally, it is assumed that GBL1 is selected for programming while GBL2 and . . . GBL72 do not have data for programming. Therefore, the memory element between WL32 and LBL1 is selected for programming. The other memory elements between WL32 and the other bit lines are half selected (H). The memory element between WL31 and LBL1 is half selected (H). The other memory elements connected to WL31 being unselected (U). For WL1, WL2, and the first word line of each word line comb for the other 14 levels, the memory element connected to LBL1 is half selected (H) and all the other memory elements are unselected. In light of the above, none of the memory elements that are not selected will be disturbed. As can be seen from FIG. 29, each bit line connects to two word line combs on each of the sixteen levels. Therefore, the fan out of each bit line is 32 memory elements (16 levels×2 memory elements per level). Additional memory elements associated with adjacent rows of vertical bit lines are not shown to make the drawing clearer. Some of those additional memory elements connect to WL1, WL2, or WL31 and are unselected. Other of those additional memory elements connect to WL32 and are half selected. Operation of the system includes driving signals on word lines and global bit lines, using row select line drivers to apply signals on a plurality of row select lines, activating a plurality of select devices based on the signals applied to the row select lines (with each block of memory elements connected to a different subset of the select devices and each row select line connects to a subset of the select devices for multiple blocks), and communicating signals from the global bit lines to vertically oriented bit lines above and not in the substrate using the select devices.

Each word line finger interacts (via memory elements) to 72 local bit lines on one side of the word line finger and 72 bit lines on the other side of the word line. Therefore, there are 144 memory elements connected to each word line finger. Since there are 8 word line fingers connected to each word line comb, the fan out of a word line comb is 1152 memory elements (8 fingers×144 memory elements per finger). Therefore the fan out of a bit line is significantly less than the fan out of a word line comb. Additionally, the fan out of a bit line is less than the fan out of a word line finger. The fan out of a row select line driver is 9216 (128 blocks×72 local bit lines per block). Therefore, the fan out of a bit line, the fan out of a word line finger, and the fan out of a word line comb are all individually less than the fan out of the row select line driver. The global bit line spans across all 4096 comb groups of a block; therefore, the fan out of a global bit line is 65,536 (4096 blocks×16 rows of bit lines). The fan out of a global word line is 65,536. Therefore, the fan out of the global word line and the fan out of the global bit line are both bigger than the fan out of a bit line, the fan out of a word line, the fan out of a word line comb and the fan out of a row select line driver.

The fan out of the various lines driving the memory core is devised to balance the area of these drivers which dominate the support circuit area of the chip and thereby produce the most efficient memory chip. Low fan out lines have the most number of drivers. High fan out lines have the least number of drivers while serving the same number of memory elements. The optimum chip would associate the most compact driving circuit with the lowest fan out line because it has the largest number of drivers. Vice versa, an optimum chip would associate the most area consuming circuit with the highest fan out line. In the above embodiment of the memory chip, the optimum chip efficiency is achieved by the association of drivers and fan outs for bit lines, word lines, row select gate driver, global word line and global bit line. The bit line is driven by the most compact driver, it being a single vertically oriented thin film transistor and is given the smallest fan out, which implies the largest number of devices. The word line is driven by a single device driver which is next in the rank of driver area. The row select driver, as described below, is a three device driver and third in driver area rank. And finally the global bit and global word line driving circuitry involves more complicated decoding circuitry and are of approximately equal complexity. The increasing rank of driving circuitry complexity is aligned with the increasing fan out of the driven line to achieve the optimum efficiency of the memory system.

Figure 19A:
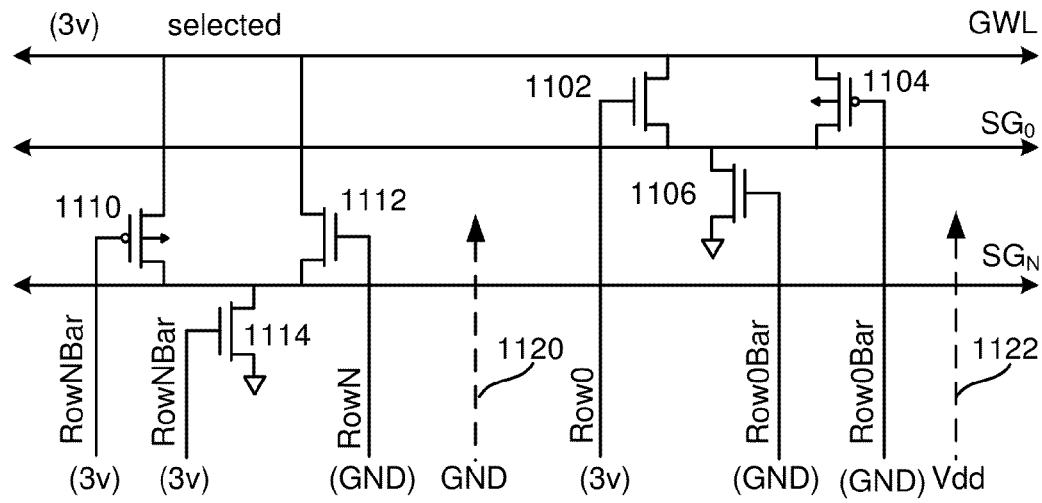
FIGS. 19A and 19B are schematics that depict row select line drivers.

FIG. 19A depicts a partial schematic that includes one example embodiment of a row select line driver that can be used with the vertical bit line architecture described above (including the vertically oriented select devices, word line combs, and extended row select lines described above). The row select line driver of FIG. 19A includes three metal oxide semiconductor field effect transistors (MOSFET). For example, one row select line driver includes nMOS transistor 1102, pMOS transistor 1104 and nMOS transistor 1106. The source input of nMOS transistor 1102 and the source input of pMOS transistor 1104 are connected to the Global Word Line (GWL). The drain of nMOS transistor 1102 and the drain of pMOS transistor 1104 are connected to the row select line (SG$_0$). The drain of nMOS transistor 1106 is also connected to the row select line SG$_0$. The source of nMOS transistor 1106 is connected to ground. The gate of nMOS transistor 1102 is connected to a selection line Row0. The gate of nMOS transistor 1106 and pMOS transistor 1104 are both connected to selection line Row0Bar.

FIG. 19A also shows a second row select line driver comprising pMOS transistor 1110, and nMOS transistor 1112 and nMOS transistor 1114. The sources of pMOS transistor 1110 and nMOS transistor 1112 are connected to the Global Word Line GWL. The drains of pMOS transistor 1110 and nMOS transistor 1112 are connected to row select line SG$_n$. The gate of pMOS transistor 1110 is connected to the selection line RowNBar. The gate of nMOS transistor 1112 is connected to selection line RowN. The drain of nMOS transistor 1114 is connected to row select line SG$_n$ and the source of nMOS transistor 1114 is connected to ground. The gate of nMOS transistor 1114 is connected to RowNBar. Between the row select line driver comprising transistors 1110, 1112, and 1114 and the row select line driver comprising transistors 1102, 1104 and 1106, is a ground line to provide ground to nearby electric components. On the other side of the row select line driver comprising transistors 1102, 1104 and 1106, is a power line supplying VDD to nearby components.

In parentheses are voltage values applied to the various lines of FIG. 19A to explain one example of operation of the row select line drivers depicted therein. In this example, three volts is applied to the Global Word Line, RowNBar and Row0. Ground is provided to RowN and Row0Bar. In such a configuration, Row0 is selected and RowN is not selected. That is, the row select line driver for Row0 (comprising transistors 1102, 1104 and 1106) is turned on and the row select line driver for RowN (comprising transistor 1110, 1112 and 1114) is turned off. Therefore, a selection signal of three volts will be driven on the row select line for Row0 (SG$_0$) and ground will be provided on the row select line for RowN (SG$_n$). As transistor 1102 receives three volts at its gate and transistor 1104 receives ground at its gate, both transistors turn on and current will flow from the Global Word Line to SG$_0$ through pMOS transistor 1104. SG$_0$ will be driven to 3 volts. Therefore, all of the vertically oriented select devices connected to SG$_0$ will be turned on, thereby connecting respective global bit lines to respective vertical local bit lines (selectively putting the respective vertical local bit lines in communication with respective global bit lines). Since the gate of pMOS transistor 1110 receives three volts and the gate of nMOS transistor 1112 receives ground, both transistors will remain off. Since the gate of transistor 1114 receives three volts, it will turn on and pull the row select line SG$_n$ to ground. Those vertically oriented select devices receiving SG$_n$ will not turn on and the respective vertical local bit lines will not be connected their respective global bit lines.

Figure 19B:
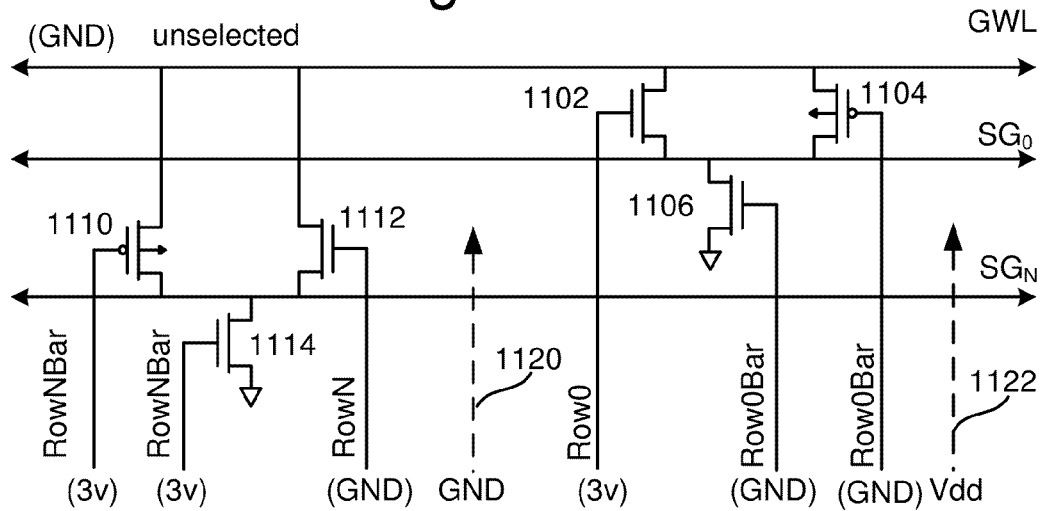

FIG. 19B shows the same circuit as FIG. 19A, but with different biases. The Global Word Line now receives ground indicating that it is unselected. The signal lines RowN and Row0Bar are at ground. The signal lines Row0 and RowNBar receive three volts. So, the difference between FIG. 19A and FIG. 19B is that in FIG. 19A the Global Word Line is selected (receives three volts) and in FIG. 19B the Global Word Line is unselected (at ground). As the gate of nMOS transistor 1102 is at three volts and the gate of pMOS 1104 is at ground, both transistors are turned on. In this case, the Global Word Line (at ground) will pull down the row select line SG$_0$ to ground through nMOS transistor 1102. As the gate of nMOS transistor 1106 receives ground, that transistor is off. Since the pMOS transistor 1110 receives three volts and the gate of nMOS transistor 1112 receives a ground potential, both transistors remain off. Since nMOS transistor 1114 receives three volts at its gate, that transistor is turned on and the row select line SG$_n$ is pulled down to ground via nMOS transistor 1114. In the example of 19B, both row select lines depicted are at ground so that the vertically oriented select devices will not connect their respective vertical bit lines to the respective global bit lines.

Each global word line connects to one word line comb group in a block. SELX signals described above are connected to associated word line combs by the word line driver devices which are turned on by the global word line at 3 volts. A selected SELX bias is passed to the selected word line comb. Therefore, by driving three volts on a particular global word line, one word line comb will be selected for the memory operation and the appropriate sixteen (or a different number) of row select line drivers will also be enabled. The selection signals Row0, Row0Bar, Row1, Ro1Bar, ... RowN, RowNBar are used to select between the sixteen row select line drivers associated with the particular global word line. As discussed above, in one embodiment, each row select line driver will drive a row select line (SG$_x$) that connects to 128 blocks (or a different number of blocks, depending on the particular implementation).

FIGS. 19A and 19B show the three transistors (components) forming a row select line driver to be adjacent to each other. In other embodiments, the three transistors are distributed throughout the memory array. For example, the transistors can be underneath different blocks or between different blocks (which still qualifies as being under the memory array since the drivers are located within the edges/borders of the array). In one example embodiment, the area between blocks is referred to as the word line break because one or more word lines (e.g., half of the word lines for a block) will end at the edge of a block. Thus, there is a break (at least a partial break) in the word lines between blocks. The word line break can also be thought of as a gap between blocks. In one embodiment, one transistor (of a row select line driver) will be positioned in a word line break. That is, in the gap between adjacent blocks there will be transistor that will form part of a row select line driver. Therefore, the three transistors for a word line driver will be in three different word line breaks. FIGS. 31A and B depict one example of selectively connecting the global bit lines to the vertically oriented bit lines using vertically oriented select devices controlled by row select lines, where the selectively connecting includes driving the row select lines using row select line drivers and using a particular row select line driver includes controlling components that are distributed in different gaps between the blocks.

In one embodiment, in order to turn on one of the vertically oriented select devices to select a vertical bit line, two of the row select lines need to be turned on. In one implementation, for a particular vertically oriented select device to be turned on, both of the row select lines connected to the double gated structure of the vertically oriented select device are turned on. That is the row select lines connected to the two gate interfaces for the select device are carrying an "on" signal.

In one embodiment, the vertically oriented select devices are modified so that two gates are required to provide a sufficient voltage in order to turn on the vertically oriented select device. For example, the doping of the channel of the vertically oriented select device is increased. Therefore, an "on" voltage from both row select lines connected to the dual gate structure is required in order for the threshold voltage of the transistor to be met and current to flow in the channel.

In some implementations, there could be a problem with multiple memory elements being selected based on a single vertically oriented select device turning on. That is, with the word line comb arrangement, the entire word line comb is selected. Therefore every other word line along a slice will be selected. In one proposed solution, the vertically oriented select devices are fabricated as asymmetrical devices, each having two gate interfaces. Each asymmetrical vertically oriented select device has one of the row select lines connected to a first gate interface for the respective asymmetrical vertically oriented select device and another of the select lines connected to a second gate interface for the respective asymmetrical vertically oriented select device. In some embodiments, the asymmetrical aspect of the select devices is a difference in threshold voltage that is produced by doping level differences (e.g., asymmetrical doped) in the channel (e.g., asymmetrical channel), gate oxide thickness differences (asymmetrical gate oxides such that the left gate oxide has a different thickness than the right gate oxide), a gate material work function difference or a combination of these methods. In one embodiment, the TFT channel receives an angled implant so that the left side of the channel (at a first gate interface) has a lower threshold voltage than the right side of the channel (at a second gate interface). An angled n type channel implant after oxide deposition produces a lower threshold for the channel on the left side of the vertical TFT device as compared to the right side of the TFT. Thus, the left side of the select device (including the left gate interface) will act like a depletion mode transistor and the right side of the select device (including the right gate interface) will act like an enhancement mode transistor. In other words, for the double gated switch, the left gate will be a depletion mode transistor and the right gate will be an enhancement mode transistor. In other embodiments the channel implantation is combined with implantation into the gate material to produce a gate oxide thickness difference and a work function difference of the gate material. The gate material could be doped polysilicon. An high level p type angled implantation before gate oxide growth into the polysilicon gate material on the right side of the TFT raises the work function of the gate material, raises the threshold of the associated channel, and increases the gate oxide thickness. Diffusion of p type dopant through the gate oxide during a high temperature anneal of the TFT in some embodiments increases the p doping in the channel and further raises the enhancement side threshold. In the above described embodiments, the asymmetrical nature of the channel of the select device is asymmetrical with respect to the direction in the channel from the first/left gate interface to the second/right gate interface.

FIG. 20 is a cross section of a structure of a memory providing another embodiment that allows for operation of the memory system and proper selection of memory elements where the word line comb structure (or other type of shape) is implemented. In the embodiment of FIG. 20 (which may include word line comb structures or other shapes), the vertically oriented select devices are symmetrical. Thus the oxide layers on each side are symmetrical. However, the embodiment of FIG. 20 includes two layers of vertically oriented select devices and two layers of row select lines. FIG. 20 shows a first layer of vertically oriented select devices including 1600*b*, 1602*b*, 1604*b*, 1606*b* and 1608*b*. A top and second layer of vertically oriented select devices includes 1600*t*, 1602*t*, 1604*t*, 1606*t* and 1608*t*. The bottom layer of row select lines includes 580*b*, 582*b*, 584*b*, 586*b*, 588*b*, and 590*b*. The top layer of row select lines includes 580*t*, 582*t*, 584*t*, 586*t*, 588*t*, and 590*t*.

Row select line 580*t* is formed on top of 580*b*. Row select line 582*t* is formed on top of row select line 580*b*. Row select line 584*t* is formed on top of row select line 584*b*. Row select line 586*t* is formed on top of row select line 586*b*. Row select line 588*t* is formed on top of row select line 588*b*. Row select line 590*t* is formed on top of row select line 590*b*.

Vertically oriented select device 1600*t* is formed on top of, connected to and in series with vertically oriented select device 1600*b*. Vertically oriented select device 1602*t* is formed on top of, connected to, and in series with vertically oriented select device 1602*b*. Vertically oriented select device 1604*t* is formed on top of, connected to and in series with vertically oriented select device 1604*b*. Vertically oriented select device 1606*t* is formed on top of, connected to, and in series with vertically oriented select device 1606*b*. Vertically oriented select device 1608*t* is formed on top of, connected to, and in series with vertically oriented select device 1608*b*.

In the embodiment of FIG. 20, in order for global bit line 1360 to be in communication with one of the local bit lines (1370, 1372, 1374, 1376 or 1378), both of the vertically oriented select devices underneath the appropriate local bit lines must be turned on. To turn on both switches (a top switch and a bottom switch), then a top row select line and a bottom row select line must be turned on. FIG. 20 shows row select line 584*t* as being selected ("+") by driving three volts and row select line 582*b* as being selected ("+") and driving three volts. Therefore, vertically oriented select device 1602*t* and vertically oriented select device 1602*b* will both turn on. Because row select line 584*t* is selected, vertically oriented select device 604*t* will also turn on. Because vertically oriented select device 604*b* is off, local bit line 1374 will not be selected and will not be in communication with global bit line 1360. Because row select line 582*b* is selected, vertically oriented select device 1600*b* will also turn on. Since vertically oriented select device 1600*t* is not turned on, local bit line 1370 will not be connected to or in communication with global bit line 1360. In this manner, only local bit line 1372 is selected. Memory element 1620 will undergo a memory operation. Therefore, in the structure of FIG. 20, a local bit line is selected by choosing a top row select line and a bottom row select line on opposite sides of the stack of two vertically oriented select devices. Each of the selected/activated row select lines are also connected to select devices adjacent to the intended target select device, for example, row select line 584*t* is also connected to select device 1604*t* which is adjacent to select device 1602*t*.

Figure 21:
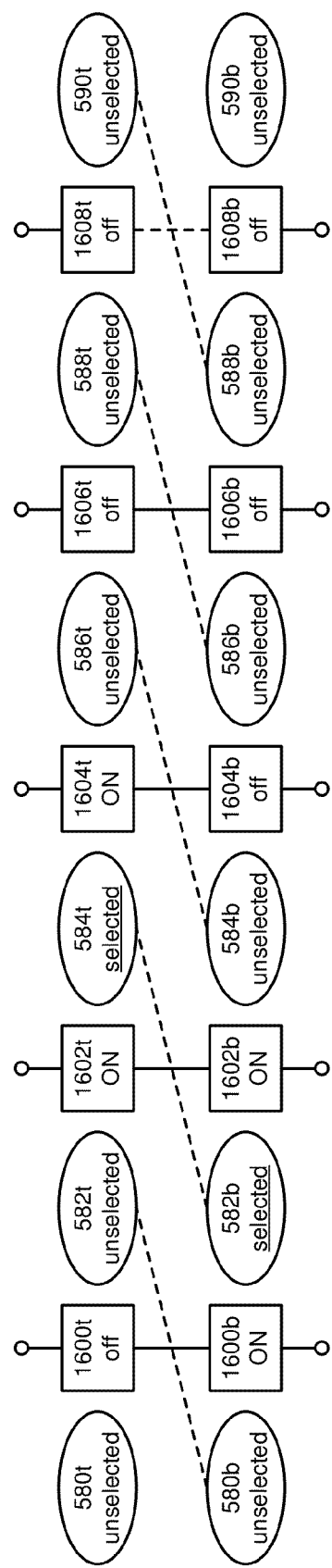
FIG. 21 is a block diagram depicting one example implementation of how to connect various row select lines.

FIG. 21 is a block diagram showing the two rows of row select lines and vertically oriented select devices from FIG. 20. In one embodiment, the structure of FIG. 20 will include double the amount of row select lines in the memory system. This may add a lot more signal lines which occupies valuable space. One proposal is to connect two row select lines within the block of memory elements. In one embodiment, diagonal row select lines will be connected (e.g., wired) together. For example, FIG. 21 shows row select line 582*b* being wired to row select line 584*t*. FIG. 21 also shows row select line 580*b* being wired to row select line 582*t*, row select line 584*b* being wired to row select line 586*t*, row select line 586*b* being wired to row select line 588*t*, and row select line 588*b* being wired to row select line 590*t*. Other arrangements for wiring the two row select lines together can also be used.

Figure 22:
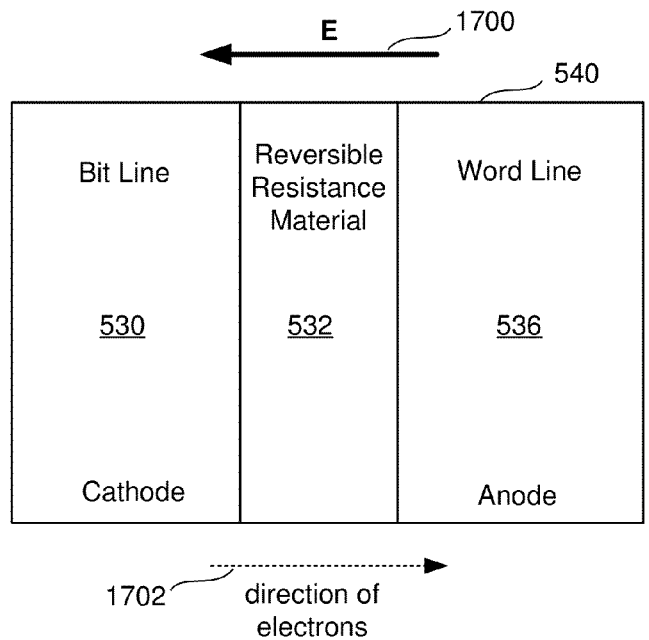
FIG. 22 depicts a memory element.

Looking back at FIG. 10, memory element 540 is identified using a dashed box. FIG. 22 depicts a close-up cross sectional view of memory element 540, including a portion of the material comprising the bit line 530, reversible resistance switching material 532 and a portion of the material comprising the word line 536. The portion of the material comprising the bit line 530 and the portion of the material comprising the word line 536 act as electrodes for memory element 540. In one embodiment, reversible resistance switching material 532 comprises a metal oxide material. As described above, other types of materials can also be used. Table 1 provides some examples (but not an exhaustive list) of materials that can be used for the memory elements.

TABLE 1

| Electrode (Bit Line side) | Reversible Resistance Switching Material | Electrode (Word Line side) |
| --- | --- | --- |
| 20 nm n+ Si | 3 nm (or less) AlOx | 5-10 nm TiN |
| 10 nm n+ Si | 3 nm AlOx | 5-10 nm TiN |
| 20 nm n+ Si | 3 nm AlOx | 5-10 nm TiN |
| 20 nm n+ Si | 2 nm AlOx | 5-10 nm TiN |
| 20 nm n+ Si | 2 nm HfOx | 5-10 nm n+ Si |
| 20 nm n+ Si | 3 nm HSiON | 5-10 nm TiN |
| 8 nm n+ Si | 3 nm HSiON | 5-10 nm TiN |
| 20 nm n+ Si | 3 nm TaOx | 5-10 nm TiN |
| 20 nm n+ Si | 3 nm ZrOx | 5-10 nm TiN |
| 20 nm n+ Si | 3 nm HfOx | 5-10 nm TiN |

In one set of example implementations, (1) 20 nm n+Si, 3 nm HfOx, 5-10 nm TiN; and (2) 20 nm n+Si, 2 nm AlOx, 5-10 nm TiN are preferred sets of materials. Thin switching materials layers are less robust to the current surges and high fields needed to form the switching material. Nevertheless, the switching material thickness in many embodiments of this invention are reduced below 5 nm and preferably below 3 nm when in combination with a cathode electrode material with a low electron injection energy barrier to the switching material. Material choices are envisioned where the thickness of the switching material is reduced from typical values to be less than 3 nm and the cathode electrode material for forming has an energy barrier less than 1 eV to the switching material. Without being bound by any particular theory, the beneficial effect can be significant because both the material thickness reduction and the electron injection energy barrier reduction reduce the energy released in the forming event by electrons being injected into the switching material. Higher endurance and retention memory element are achieved.

Other buffer and barrier layers as required for processing and cell reliability can be added in some embodiments. For example, there may be a nm scale Titanium Oxide layer above or below the TiN layers. These buffer and barrier layers may be off ideal stoichoimetry.

The thicknesses are examples but various embodiments may be higher or lower. Highly defected metal oxide such as HfSiON, AlON, or AL doped HfOx are desirable in some embodiments for lower voltage operation and highest data retention memory cells.

Even with the same structure, the process condition such as annealing temperature and time can make a difference. In the example of 20 nm n+Si/3 nm HfO2/10 nm n+Si, the annealing condition after HfOx deposition should be at lower temperature and longer time (e.g., ~540 C for 1 hour). The device after this annealing behaves differently than previous standard 750 C 60s RTA.

Figure 23:
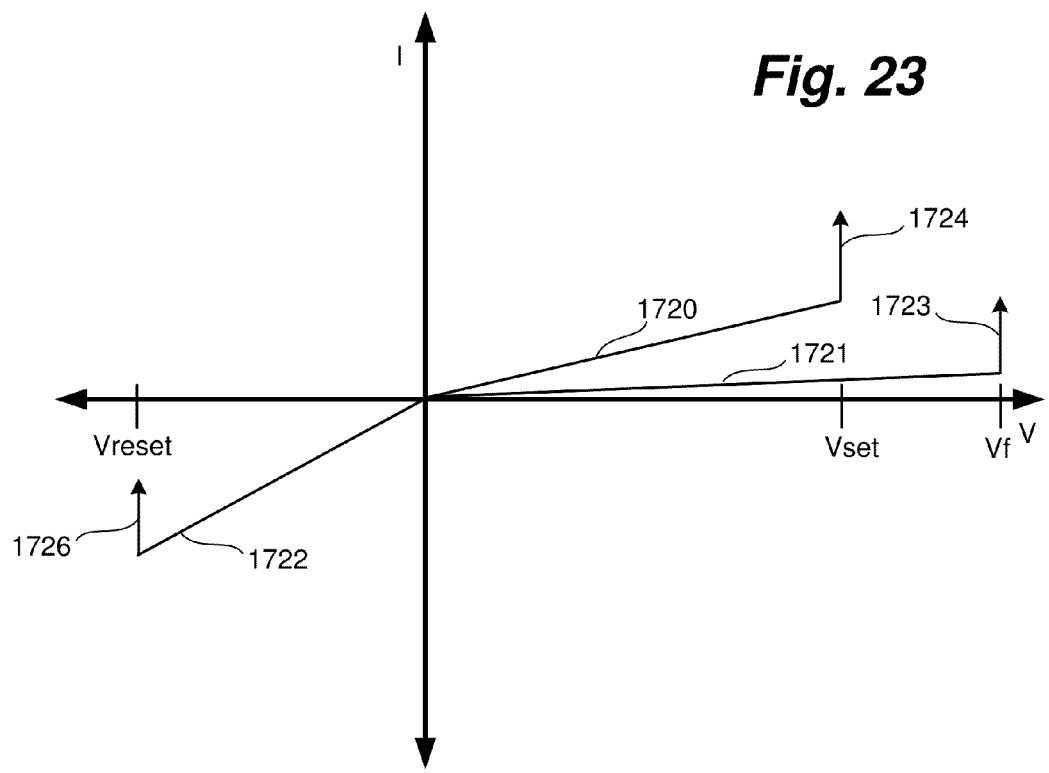
FIG. 23 is a graph of current versus voltage for a memory element, and is used to explain SET and RESET.

As described above, memory element 540 may be reversibly switched between two or more states. For example, the reversible resistance material 532 may be in an initial high resistance state upon fabrication that is switchable to a low resistance state upon application of a first voltage and/or current. Application of a second voltage and/or current may return the reversible resistivity-switching material to a high resistance state. FIG. 23 is a graph of voltage versus current for one example embodiment of a metal oxide reversible resistance-switching memory element. Line 1720 represents the I-V characteristics of the reversible resistance-switching memory element when in the high resistance state (ROFF). Line 1722 represents the I-V characteristics of the reversible resistance-switching memory element when in the low resistance state (RON). Line 1721 represents the I-V characteristics of a fresh reversible resistance-switching memory element before forming.

To determine which state the reversible resistance-switching memory element is in, a voltage is applied and the resulting current is measured. A higher measured current indicates that the reversible resistance-switching memory element is in the low resistance state. A lower measured current indicates that the memory element is in the high resistance state. Note that other variations of a memory element having different I-V characteristics can also be used with the technology herein. In bipolar switching mode of operation suitable for many materials, the values of Vset and Vreset are opposite in polarity.

Before forming, a reversible resistance-switching memory element is considered fresh. If the forming voltage Vf and sufficient current is applied to a fresh reversible resistance-switching memory element, the memory element will be formed and will go into a low resistance condition (which, in some embodiments coincides with the low resistance state). Line 1723 shows the behavior when Vf is applied. The voltage will remain somewhat constant and the current will increase. At some point, the reversible resistance-switching memory element will be in the low resistance condition/state and the device behavior will be based on line 1722 or something like line 1722.

While in the high low resistance state (see line 1720), if the voltage Vset and sufficient current is applied, the memory element will be SET to the low resistance state. Line 1724 shows the behavior when Vset is applied. The voltage will remain somewhat constant and the current will increase. At some point, the reversible resistance-switching memory element will be SET to the low resistance state and the device behavior will be based on line 1722.

While in the low resistance state (see line 1722), if the voltage Vreset and sufficient current is applied, the memory element will be RESET to the high resistance state. Line 1726 shows the behavior when Vreset is applied. At some point, the memory element will be RESET and the device behavior will be based on line 1720. Note that in one embodiment, the magnitude of the forming voltage Vf may be greater than the magnitude of Vset, and the magnitude of Vset may be greater than the magnitude of Vreset.

In one embodiment, Vset is approximately 3.5 volts, Vreset is approximately −2 volts, Iset_limit is approximately 5 uA and the Ireset current could be as high as 30 uA.

Looking back at FIG. 22, the thickness of the reversible resistance material 532 is chosen so that the fresh memory element (before a FORMING process) is in range of 10 to 1000 times more resistive than desired high resistance state (after a RESET operation). In one embodiment, the thickness range is 3 nm or less; however, other ranges can also be used.

The materials of the memory element 540 (portion of the material comprising the bit line 530, reversible resistance switching material 532 and portion of the material comprising the word line 536) each have a work function (based on the conduction bands of a semi-conducting material or an electron affinity if a metallic material). When designing a memory element, the reversible resistance switching material 532 and the cathode are chosen so that electron injection energy barrier is less than 1 eV by matching work function of the electrode and electron affinity of the reversible resistance switching material 532, by reducing effective work function of the electrode, or by both effects.

In one embodiment, when creating the electrode (e.g., creating the vertical bit line), the silicon material is annealed.

The annealing conditions are chosen to reduce trap depth of the reversible resistance switching material 532 to less than 1.0 eV. This is applicable if MeOx bulk conduction is dominated. Proper annealing conditions may also reduce the effective work function. Additionally (and optionally), cathode deposition conditions can be chosen to produce an interface layer between the cathode (e.g. bit line) and the reversible resistance switching material 532 which reduces effective work function of the cathode. Sputtering (e.g., Argon sputtering) can be used to reduce the work function of the electrode.

In some embodiments, the bit line can serve as the cathode and the word line as the anode, while in other embodiments the bit line can serve as the anode and the word line can serve as the cathode.

In one example implementation, the polarity of the FORMING voltage Vf is chosen so that the electrode with the lowest electrode to reversible resistance switching material barrier is chosen as the cathode. That is, the bit line to the reversible resistance switching material has a first electron injection energy barrier and the word line to the reversible resistance switching material has a second electron injection energy barrier. If the first electron injection energy barrier is less than the second electron injection energy barrier, then the bit line will be used as the cathode and the word line will be used as the anode. To achieve this, a positive forming voltage Vf is applied to the word line and ground is applied to the bit line. Alternatively, a higher positive voltage is applied to the word line, as compared to the bit line, such the difference in potential between the word line and the bit line is the forming voltage Vf. The bit line would be at a lower positive voltage potential than the word line. When the bit line serves as the cathode, the direction of the electric field is from the word line to the bit line (see arrow 1700 of FIG. 22) and the direction of electron injection into the reversible resistance switching material 532 is from the bit line to the word line (see arrow 1702 of FIG. 22). The cathode serves to emit electrons.

If the second electron injection energy barrier is less than the first electron injection energy barrier, then the word line will be used as the cathode and the bit line will be used as the anode. To achieve this, the positive forming voltage Vf is applied to the bit line and ground is applied to the word line. Alternatively, a higher positive voltage is applied to the bit line, as compared to the word line, such the difference in potential between the bit line and the word line is the forming voltage Vf. The word line would be at a lower voltage potential than the bit line.

Figure 24:
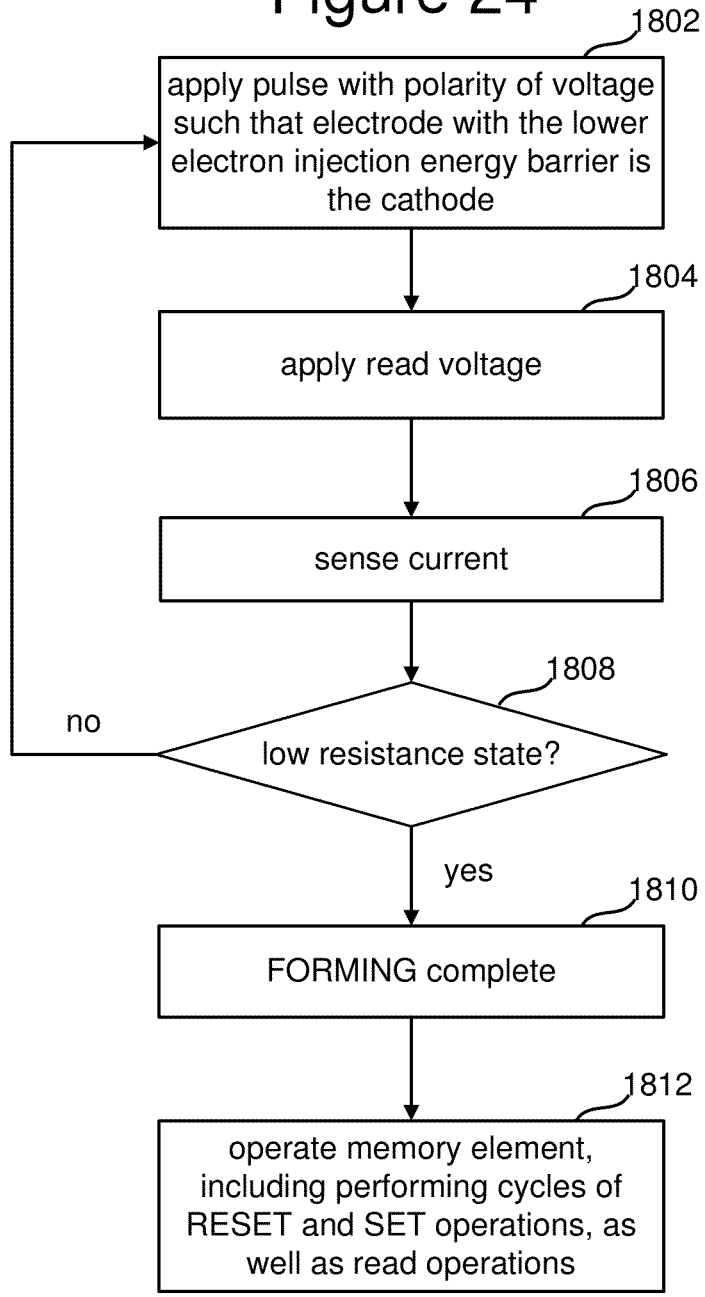
FIG. 24 is a flow chart describing one embodiment of a process for FORMING.

FIG. 24 is a flow chart describing one embodiment of a process for FORMING. In step 1802, the forming voltage Vf is applied as a pulse to the memory element via the appropriate word line and bit line. The polarity of the voltage is such that the electrode with the lower electron injection energy barrier is the cathode, as described above. In one example, the pulse is at 4.7 volts for approximately 2 micro seconds. In step 1804, a read voltage is applied to the memory element. In step 1806, the current through the memory element (and through the bit line) in response to the read voltage is sensed. If the current sensed in step 1806 is a lower current, indicating that the memory element is still in a high resistance condition (see step 1808), then the process loops back to step 1802 and another pulse is applied. If the current sensed in step 1806 is a higher current, indicating that the memory element is in the low resistance state (see step 1808), then FORMING is complete (step 1810). After FORMING is compete, the memory element can be operated by performing cycles of RESETs and SETS, as well as read processes.

In one embodiment, the system will use an on-chip resistor (or equivalent) serially connected with the memory element, with a resistance in range 100 K ohm to 500 K ohm, during FORMING to limit the maximum current across the reversible resistance switching material and, therefore, produce a formed state (low resistance) in 100M ohm to 10 G ohm. One option for an effective resistance serially connected to the memory element is to use an on-chip transistor connected with the memory at its drain to control maximum current in the range of 10 nA to 1 uA during FORMING to produce the formed low resistance state in 100M ohm to 10 G ohm. For example, the vertically oriented select devices (Qxx of FIG. 1, 500 in FIGS. 8A/B, 504 in FIGS. 9/10, 1602t/1602b of FIG. 21, . . . ) can be used to limit the current in/through the vertical bit lines during the FORMING process. As described above, the select devices are transistors, such as thin film transistors (as well as other types of transistors). These transistors have threshold voltages such that when a high enough voltage is applied to the gate, the transistors turn on. An "ON" voltage is defined as the gate voltage used to sufficiently turn on the transistor such that the transistor allows the maximum current to flow in its channel without breaking the transistor. An "OFF" voltage is defined as the gate voltage for which no current (or a sufficiently small amount of current to effectively be considered no current) flows in the channel of the transistor. An "INTERMEDIATE" voltage is defined as a gate voltage greater than the OFF voltage and less than the ON voltage such that a limited current flows in the channel of the transistors. For example, the "INTERMEDIATE" voltage may only allow 50% (or 30%, 60% or other fraction) of the maximum current to flow in the channel of the transistor/switch. Since the channel of the transistor is in series with the vertical bit line, limiting the current in the channel of the transistor comprising the select device will limit the current through the connected bit line. In one embodiment, the bit line current during forming is limited to a range of 10 nano amps to 1 micro amp.

In one example, the SET voltage Vset is the same polarity as the FORMING voltage Vf, and the RESET voltage Vreset is the opposite polarity as the FORMING voltage Vf. FIGS. 15A and 15B describe the SET and RESET processes. In one example, the bit line electron injection energy barrier is lower than the word line electron injection energy barrier, such that the bit line serves as the cathode; therefore, the FORMING voltage is applied with a positive (or higher) potential at the word line, the process of FIG. 15B is used to SET and the process of FIG. 15A is used to RESET.

In another example, the word line electron injection energy barrier is lower than the bit line electron injection energy barrier, such that the word line serves as the cathode; therefore, the FORMING voltage is applied with a positive (or higher) potential at the bit line, the process of FIG. 15A is used to SET and the process of FIG. 15B is used to RESET.

A memory cell with thinner MeOx layer and lower effective electron injection energy barrier is formed in the direction of polarity with lower electron injection energy barrier. Therefore, it reduces forming voltage and surge current. A current limit, such as the select device described above, can further protect the memory element to operate in the high resistance state (1M ohm to 1000M ohm) in both SET and RESET operation. This ensures that memory element takes most of the voltage applied. Therefore, a lower voltage is required from the power source, resulting in less operational current. In this way, the operational voltage and current are reduced.

Looking back at FIG. 10A, a split gate architecture is described. While this design does work well, it has some drawbacks in that the architecture limits the ability to scale the memory design and can result in a lower than ideal Idsat.

Additionally, in some implementations, the TFT-gate thickness is so thin (e.g., ~10 nm) that the sheet-resistor of TFT-gate is very high (~2K ohm/sq). Then, the RC switching delay of the selected TFT gate is very long (e.g., >1 us) to reduce the READ/WRITE performance. Therefore, in an array design, TFT-gate has to be segmented frequently to reduce RC with die size penalty.

To solving above problems, there is a "shared-gate VTFT structure" as shown in FIG. 10. The VTFT-gate (Vertical Thin Film Transistor) is shared between adjacent VBL at the same side. The shared-gate VTFT (Vertical Thin Film Transistor) structure is able to solve the three challenges noted above for the split gate architecture. However, in some cases, the shared-gate VTFT structure can suffer from unwanted disturbs on the half selected vertical bit lines.

One proposed solution to the disturb issue with the shared-gate VTFT structure is the stacked gate design depicted in FIG. 20. However, with the shared-gate structure Idsat is reduced (estimated: ~40% of split-gate) because of ½ of effective channel-width.

To overcome the challenges of the VTFT designs described above, the designs of FIGS. 25, 26 and 27 are proposed.

Figure 25:
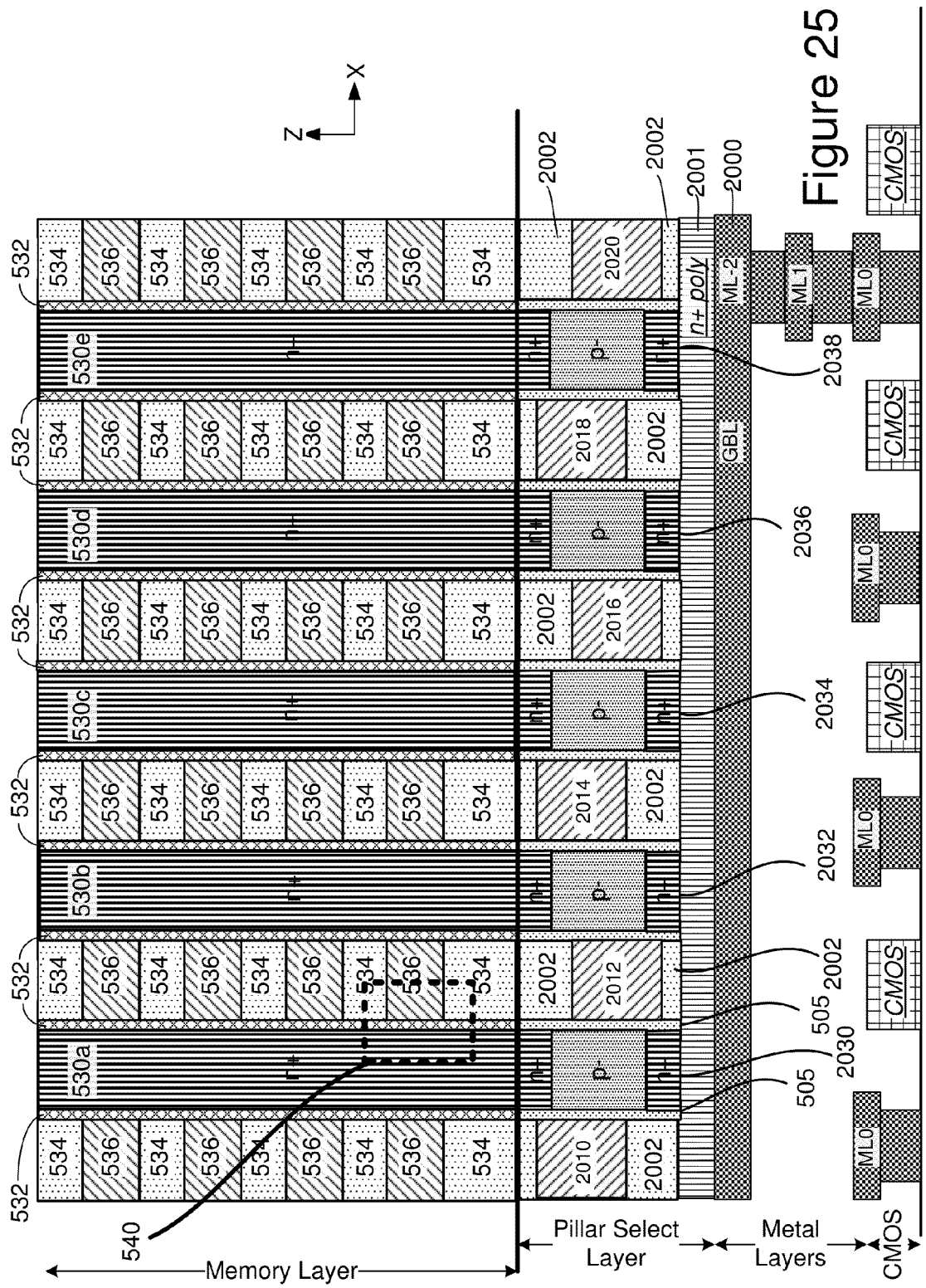
FIG. 25 illustrates one embodiment of a memory structure with vertical local bit lines above the substrate and vertically oriented select devices above the substrate that connect the bit lines to global bit lines.

FIG. 25 is a cross-sectional view of a memory structure using the proposed new vertically oriented select device and the memory structure of FIGS. 6 & 10. The memory structure of FIG. 25 is a continuous mesh array of memory elements because there are memory elements connected to both sides of the bit lines and memory elements connected to both sides of the word lines. The Memory Layer of FIG. 25 is the same as in FIG. 10, and includes a set of vertical bit lines 530a, 530b, 530c, 530d and 530e. In one embodiment, the vertical bit lines comprise N+ polysilicon. Interspersed between the vertical bit lines 530a-e are alternating oxide layers 534 and word line layers 536. In one embodiment, the word lines are made from TiN. Between the vertical bit lines 530 and the stacks of alternating oxide layers 536 and word line layers 536 are vertically oriented layers of reversible resistance switching material 532. In one embodiment the reversible resistance switching material is made of Hafnium Oxide $HfO_2$. However, other materials (as described above) can also be used. Box 540 depicts one example memory element which includes the reversible resistance switching material 532 sandwiched between a word line 536 and vertical bit line 530. The memory elements are positioned above, and not in, the substrate.

At the bottom of FIG. 25, the CMOS substrate is depicted. Implemented on the top surface of the CMOS structure are various metal lines including ML-0, ML-1, and ML-2. Line 2000 of ML-2 serves as a respective global bit line (GBL). The metal line ML-2 2000 serving as a global bit line can be implemented of any suitable material, including Tungsten, or Tungsten on a Titanium Nitride adhesion layer or a sandwich of n+ polysilicon on Tungsten on Titanium Nitride adhesion layer. The Pillar Select Layer includes the vertically oriented select devices, including their respective gates (2010, 2012, 2014, 2016, 2018 and 2020). The material forming the gates (2010, 2012, 2014, 2016, 2018 and 2020) can be polysilicon, Titanium Nitride, Tantalum Nitride, Nickel Silicide or any other suitable material. The gates (2010, 2012, 2014, 2016, 2018 and 2020) implement the row select lines $SG_x$ (e.g. $SG_1$, $SG_2$, ... of FIG. 1).

Directly below each vertical bit line 530 are the vertically oriented select devices 2030, 2032, 2034, 2036 and 2038. Each of the vertically oriented select devices comprises (in one example embodiment) a n+/p−/n+TFT (also referred to as a vertical thin film transistor, vertical TFT or VTFT). Each of the vertically oriented select devices 504 have oxide layers 505 on each side. FIG. 25 also shows an n+ polysilicon layer 2001. As can be seen, the npn TFT of vertically oriented select devices 504 can be used to connect the global bit line GBL (layer 2000) with any of the vertical bit lines 530a, 530b, 530c, 530d and 530e.

Figure 26:
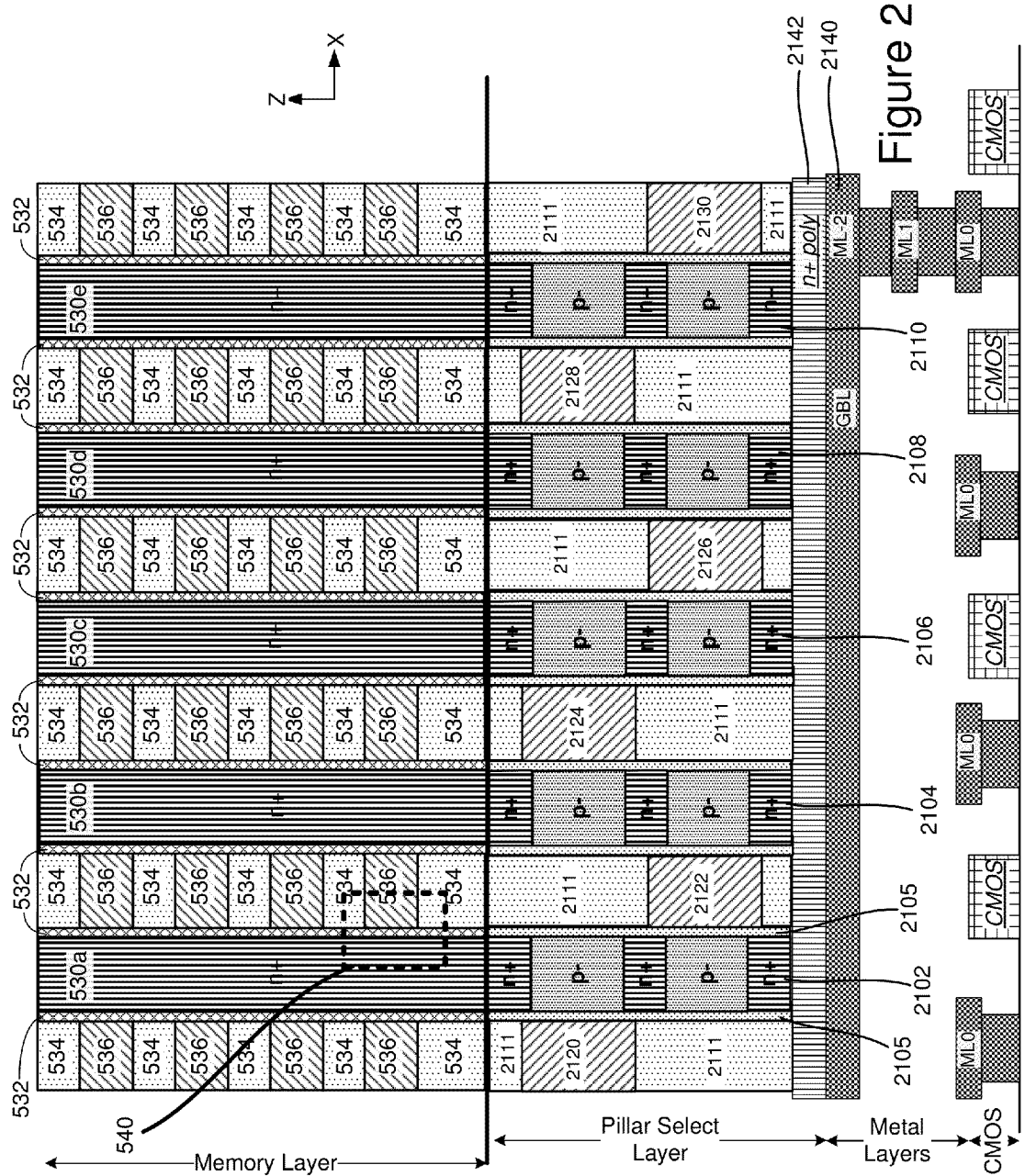
FIG. 26 illustrates one embodiment of a memory structure with vertical local bit lines above the substrate and vertically oriented select devices above the substrate that connect the bit lines to global bit lines.

FIG. 25 shows six row select lines ($SG_x$) which are also the gates 2010, 2012, 2014, 2016, 2018 and 2020, each underneath a stack of multiple word lines. The gates/row select lines 2010, 2012, 2014, 2016, 2018 and 2020 are positioned underneath and between the vertical bit lines. However, the gates/row select lines 2010, 2012, 2014, 2016, 2018 and 2020 are above and not in the substrate. FIG. 26 also shows oxide regions 2002.

Each row select line 2010, 2012, 2014, 2016, 2018 and 2020 can serve as the gate signal to either of the two neighboring vertically oriented select devices 2030, 2032, 2034, 2036 and 2038; therefore, the vertically oriented select devices 2030, 2032, 2034, 2036 and 2038 are said to be double gated. Each vertically oriented select device 2030, 2032, 2034, 2036 and 2038 is controlled by two different row select lines, in this embodiment. One aspect of the vertically oriented select devices 2030, 2032, 2034, 2036 and 2038 incorporated to the base portion of each bit line pillar is that two adjacent vertically oriented select devices 2030, 2032, 2034, 2036 and 2038 share the same gate region. This allows the vertically oriented select devices to be closer together. As can be seen, although each vertically oriented select devices 2030, 2032, 2034, 2036 and 2038 has two gates, the vertically oriented select devices have only one gate on each side. For example, vertically oriented select devices 2034 has only gate 2014 on one side and has only gate 2016 on the other side. As can be seen from FIG. 25, the first of the two gates is adjacent to a drain of the double gated vertically oriented select device but not adjacent to a source of the double gated vertically oriented select device and a second of the two gates is adjacent to the source of the double gated vertically oriented select device but not adjacent to the drain of the double gated vertically oriented select device. For example with respect to vertically oriented select devices 2034, gate 2014 is adjacent the top n+ region but not adjacent to the bottom n+ region, while gate 2016 is adjacent the bottom n+ region but not adjacent to the top n+ region. Also each of the vertically oriented select devices 2030, 2032, 2034, 2036 and 2038 comprises a single TFT with two source/drain regions.

Note that the gates/row select lines 2010, 2012, 2014, 2016, 2018 and 2020 are not all at the same vertical position. Rather, they are staggered with gates/row select lines 2010, 2014, and 2018 being offset and higher than gates/row select lines 2012, 2016, and 2020. By the term "higher" meant that the gates/row select lines 2010, 2014, and 2018 are further in distance from the substrate than gates/row select lines 2012, 2016, and 2020.

When programming, both gates/row select lines for a vertically oriented select device 2030, 2032, 2034, 2036 and 2038 are put in the "on" condition. For example, both gates/row select lines for a vertically oriented select device receive a high voltage, which turns on (or activates) the respective vertically oriented select device to put the vertically oriented bit lines are in communication with the global bit lines. This is illustrated in FIG. 25A, FIG. 25A shows the structure of FIG. 25, with vertically oriented bit line 530c selected (sel) for an operation, while the other vertically oriented bit lines remain unselected (unsel). To accomplish this, one or more high voltages are applied to gates/row select lines 2014 and 2016 to turn on (actuate) vertically oriented select devices 2034. When one or more high voltages are applied to gates/row select lines 2014 and 2016, channels 2040 are formed on both sides (two channels, one for each gate) of the selected vertically oriented select device 2034 and on one side of unselected vertically oriented select devices 2032 and 2036. As can be seen, for a given vertically oriented select device, the two channels are offset (with respect to distance to the substrate) from each other. During the programming operation, the two source/drain regions are depleted and short the two channels for an unselected vertically oriented select devices.

FIG. 26 is a cross-sectional view of a memory structure using another embodiment of the proposed new vertically oriented select device and the memory structure of FIGS. 6 & 10. The memory structure of FIG. 26 is a continuous mesh array of memory elements because there are memory elements connected to both sides of the bit lines and memory elements connected to both sides of the word lines. The Memory Layer of FIG. 26 is the same as in FIG. 10, and includes a set of vertical bit lines 530a, 530b, 530c, 530d and 530e. In one embodiment, the vertical bit lines comprise N+ polysilicon. Interspersed between the vertical bit lines 530a-e are alternating oxide layers 534 and word line layers 536. In one embodiment, the word lines are made from TiN. Between the vertical bit lines 530 and the stacks of alternating oxide layers 536 and word line layers 536 are vertically oriented layers of reversible resistance switching material 532. In one embodiment the reversible resistance switching material is made of Hafnium Oxide $HfO_2$. However, other materials (as described above) can also be used. Box 540 depicts one example memory element which includes the reversible resistance switching material 532 sandwiched between a word line 536 and vertical bit line 530. The memory elements are positioned above, and not in, the substrate.

At the bottom of FIG. 26, the CMOS substrate is depicted. Implemented on the top surface of the CMOS structure are various metal lines including ML-0, ML-1, and ML-2. Line 2140 of ML-2 serves as a respective global bit line (GBL). The metal line ML-2 2140 serving as a global bit line can be implemented of any suitable material, including Tungsten, or Tungsten on a Titanium Nitride adhesion layer or a sandwich of n+ polysilicon on Tungsten on Titanium Nitride adhesion layer. The Pillar Select Layer includes the vertically oriented select devices (2102, 2104, 2106, 2108 and 2110), including their respective gates (2120, 2122, 2124, 2126, 2128, 2130). The material forming the gates (2120, 2122, 2124, 2126, 2128, 2130) can be polysilicon, Titanium Nitride, Tantalum Nitride, Nickel Silicide or any other suitable material. The gates (2120, 2122, 2124, 2126, 2128, 2130) implement the row select lines $SG_x$ (e.g. $SG_1$, $SG_2$, ... of FIG. 1).

Directly below each vertical bit line 530a-e are the vertically oriented select devices 2102, 2104, 2106, 2108 and 2110. Each of the vertically oriented select devices have oxide layers 2105 on each side. FIG. 26 also shows an n+ polysilicon layer 2142. As can be seen, the npn TFTs of vertically oriented select devices can be used to connect the global bit line GBL (layer 2140) with any of the vertical bit lines 530a, 530b, 530c, 530d and 530e.

FIG. 26 shows six row select lines ($SG_x$) which are also the gates 2120, 2122, 2124, 2126, 2128, 2130, each underneath a stack of multiple word lines. The gates/row select lines 2120, 2122, 2124, 2126, 2128, 2130 are positioned underneath and between the vertical bit lines. However, the gates/row select lines 2120, 2122, 2124, 2126, 2128, 2130 are above and not in the substrate (CMOS). FIG. 26 also shows oxide regions 2111.

Each row select line 2120, 2122, 2124, 2126, 2128, 2130 can serve as the gate signal to either of the two neighboring vertically oriented select devices 2030, 2032, 2034, 2036 and 2038; therefore, the vertically oriented select devices 2102, 2104, 2106, 2108 and 2110 are said to be double gated. Each vertically oriented select device 2102, 2104, 2106, 2108 and 2110 is controlled by two different row select lines, in this embodiment. One aspect of the vertically oriented select devices 2102, 2104, 2106, 2108 and 2110 incorporated to the base portion of each bit line pillar is that two adjacent vertically oriented select devices 2102, 2104, 2106, 2108 and 2110 share the same gate region. This allows the vertically oriented select devices to be closer together. As can be seen, although each vertically oriented select devices 2102, 2104, 2106, 2108 and 2110 has two gates, the vertically oriented select devices have only one gate on each side. For example, vertically oriented select devices 2106 has only gate 2124 on one side and has only gate 2126 on the other side. As can be seen from FIG. 26, the first of the two gates is adjacent to the top npn TFT but not adjacent to the lower npn TFT and a second of the two gates is adjacent to the lower non TFT but not adjacent to the upper npn TFT. For example with respect to vertically oriented select devices 2106, gate 2124 is adjacent the top npn TFT but not adjacent to the bottom npn TFT, while gate 2116 is adjacent the bottom npn TFT but not adjacent to the top npn TFT.

Note that the gates/row select lines 2120, 2122, 2124, 2126, 2128, 2130 are not all at the same vertical position. Rather, they are staggered with gates/row select lines 2120, 2124, and 2128 being offset and higher than gates/row select lines 2122, 2126, and 2130. By the term "higher" meant that the gates/row select lines 2120, 2124, and 2128 are further in distance from the substrate than gates/row select lines 2122, 2126, and 2130.

Each of the vertically oriented select devices comprises (in one example embodiment) two n+/p−/n+TFTs in series. The p− region can be referred to as the middle conductivity regions because for a given TFT with three conductivity regions, the p− region s in the middle. Thus, each of the vertically oriented select devices includes two middle conductivity regions between source/drain regions (e.g., n+ regions). A first of the two gates for each vertically oriented select device is adjacent to a first conductivity region of the two middle conductivity regions but not adjacent to a second conductivity region of the middle conductivity regions and a second of the two gates is adjacent to the second conductivity region of the middle conductivity regions but not adjacent to the first conductivity region of the conductivity regions. For example, gate 2124 is adjacent the top p− region of vertically oriented select device 2106, while gate 2126 is adjacent the bottom p− region of vertically oriented select device 2106. Therefore, gate 2124 is part of the top transistor, while gate 2126 is part of the bottom transistor of vertically oriented select device 2106. Current from the selected global bit line 2140 passes through both of the two transistors when the double gated vertically oriented select device is in the "on" condition.

Figure 26A:
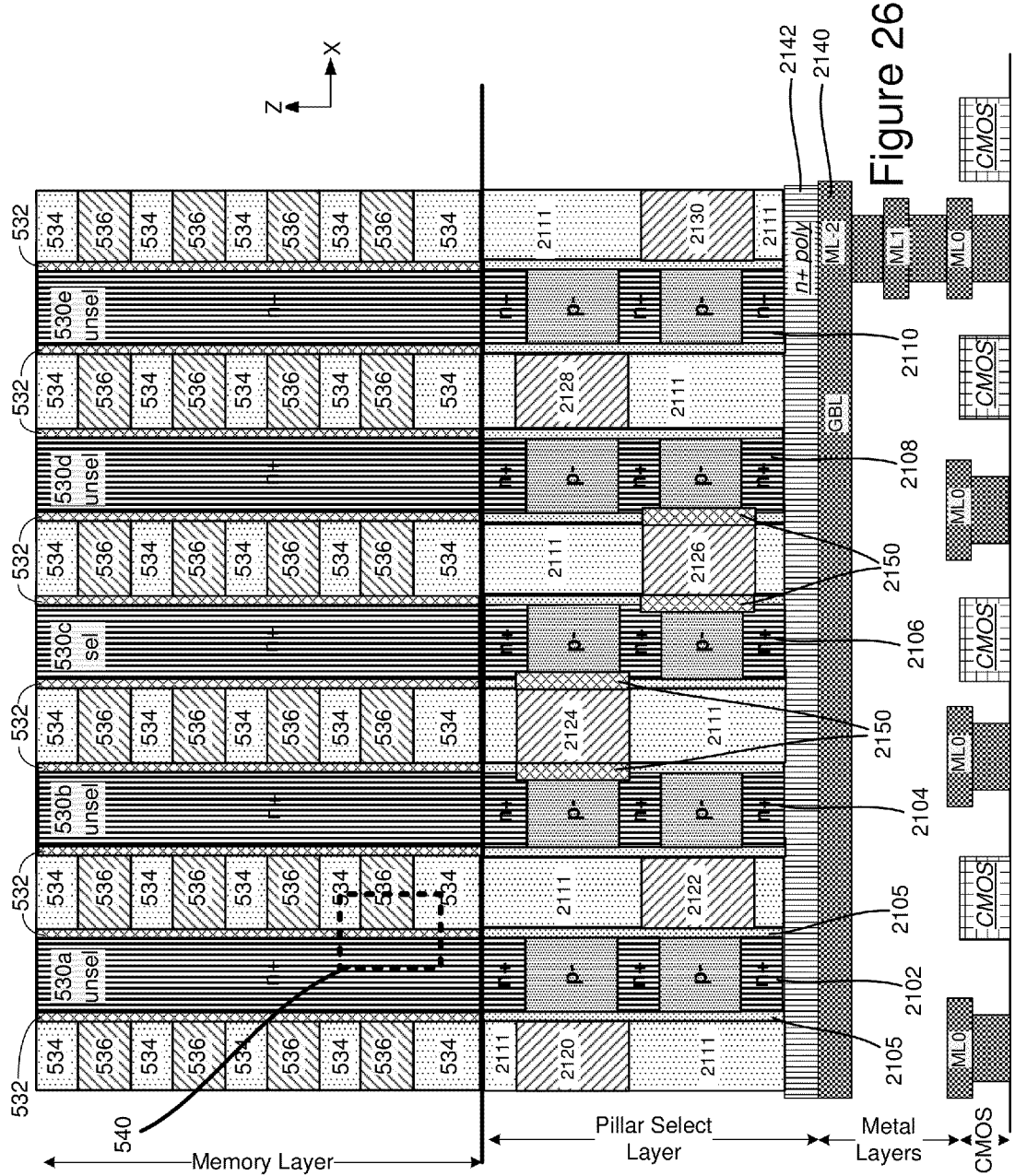
FIG. 26A illustrates one embodiment of a memory structure with vertical local bit lines above the substrate and vertically oriented select devices above the substrate that connect the bit lines to global bit lines.

When programming, both gates/row select lines for a vertically oriented select device 2102, 2104, 2106, 2108 and 2110 are put in the "on" condition. For example, both gates/row select lines for a vertically oriented select device receive a high voltage, which turns on (or activates) the respective vertically oriented select device to put the vertically oriented bit lines in communication with the global bit lines. This is illustrated in FIG. 26A. Note that the upper and lower gates can received different voltages, with one being used as the higher voltage enable-signal and the other being used as the lower current-limit.

FIG. 26A shows the structure of FIG. 26, with vertically oriented bit line 530c selected (sel) for an operation, while the other vertically oriented bit lines remain unselected (unsel). To accomplish this, one or more high voltages are applied to gates/row select lines 2124 and 2126 to turn on (actuate) vertically oriented select device 2106. When one or more high voltages are applied to gates/row select lines 2124 and 2126, channels 2150 are formed on both sides (two channels, one for each gate) of the selected vertically oriented select device 2106 and on one side of unselected vertically oriented select devices 2104 and 2108. As can be seen, for a given vertically oriented select device, the two channels are offset (with respect to distance to the substrate) from each other, with one channel positioned in the top npn TFT and the other channel positioned in the bottom npn TFT.

FIG. 27 is a cross-sectional view of a memory structure using another embodiment of the proposed new vertically oriented select device and the memory structure of FIGS. 6 & 10. The memory structure of FIG. 27 is a continuous mesh array of memory elements because there are memory elements connected to both sides of the bit lines and memory elements connected to both sides of the word lines. The Memory Layer of FIG. 27 is the same as in FIG. 10, and includes a set of vertical bit lines 530a, 530b, 530c, 530d and 530e. In one embodiment, the vertical bit lines comprise N+ polysilicon. Interspersed between the vertical bit lines 530a-e are alternating oxide layers 534 and word line layers 536. In one embodiment, the word lines are made from TiN. Between the vertical bit lines 530 and the stacks of alternating oxide layers 536 and word line layers 536 are vertically oriented layers of reversible resistance switching material 532. In one embodiment the reversible resistance switching material is made of Hafnium Oxide $HfO_2$. However, other materials (as described above) can also be used. Box 540 depicts one example memory element which includes the reversible resistance switching material 532 sandwiched between a word line 536 and vertical bit line 530. The memory elements are positioned above, and not in, the substrate.

At the bottom of FIG. 27, the CMOS substrate is depicted. Implemented on the top surface of the CMOS structure are various metal lines including ML-0, ML-1, and ML-2. Line 2240 of ML-2 serves as a respective global bit line (GBL). The metal line ML-2 2240 serving as a global bit line can be implemented of any suitable material, including Tungsten, or Tungsten on a Titanium Nitride adhesion layer or a sandwich of n+ polysilicon on Tungsten on Titanium Nitride adhesion layer. The Pillar Select Layer includes the vertically oriented select devices (2102, 2104, 2106, 2108 and 2110), including their respective gates (2220, 2222, 2224, 2226, 2228, 2230). The material forming the gates (2220, 2222, 2224, 2226, 2228, 2230) can be polysilicon, Titanium Nitride, Tantalum Nitride, Nickel Silicide or any other suitable material. The gates (2220, 2222, 2224, 2226, 2228, 2230) implement the row select lines $SG_x$ (e.g. $SG_1$, $SG_2$, ... of FIG. 1). FIG. 27 also shows oxide regions 2211.

Directly below each vertical bit line 530a-e are the vertically oriented select devices 2202, 2204, 2206, 2208 and 2210. Each of the vertically oriented select devices have oxide layers 2205 on each side. FIG. 26 also shows an n+ polysilicon layer 2242. As can be seen, the npn TFTs of vertically oriented select devices can be used to connect the global bit line GBL (layer 2140) with any of the vertical bit lines 530a, 530b, 530c, 530d and 530e.

FIG. 26 shows six row select lines ($SG_x$) which are also the gates 2220, 2222, 2224, 2226, 2228, 2230, each underneath a stack of multiple word lines. The gates/row select lines 2220, 2222, 2224, 2226, 2228, 2230 are positioned underneath and between the vertical bit lines. However, the gates/row select lines 2220, 2222, 2224, 2226, 2228, 2230 are above and not in the substrate (CMOS).

Each row select line 2220, 2222, 2224, 2226, 2228, 2230 can serve as the gate signal to either of the two neighboring vertically oriented select devices 2030, 2032, 2034, 2036 and 2038; therefore, the vertically oriented select devices 2202, 2204, 2206, 2208 and 2210 are said to be double gated. Each vertically oriented select device 2202, 2204, 2206, 2208 and 2210 is controlled by two different row select lines, in this embodiment. One aspect of the vertically oriented select devices 2202, 2204, 2206, 2208 and 2210 incorporated to the base portion of each bit line pillar is that two adjacent vertically oriented select devices 2202, 2204, 2206, 2208 and 2210 share the same gate region. This allows the vertically oriented select devices to be closer together. As can be seen, although each vertically oriented select devices 2202, 2204, 2206, 2208 and 2210 has two gates, the vertically oriented select devices have only one gate on each side. For example, vertically oriented select devices 2206 has only gate 2224 on one side and has only gate 2226 on the other side.

Note that the gates/row select lines 2220, 2222, 2224, 2226, 2228, 2230 are not all at the same vertical position. Rather, they are staggered with gates/row select lines 2220, 2224, and 2228 being offset and higher than gates/row select lines 2222, 2226, and 2230. By the term "higher" meant that the gates/row select lines 2220, 2224, and 2228 are further in distance from the substrate than gates/row select lines 2222, 2226, and 2230.

Each of the vertically oriented select devices comprises (in one example embodiment) two n+/p−/n+TFTs in series. The p− region can be referred to as the middle conductivity regions because for a given TFT with three conductivity regions, the p− region s in the middle. Thus, each of the vertically oriented select devices includes two middle conductivity regions between source/drain regions (e.g., n+ regions). Each gate/row select line 2220, 2222, 2224, 2226, 2228, 2230 is adjacent to both the top and bottom middle conductivity regions for a particular vertically oriented select device. However, each gate/row select line 2220, 2222, 2224, 2226, 2228, 2230 is part of only one of the top and bottom npn TFTs for a particular vertically oriented select device because each gate/row select line only completely overlaps with one of the top and bottom middle conductivity regions for a particular vertically oriented select device. Current from the selected global bit line 2140 passes through both of the two transistors when the double gated vertically oriented select device is in the "on" condition.

When programming, both gates/row select lines for a vertically oriented select device 2202, 2204, 2206, 2208 and 2210 are put in the "on" condition. For example, both gates/row select lines for a vertically oriented select device receive a high voltage, which turns on (or activates) the respective vertically oriented select device to put the vertically oriented bit lines in communication with the global bit lines. This is illustrated in FIG. 27A. Note that the upper and lower gates can received different voltages, with one being used as the higher voltage enable-signal and the other being used as the lower current-limit.

FIG. 27A shows the structure of FIG. 26, with vertically oriented bit line 530c selected (sel) for an operation, while the other vertically oriented bit lines remain unselected (unsel). To accomplish this, one or more high voltages are applied to gates/row select lines 2224 and 2226 to turn on (actuate) vertically oriented select device 2206. When one or more high voltages are applied to gates/row select lines 2224 and 2226, channels 2250 are formed on both sides (two channels, one for each gate) of the selected vertically oriented select device 2206 and on one side of unselected vertically oriented select devices 2204 and 2208. As can be seen, for a given vertically oriented select device, the two channels are offset (with respect to distance to the substrate) from each other, with one channel positioned in the top npn TFT and the other channel positioned in the bottom npn TFT.

One embodiment comprises a substrate; a monolithic three dimensional arrangement of memory cells positioned above and not in the substrate; a plurality of word lines connected to the memory cells; a plurality of global bit lines; a plurality of vertically oriented bit lines connected to the memory cells; and a plurality of double gated vertically oriented select devices that are above and not in the substrate, the double gated vertically oriented select devices are connected to the vertically oriented bit lines and the global bit lines so that when the double gated vertically oriented select devices are activated the vertically oriented bit lines are in communication with the global bit lines, each double gated vertically oriented select device has two gates that are offset from each other with respect to distance to the substrate with only one gate on each of two sides of the double gated vertically oriented select device so that both gates for the double gated vertically oriented select device need be in an "on" condition for the double gated vertically oriented select devices to be activated.

In one example, the first of the two gates is adjacent to the drain but not adjacent to the source and a second of the two gates is adjacent to the source but not adjacent to the drain. In one example, the double gated vertically oriented select devices each comprise only one transistor. In one example, the one transistor includes two source/drain regions; during a programming operation, the two gates create two channels, one channel for each gate; and during the programming operation, the two source/drain regions are depleted and short the two channels. In one example, each double gated vertically oriented select device includes two middle conductivity regions each between source/drain regions; and a first of the two gates adjacent to a first conductivity region of the two middle conductivity regions but not adjacent to a second conductivity region of the middle conductivity regions and a second of the two gates adjacent to the second conductivity region of the middle conductivity regions but not adjacent to the first conductivity region of the conductivity regions. In one example, the double gated vertically oriented select devices each comprise two transistors in series; the first of the two gates is part of one of the two transistors; the second of the two gates part of a second of the two transistors so that current from a selected global bit lines passes through both of the two transistors when the double gated vertically oriented select device is in the "on" condition. In one example, the first of the two gates creates a first channel in the first conductivity region of the two middle conductivity regions; and the second of the two gates creates a second channel in the second conductivity region of the two middle conductivity regions. In one example, each double gated vertically oriented select device includes two middle conductivity regions each between source/drain regions; and both of the two gates are adjacent both of the two middle conductivity regions. In one example, the double gated vertically oriented select devices each comprise two transistors in series; the first of the two gates is part of one of the two transistors; the second of the two gates part of a second of the two transistors so that current from a selected global bit lines passes through both of the two transistors when the double gated vertically oriented select device is in the "on" condition. In one example, the first of the two gates creates channels in both of the two middle conductivity regions; and the second of the two gates creates channels in both of the two middle conductivity regions. In one example, the double gated vertically oriented select devices include a transistor with a vertically oriented channel. In one example, the two gates are positioned between and below vertically oriented bit lines. In one example, the memory cells in combination with the vertically oriented bit lines and the word lines form a continuous mesh. In one example, the monolithic three dimensional arrangement of memory cells is an array of variable resistance memory elements. In one example, control circuitry for operating the memory cells, active areas of the memory cells are disposed above the substrate.

One embodiment comprises providing an unselected word line voltage to unselected word lines connected to a monolithic three dimensional arrangement of memory cells positioned above and not in a substrate; providing a selected word line voltage to a selected word line connected to the monolithic three dimensional arrangement of memory cells; providing a data signal on a global bit line, the global bit line connected to a double gated vertically oriented select devices that is above and not in the substrate, the double gated vertically oriented select device is connected to a vertically oriented bit line and the global bit lines so that when the double gated vertically oriented select device is activated the vertically oriented bit line is in communication with the global bit line, the double gated vertically oriented select device has two gates that are offset from each other with respect to distance to the substrate with only one gate on each of two sides of the double gated vertically oriented select device so that both gates for the double gated vertically oriented select device need be at an "on" condition for the double gated vertically oriented select devices to be activated; and activating the double gated vertically oriented select device by applying an "on" signal to both gates.

One embodiment comprises a substrate; a monolithic three dimensional arrangement of memory cells positioned above and not in the substrate; a plurality of word lines connected to the memory cells; a plurality of global bit lines; a plurality of vertically oriented bit lines connected to the memory cells; and a plurality of double gated vertically oriented select devices that are above and not in the substrate, the double gated vertically oriented select devices are connected to the vertically oriented bit lines and the global bit lines so that when the double gated vertically oriented select devices are activated the vertically oriented bit lines are in communication with the global bit lines, each double gated vertically oriented select device includes a source and a drain, each double gated vertically oriented select device has two gates that are offset from each other with respect to distance to the substrate with a first of the two gates adjacent to the drain but not adjacent to the source and a second of the two gates adjacent to the source but not adjacent to the drain so that both gates for the double gated vertically oriented select device need be at an "on" condition for the double gated vertically oriented select devices to be activated.

One embodiment comprises a substrate; a monolithic three dimensional arrangement of memory cells positioned above and not in the substrate; a plurality of word lines connected to the memory cells; a plurality of global bit lines; a plurality of vertically oriented bit lines connected to the memory cells; and a plurality of double gated vertically oriented select devices that are above and not in the substrate, the double gated vertically oriented select devices are connected to the vertically oriented bit lines and the global bit lines so that when the double gated vertically oriented select devices are activated the vertically oriented bit lines are in communication with the global bit lines, each double gated vertically oriented select device includes two middle conductivity regions each between source/drain regions, each double gated vertically oriented select device has two gates that are offset from each other with respect to distance to the substrate with a first of the two gates adjacent to the a first conductivity region of the two middle conductivity regions but not adjacent to a second conductivity region of the middle conductivity regions and a second of the two gates adjacent to the second conductivity region of the middle conductivity regions but not adjacent to the first conductivity region of the middle conductivity regions so that both gates for the double gated vertically oriented select device need be at an "on" condition for the double gated vertically oriented select devices to be activated.

One embodiment comprises a substrate; a monolithic three dimensional arrangement of memory cells positioned above and not in the substrate; a plurality of word lines connected to the memory cells; a plurality of global bit lines; a plurality of vertically oriented bit lines connected to the memory cells; and a plurality of double gated vertically oriented select devices that are above and not in the substrate, the double gated vertically oriented select devices are connected to the vertically oriented bit lines and the global bit lines so that when the double gated vertically oriented select devices are activated the vertically oriented bit lines are in communication with the global bit lines, each double gated vertically oriented select device includes two middle conductivity regions each between source/drain regions; each double gated vertically oriented select device has two gates that are offset from each other with respect to distance to the substrate, are on different sides of the double gated vertically oriented select device and are adjacent both of the two middle conductivity regions.

The foregoing detailed description has been presented for purposes of illustration and description. It is not intended to be exhaustive or limiting to the precise form disclosed. Many modifications and variations are possible in light of the above teaching. The described embodiments were chosen in order to best explain the principles of the disclosed technology and its practical application, to thereby enable others skilled in the art to best utilize the technology in various embodiments and with various modifications as are suited to the particular use contemplated. It is intended that the scope be defined by the claims appended hereto.

What is claimed is:

1. A non-volatile storage system, comprising:
a substrate;
a monolithic three dimensional arrangement of memory cells positioned above and not in the substrate;
a plurality of word lines connected to the memory cells;
a plurality of global bit lines;
a plurality of vertically oriented bit lines connected to the memory cells; and
a plurality of double gated vertically oriented select devices that are above and not in the substrate, the double gated vertically oriented select devices are connected to the vertically oriented bit lines and the global bit lines so that when the double gated vertically oriented select devices are activated the vertically oriented bit lines are in communication with the global bit lines, each double gated vertically oriented select device has two gates that are offset from each other with respect to distance to the substrate with only one gate on each of two sides of the double gated vertically oriented select device so that both gates for the double gated vertically oriented select device need be in an "on" condition for the double gated vertically oriented select devices to be activated.

2. The non-volatile storage system of claim 1, wherein:
the first of the two gates is adjacent to a drain of the double gated vertically oriented select device but not adjacent to a source of the double gated vertically oriented select device and a second of the two gates is adjacent to the source of the double gated vertically oriented select device but not adjacent to the drain of the double gated vertically oriented select device.

3. The non-volatile storage system of claim 2, wherein:
the double gated vertically oriented select devices each comprise only one transistor.

4. The non-volatile storage system of claim 3, wherein:
the one transistor includes two source/drain regions;
during a programming operation, the two gates create two channels, one channel for each gate; and
during the programming operation, the two source/drain regions are depleted and short the two channels.

5. The non-volatile storage system of claim 1, wherein:
each double gated vertically oriented select device includes two middle conductivity regions each between source/drain regions; and
a first of the two gates adjacent to a first conductivity region of the two middle conductivity regions but not adjacent to a second conductivity region of the middle conductivity regions and a second of the two gates adjacent to the second conductivity region of the middle conductivity regions but not adjacent to the first conductivity region of the conductivity regions.

6. The non-volatile storage system of claim 5, wherein:
the double gated vertically oriented select devices each comprise two transistors in series;
the first of the two gates is part of one of the two transistors;
the second of the two gates is part of a second of the two transistors so that current from a selected global bit lines passes through both of the two transistors when the double gated vertically oriented select device is in the "on" condition.

7. The non-volatile storage system of claim 5, wherein:
the first of the two gates creates a first channel in the first conductivity region of the two middle conductivity regions; and
the second of the two gates creates a second channel in the second conductivity region of the two middle conductivity regions.

8. The non-volatile storage system of claim 1, wherein:
each double gated vertically oriented select device includes two middle conductivity regions each between source/drain regions; and
both of the two gates are adjacent both of the two middle conductivity regions.

9. The non-volatile storage system of claim 8, wherein:
the double gated vertically oriented select devices each comprise two transistors in series;
the first of the two gates is part of one of the two transistors;
the second of the two gates part of a second of the two transistors so that current from a selected global bit lines passes through both of the two transistors when the double gated vertically oriented select device is in the "on" condition.

10. The non-volatile storage system of claim 8, wherein:
the first of the two gates creates channels in both of the two middle conductivity regions; and
the second of the two gates creates channels in both of the two middle conductivity regions.

11. The non-volatile storage system of claim 1, wherein:
the double gated vertically oriented select devices include a transistor with a vertically oriented channel.

12. The non-volatile storage system of claim 1, wherein:
the two gates are positioned between and below vertically oriented bit lines.

13. The non-volatile storage system of claim 1, wherein:
the memory cells in combination with the vertically oriented bit lines and the word lines form a continuous mesh.

14. The non-volatile storage system of claim 1, wherein:
the monolithic three dimensional arrangement of memory cells is an array of variable resistance memory elements.

15. The non-volatile storage system of claim 1, further comprising:
control circuitry for operating the memory cells, active areas of the memory cells are disposed above the substrate.

16. A method of operating non-volatile storage, comprising:
providing an unselected word line voltage to unselected word lines connected to a monolithic three dimensional arrangement of memory cells positioned above and not in a substrate;
providing a selected word line voltage to a selected word line connected to the monolithic three dimensional arrangement of memory cells;
providing a data signal on a global bit line, the global bit line connected to a double gated vertically oriented select devices that is above and not in the substrate, the double gated vertically oriented select device is connected to a vertically oriented bit line and the global bit lines so that when the double gated vertically oriented select device is activated the vertically oriented bit line is in communication with the global bit line, the double gated vertically oriented select device has two gates that are offset from each other with respect to distance to the substrate with only one gate on each of two sides of the double gated vertically oriented select device so that both gates for the double gated vertically oriented select device need be at an "on" condition for the double gated vertically oriented select devices to be activated; and
activating the double gated vertically oriented select device by applying an "on" signal to both gates.

17. The method of claim 16, wherein:
the first of the two gates is adjacent to a drain of the double gated vertically oriented select device but not adjacent to a source of the double gated vertically oriented select device and a second of the two gates is adjacent to the source of the double gated vertically oriented select device but not adjacent to the drain of the double gated vertically oriented select device.

18. The method of claim 16, wherein:
each double gated vertically oriented select device includes two middle conductivity regions each between source/drain regions; and
a first of the two gates adjacent to a first conductivity region of the two middle conductivity regions but not adjacent to a second conductivity region of the middle conductivity regions and a second of the two gates adjacent to the second conductivity region of the middle conductivity regions but not adjacent to the first conductivity region of the middle conductivity regions.

19. The method of claim 16, wherein:
each double gated vertically oriented select device includes two middle conductivity regions each between source/drain regions; and
both of the two gates are adjacent both of the two middle conductivity regions.

20. A non-volatile storage system, comprising:
a substrate;
a monolithic three dimensional arrangement of memory cells positioned above and not in the substrate;
a plurality of word lines connected to the memory cells;
a plurality of global bit lines;
a plurality of vertically oriented bit lines connected to the memory cells; and
a plurality of double gated vertically oriented select devices that are above and not in the substrate, the double gated vertically oriented select devices are connected to the vertically oriented bit lines and the global bit lines so that when the double gated vertically oriented select devices are activated the vertically oriented bit lines are in communication with the global bit lines, each double gated vertically oriented select device includes a source and a drain, each double gated vertically oriented select device has two gates that are offset from each other with respect to distance to the substrate with a first of the two gates adjacent to the drain but not adjacent to the source and a second of the two gates adjacent to the source but not adjacent to the drain so that both gates for the double gated vertically oriented select device need be at an "on" condition for the double gated vertically oriented select devices to be activated.

21. The non-volatile storage system of claim 20, wherein:
the double gated vertically oriented select devices each comprise only one transistor.

22. The non-volatile storage system of claim 21, wherein:
the one transistor includes two source/drain regions;
during a programming operation, the two gates create two channels, one channel for each gate; and
during the programming operation, the two source/drain regions are depleted and short the two channels.

23. A non-volatile storage system, comprising:
a substrate;
a monolithic three dimensional arrangement of memory cells positioned above and not in the substrate;
a plurality of word lines connected to the memory cells;
a plurality of global bit lines;
a plurality of vertically oriented bit lines connected to the memory cells; and
a plurality of double gated vertically oriented select devices that are above and not in the substrate, the double gated vertically oriented select devices are connected to the vertically oriented bit lines and the global bit lines so that when the double gated vertically oriented select devices are activated the vertically oriented bit lines are in communication with the global bit lines, each double gated vertically oriented select device includes two middle conductivity regions each between source/drain regions, each double gated vertically oriented select device has two gates that are offset from each other with respect to distance to the substrate with a first of the two gates adjacent to the a first conductivity region of the two middle conductivity regions but not adjacent to a second conductivity region of the middle conductivity regions and a second of the two gates adjacent to the second conductivity region of the middle conductivity regions but not adjacent to the first conductivity region of the middle conductivity regions so that both gates for the double gated vertically oriented select device need be at an "on" condition for the double gated vertically oriented select devices to be activated.

24. The non-volatile storage system of claim 23, wherein:
the double gated vertically oriented select devices each comprise two transistors in series;
the first of the two gates is part of one of the two transistors;

the second of the two gates part of a second of the two transistors so that current from a selected global bit lines passes through both of the two transistors when the double gated vertically oriented select device is in the "on" condition.

25. The non-volatile storage system of claim 23, wherein:
the first of the two gates creates a first channel in the first conductivity region of the two middle conductivity regions; and
the second of the two gates creates a second channel in the second conductivity region of the two middle conductivity regions.

26. A non-volatile storage system, comprising:
a substrate;
a monolithic three dimensional arrangement of memory cells positioned above and not in the substrate;
a plurality of word lines connected to the memory cells;
a plurality of global bit lines;
a plurality of vertically oriented bit lines connected to the memory cells; and
a plurality of double gated vertically oriented select devices that are above and not in the substrate, the double gated vertically oriented select devices are connected to the vertically oriented bit lines and the global bit lines so that when the double gated vertically oriented select devices are activated the vertically oriented bit lines are in communication with the global bit lines, each double gated vertically oriented select device includes two middle conductivity regions each between source/drain regions;
each double gated vertically oriented select device has two gates that are offset from each other with respect to distance to the substrate, are on different sides of the double gated vertically oriented select device and are adjacent both of the two middle conductivity regions.

27. The non-volatile storage system of claim 26, wherein:
the double gated vertically oriented select devices each comprise two transistors in series;
the first of the two gates is part of one of the two transistors;
the second of the two gates part of a second of the two transistors so that current from a selected global bit lines passes through both of the two transistors when the double gated vertically oriented select device is in the "on" condition.

28. The non-volatile storage system of claim 26, wherein:
the first of the two gates creates channels in both of the two middle conductivity regions; and
the second of the two gates creates channels in both of the two middle conductivity regions.

* * * * *